United States Patent
Jing

(10) Patent No.: US 10,230,346 B2
(45) Date of Patent: Mar. 12, 2019

(54) ACOUSTIC VOICE ACTIVITY DETECTION

(76) Inventor: Zhinian Jing, Belmont, CA (US)

( * ) Notice: Subject to any disclaimer, the term of this patent is extended or adjusted under 35 U.S.C. 154(b) by 182 days.

(21) Appl. No.: 13/346,719

(22) Filed: Jan. 9, 2012

(65) Prior Publication Data

US 2012/0209603 A1 Aug. 16, 2012

Related U.S. Application Data

(60) Provisional application No. 61/431,397, filed on Jan. 10, 2011, provisional application No. 61/431,395, filed on Jan. 10, 2011.

(51) Int. Cl.

| | | |
|---|---|---|
| H04R 1/00 | (2006.01) | |
| A61F 2/20 | (2006.01) | |
| G10K 11/16 | (2006.01) | |
| H04R 3/02 | (2006.01) | |
| H03G 3/32 | (2006.01) | |
| G10L 21/0364 | (2013.01) | |
| G10L 21/0216 | (2013.01) | |

(52) U.S. Cl.
CPC ............ *H03G 3/32* (2013.01); *G10L 21/0364* (2013.01); *G10L 2021/02166* (2013.01)

(58) Field of Classification Search
CPC ......... G10L 15/20; G10L 21/02; G10L 25/84; G10L 2021/02166; G10L 21/0364; H03G 3/32
USPC ......... 381/71.6, 70, 73.1, 91, 92, 94.1, 71.1, 381/71.2, 71.8, 71.9, 124, 385; 704/233, 704/214, 226
See application file for complete search history.

(56) References Cited

U.S. PATENT DOCUMENTS

| | | |
|---|---|---|
| 5,103,431 A | 4/1992 | Freeman et al. |
| 5,579,432 A | 11/1996 | Wigren |
| 5,596,678 A | 1/1997 | Wigren et al. |
| 5,822,423 A * | 10/1998 | Jehnert ................. H04M 11/04 379/352 |
| 5,937,377 A | 8/1999 | Hardiman et al. |
| 6,968,309 B1 | 11/2005 | Makinen et al. |
| 8,180,064 B1 | 5/2012 | Avendano et al. |
| 8,521,530 B1 | 8/2013 | Every et al. |
| 2002/0099538 A1 | 7/2002 | Saito |
| 2002/0103643 A1 | 8/2002 | Rotola-Pukkila et al. |
| 2003/0120485 A1 | 6/2003 | Murase et al. |

(Continued)

FOREIGN PATENT DOCUMENTS

WO   2012097014 A1   7/2012

OTHER PUBLICATIONS

Young, Lee W.; International Searching Authority; Notification of Transmittal of the International Search Report and Written Opinion of the International Searching Authority or the Declaration for International Patent Application No. PCT/US2012/020846, dated Mar. 21, 2012.

(Continued)

*Primary Examiner* — Vivian Chin
*Assistant Examiner* — William A Jerez Lora

(57) ABSTRACT

Techniques for acoustic voice activity detection (AVAD) is described, including detecting a signal associated with a subband from a microphone, performing an operation on data associated with the signal, the operation generating a value associated with the subband, and determining whether the value distinguishes the signal from noise by using the value to determine a signal-to-noise ratio and comparing the value to a threshold.

20 Claims, 54 Drawing Sheets

(56) References Cited

U.S. PATENT DOCUMENTS

| | | |
|---|---|---|
| 2004/0049383 A1 | 3/2004 | Kato |
| 2004/0054479 A1 | 3/2004 | Trickett |
| 2004/0093194 A1 | 5/2004 | Singh |
| 2006/0074646 A1* | 4/2006 | Alves ............ G10L 21/0208 704/226 |
| 2006/0120537 A1* | 6/2006 | Burnett ........... G10K 11/1784 381/71.6 |
| 2006/0136203 A1 | 6/2006 | Ichikawa |
| 2007/0055508 A1 | 3/2007 | Zhao et al. |
| 2008/0235013 A1 | 9/2008 | Kim et al. |
| 2009/0220107 A1 | 9/2009 | Every et al. |
| 2009/0238373 A1 | 9/2009 | Klein |
| 2009/0252351 A1 | 10/2009 | Rosener |
| 2009/0299742 A1 | 12/2009 | Toman et al. |
| 2010/0076769 A1 | 3/2010 | Yu |
| 2010/0092000 A1 | 4/2010 | Kim |
| 2010/0217586 A1 | 8/2010 | Shimada et al. |
| 2010/0223054 A1 | 9/2010 | Nemer et al. |
| 2010/0280824 A1* | 11/2010 | Petit ............... G10L 21/0208 704/214 |
| 2011/0081026 A1 | 4/2011 | Ramakrishnan et al. |
| 2011/0208520 A1* | 8/2011 | Lee ................. G10L 25/78 704/233 |
| 2012/0116758 A1 | 5/2012 | Murgia et al. |

OTHER PUBLICATIONS

Yen, Eric L.; Office Action by U.S. Patent and Trademark Office dated Feb. 23, 2016 for U.S. Appl. No. 13/374,746.

Yen, Eric L.; Office Action by U.S. Patent and Trademark Office dated Jul. 15, 2015 for U.S. Appl. No. 13/374,746.

\* cited by examiner

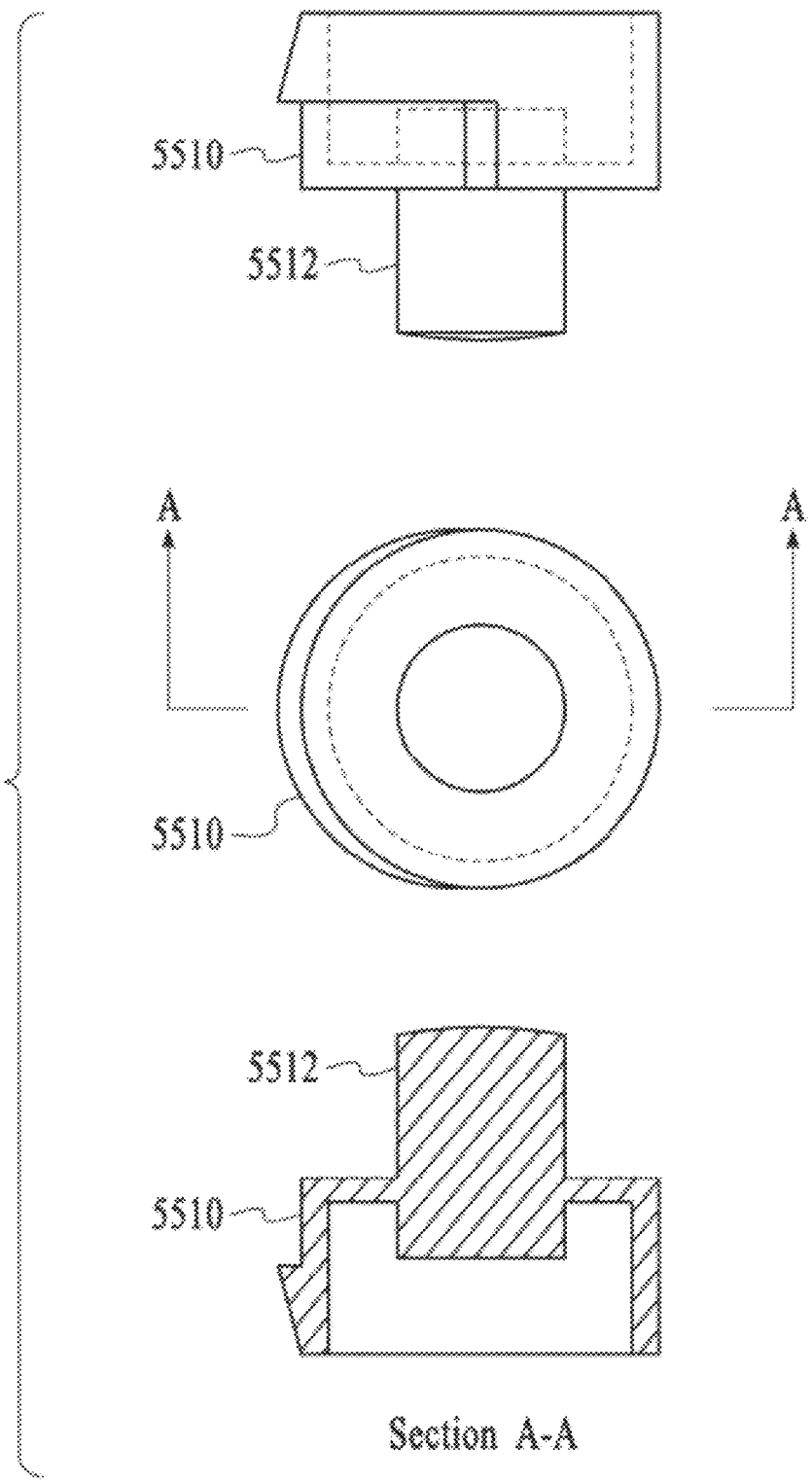

ACOUSTIC VOICE ACTIVITY DETECTION

CROSS-REFERENCE TO RELATED APPLICATIONS

This application is a U.S. non-provisional patent application that claims the benefit of U.S. Provisional Patent Application Nos. 61/431,397 (filed Jan. 10, 2011, entitled "Acoustic Voice Activity Detection (AVAD) for Use with Electronic Systems") and U.S. Provisional Patent Application No. 61/431,395 (filed Jan. 10, 2011, entitled "Dynamic Enhancement of Audio (DAE) in Headset System"). This application is also related to U.S. patent application Ser. No. 12/243,718, filed Oct. 1, 2008, which is a continuation of U.S. Pat. No. 7,433,484, issued Oct. 7, 2008, related to U.S. patent application Ser. No. 12/722,947, filed May 3, 2010, related to U.S. patent application Ser. No. 11/805,987, filed May 25, 2007, which is a continuation of U.S. Pat. No. 7,246,058, issued Jun. 27, 2007, related to U.S. patent application Ser. No. 12/606,140, filed Oct. 26, 2009, related to U.S. patent application Ser. No. 12/772,963, filed May 3, 2010, related to U.S. patent application Ser. No. 12/139,333, filed Jun. 13, 2008, related to U.S. Patent Application No. 61/316,269, filed Mar. 22, 2010, and related to U.S. patent application Ser. No. 13/374,746, filed Jan. 9, 2012, all of which are herein incorporated by reference for all purposes.

FIELD

The disclosure herein relates generally to signal processing and, more particularly, to acoustic voice activity detection.

BACKGROUND

Headsets, microphones, and other communication devices used for detecting, converting, and transmitting acoustic signals are, in some conventional solutions, used in connection with skin surface microphones ("SSM"). However, conventional solutions can be problematic in that skin contact may be inadequate or an SSM may have experienced a hardware, firmware, electronic, electrical, mechanical, or other type of failure. Conventional acoustic voice activity detectors (AVAD) have been used to supplement SSM-based voice activity detectors (VAD) and, in some conventional solutions, a final VAD was based on a logical OR determination between a conventional AVAD and a conventional SSM VAD:

final VAD=AVAD OR SSM VAD.

Subsequently, an AVAD was "tuned" (i.e., configured) to reduce the number of false positives such as a false indication of speech being present, which can hamper denoising, while allowing some types of false negatives such as a false indication of no speech present, which can cause devoicing. Typically, conventional solutions seek to balance improving denoising performance against devoicing. However, this balance typically leads to overall performance quality being reduced.

Furthermore, detection and decision logic in conventional solutions is often implemented on headsets that default to a SSM VAD if skin contact is indicated in order to reduce false AVAD indications that speech is not present, which can be problematic due to diffuse noises (i.e., noises from a background or rear (i.e., "back") source). Using conventional solutions, diffuse noises can result in AVAD false negative indications (i.e., no speech detected). Further, conventional solutions are problematic in highly reverberant environments, such as wearing a headset close to a side window in a moving vehicle, which can also lead to AVAD false negative indications. Using conventional solutions, the greater the number of false negative indications that occur, the higher the degree to which speech can be devoiced, thus reducing the effectiveness of a conventional headset or communication device. Conventional solutions are problematic in reducing false negative indications that speech is not present and can lead to inadvertent and undesirable devoicing.

Thus, what is needed is an acoustic voice activity detector without the limitations of conventional solutions.

BRIEF DESCRIPTION OF THE DRAWINGS

FIG. 57 is a schematic diagram of a coupler of an acoustic vibration sensor, under the embodiment of FIG. 55;

DETAILED DESCRIPTION

Figure 1A:
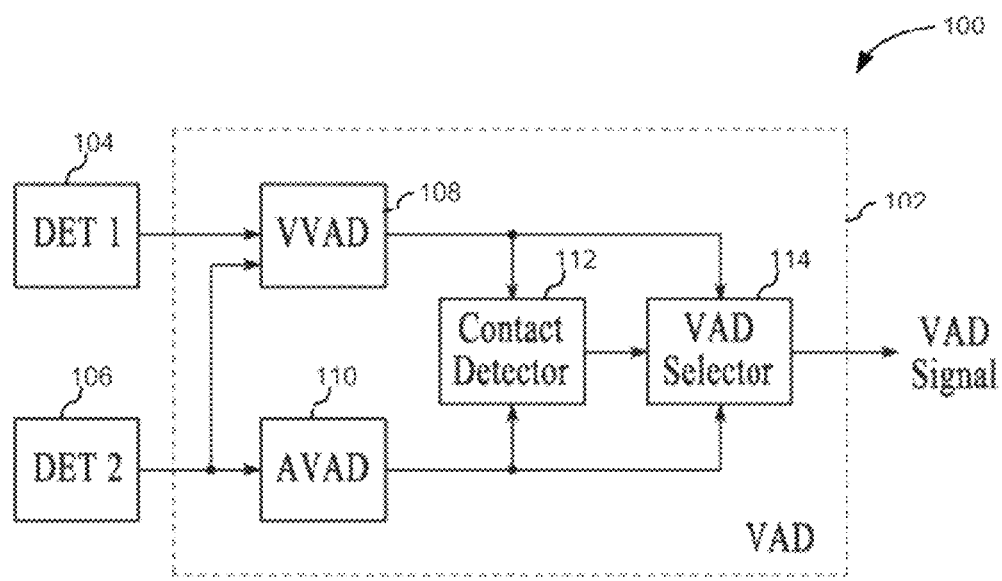
FIG. 1A is a block diagram for an example of a voice activity detector (VAD), according to some embodiments.

Embodiments or examples described herein include acoustic-only voice activity detection (AVAD) techniques as described in detail below. In some examples, these techniques may be used as algorithmic-based software or firmware as installed in communication devices such as the Jawbone® Era™ developed by AliphCom of San Francisco, Calif. Other types of communication devices may also use the described techniques and are not limited to those shown and/or described, including the Jawbone® Icon™ (Gauss), Jawbone® Prime™ (Prime), or others. In the following description, numerous specific details are introduced to provide a thorough understanding of and enabling description for, embodiments (i.e., examples) of various implementations of the described techniques. One skilled in the relevant art, however, may recognize that these embodiments can be practiced without one or more of the specific details, or with other components, systems, etc. In other instances, well-known structures or operations are not shown, or are not described in detail, to avoid obscuring aspects of the disclosed embodiments.

Unless otherwise specified, the following terms have the corresponding meanings in addition to any meaning or understanding they may convey to one skilled in the art. The term "Noise" may refer to environmental acoustic noise. The term "Skin Surface Microphone" of "SSM" may refer to a device that is used and configured to detect acoustic vibrations inside the user's skin. An exemplary SSM is described in, for example, U.S. patent application Ser. No. 12/243,718, filed Oct. 1, 2008, and U.S. patent application Ser. No. 12/772,947, filed May 3, 2010, which may be found in products developed by AliphCom ("Aliph") of San Francisco, Calif. The term "Acoustic VAD" or "AVAD" may refer, in some examples, to voice activity detection that can be determined using acoustic input and may be configured to not rely on vibration sensors such as an SSM or accelerometer(s). An exemplary AVAD is described in, for example, U.S. patent application Ser. No. 11/805,987, filed May 25, 2007, which is a continuation of U.S. Pat. No. 7,246,058, issued Jun. 27, 2007, and U.S. patent application Ser. No. 12/606,104, filed Oct. 26, 2009, and U.S. patent application Ser. No. 12/772,947, filed May 3, 2010, and may be found in products developed by Aliph. Likewise, the term "Near-end" may refer to an environment associated with a user.

A voice activity detector (VAD) or detection system is described for use in electronic systems. In some examples, a VAD may be configured to combine the use of an acoustic VAD (i.e., AVAD) and a vibration sensor VAD as appropriate to the environment or conditions in which a user is operating a host device, as described below. An accurate VAD is critical to the noise suppression performance of any noise suppression system, as speech that is not properly detected could be removed, resulting in devoicing. In addition, if speech is improperly thought to be present, noise suppression performance can be reduced. Also, other algorithms such as speech recognition, speaker verification, and others may use accurate VAD signals for optimal performance. Traditional single microphone-based VADs can have high error rates in non-stationary, windy, or loud noise environments, resulting in poor performance of algorithms that depend on an accurate VAD. Any italicized text herein generally refers to the name of a variable in an algorithm described herein.

In some examples, an exemplary AVAD may also be configured to include formation of acoustic signals (i.e., "signals") $V_1$ and $V_2$ from a Dual Omnidirectional Microphone Array (DOMA) as described in detail below and in, some examples, the Related Applications (e.g., U.S. patent application Ser. No. 12/139,333, filed Jun. 13, 2008), and the $V_1/V_2$ ratio can be compared to a threshold. In some examples, a threshold may be the higher of two thresholds computed using two or more different criteria, with one estimating a noise floor and the other based on an estimated signal-to-noise ratio (SNR).

As described herein, some examples may be configured to perform $V_1/V_2$ calculations (i.e., "operations"), threshold computations, and comparisons on an individual subband basis. That is, prior to DOMA computations, six (6) sub-banded signals are obtained for each microphone evaluating acoustic frequency ranges from 0 to 1500 Hz. In some examples, the subbands may have a width of approximately 250 Hz, but may be varied and are not limited to any specific example. A single binary VAD value, in some examples, may be determined for each of the six (6) subbands. The final AVAD value may be determined based on whether two or more subbands detect speech, and is false otherwise (i.e., two or more subbands do not detect speech). In other examples, the number of subbanded signals may be varied and are not limited to the example described above. Further, the final AVAD may be determined based on a varying number of subbands detecting speech and are not limited to any specific example or two or more subbands detecting speech.

Using a subbanded signal approach such as that described above, for example, speech energy may be concentrated in various subbands that, in some examples, correspond to format frequencies, which may be used to distinguish signals from "noise," which is generally not concentrated in the same or similar subbands. Further, a signal-to-noise ratio may be enhanced for subbands containing speech, which may be useful for acoustic environments in which diffuse noise and noise emanating from behind a user (i.e., microphone) because DOMA may be more responsive to sound emanating from a back and/or side areas.

In some examples, AVAD may be used to accurately form signals $V_1$ and $V_2$ using a DOMA and calibration techniques such as those described in the Related Applications (e.g., U.S. Patent Application No. 61/316,269, filed Mar. 22, 2010) to provide consistent performance across all units (e.g., microphones). Using the described techniques, detection and decision logic resulting in the selection of a SSM VAD only when good contact is detected can be removed. Further, an adaptive Beta filter can also be removed in other examples.

FIG. 1A is a block diagram 100 for an example of a voice activity detector (VAD), according to some embodiments. VAD 102 of an embodiment includes a first detector ("DET 1") 104 that receives a first signal and a second detector ("DET 2") 106 that receives a second signal that is different from the first signal. VAD 102 includes a first voice activity detector (VVAD) component 108 coupled to the first detector and the second detector. First VAD component 108 determines that the first signal corresponds to voiced speech when energy resulting from at least one operation on the first signal exceeds a first threshold. VAD 102 includes a second VAD component ("AVAD") 110 coupled to the second detector. Second VAD component 110 determines that the second signal corresponds to voiced speech when a ratio of a second parameter corresponding to the second signal and a first parameter corresponding to the first signal exceeds a second threshold.

VAD 102 of an embodiment includes a contact detector 112 coupled to the first VAD component and the second VAD component. Contact detector 112 determines a state of contact of the first detector with skin of a user, as described in detail herein.

VAD 102 of an embodiment includes a selector 114 coupled to the first VAD component and the second VAD component. The selector generates a VAD signal to indicate a presence of voiced speech when the first signal corresponds to voiced speech and the state of contact is a first state. Alternatively, selector 114 generates the VAD signal when either of the first signal and the second signal corresponds to voiced speech and the state of contact is a second state.

Figure 1B:
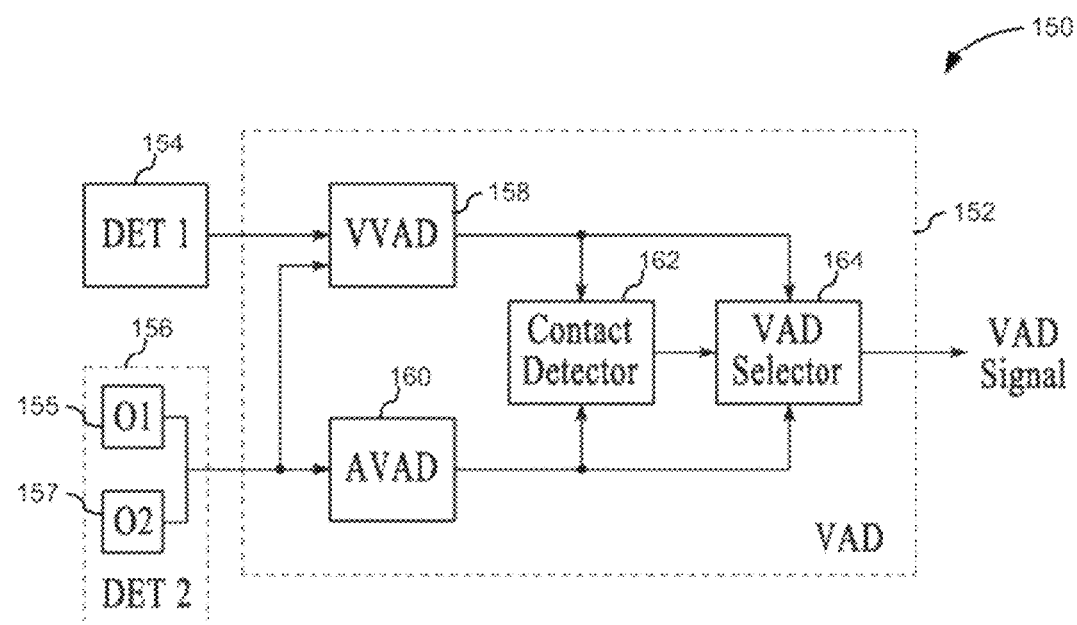
FIG. 1B is a block diagram for another example of a voice activity detector (VAD), under an alternative embodiment.

FIG. 1B is a block diagram 150 for another example of a voice activity detector (VAD), according to various embodiments. VAD 152 includes a first detector 154 that receives a first signal and a second detector 156 that receives a second signal that is different from the first signal. Second detector 156 of this alternative embodiment is an acoustic sensor that comprises two omnidirectional microphones (e.g., omnidirectional microphones ("$O_1$") 155 and omnidirectional microphone ("$O_2$") 157), but the embodiment is not so limited.

VAD 152 of this alternative embodiment includes a first voice activity detector (VVAD) component 158 coupled to the first detector and the second detector. First VAD component 158 determines that the first signal corresponds to voiced speech when energy resulting from at least one operation on the first signal exceeds a first threshold. VAD 152 includes a second VAD component 160 coupled to the second detector. Second VAD component 160 determines that the second signal corresponds to voiced speech when a ratio of a second parameter corresponding to the second signal and a first parameter corresponding to the first signal exceeds a second threshold.

VAD 152 of this alternative embodiment includes a contact detector 162 coupled to the first VAD component and the second VAD component. Contact detector 162 determines a state of contact of the first detector with skin of a user, as described in detail herein.

VAD 152 of this alternative embodiment includes a selector 164 coupled to the first VAD component and the second VAD component and the contact detector. Selector 164 generates a VAD signal to indicate a presence of voiced speech when the first signal corresponds to voiced speech and the state of contact is a first state. Alternatively, the selector generates the VAD signal when either of the first signal and the second signal corresponds to voiced speech and the state of contact is a second state.

Figure 1C:
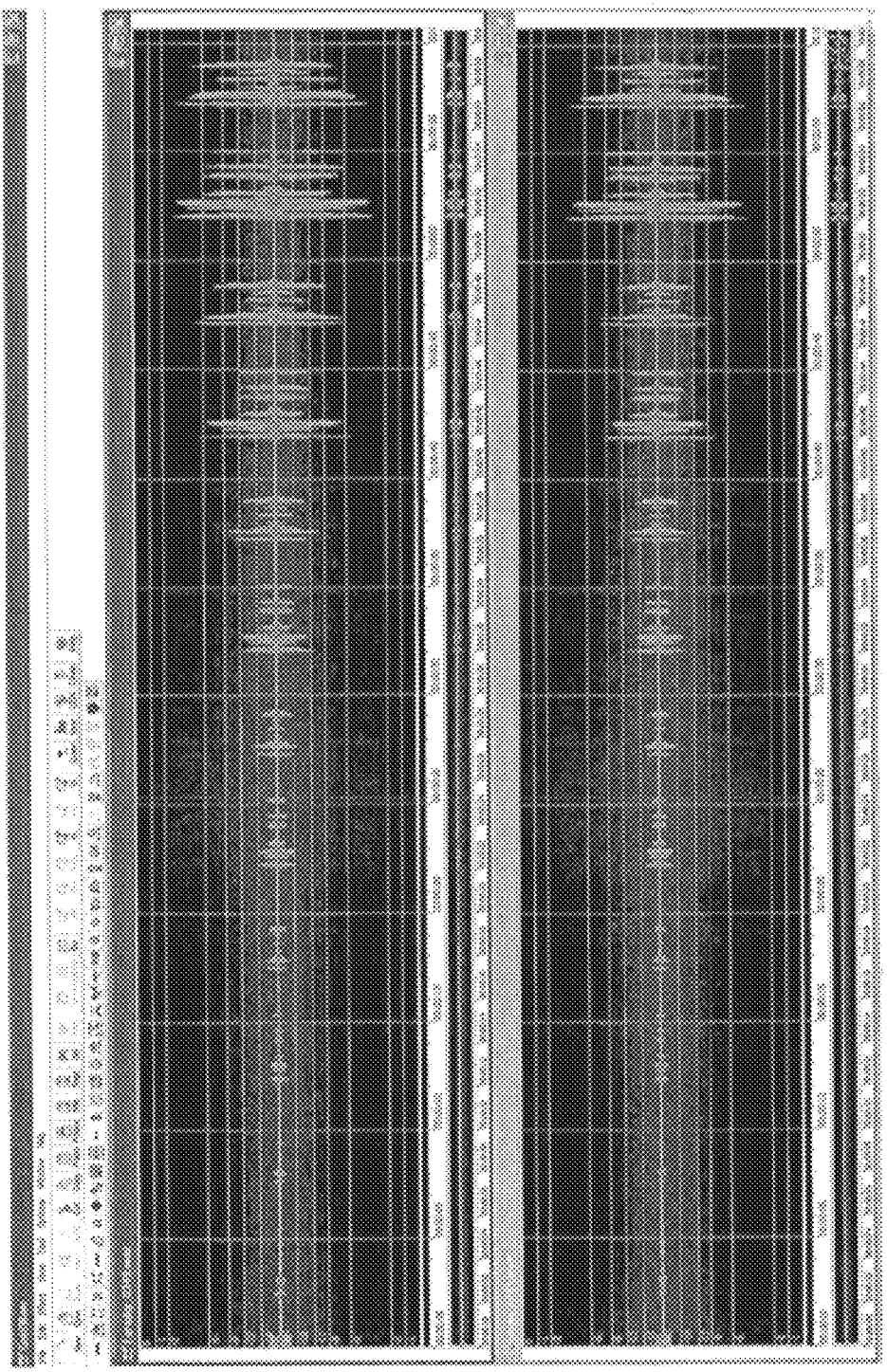
FIG. 1C shows resulting speech sensitivity in no noise for an exemplary headset.

FIG. 1C is a chart illustrating speech sensitivity in a "no-noise" environment using a headset implemented with the described techniques (e.g., top plot) and a headset implemented without the described techniques (i.e., bottom plot). In some examples, these plots illustrate comparative results for the performance of a headset using the described techniques (at speech levels below 66 dB, performance has not been degraded) as compared to a headset not implemented with the described techniques (bottom plot). Using the described techniques, speech sensitivity is improved for the Faraday headset (top plot) and there is little or no devoicing for speech levels at 66 dB or higher.

In some examples, environmental conditions for the above-described results may be produced in a single-talker noise from an area generally in front of a microphone using the described techniques, increasing the volume of the single-talker noise by 6-dB increments, and playing near-end speech from the HATS "mouth" (i.e., the anatomical or sound-emanating "mouth" of the HATS simulator) at 1, 20, and 40-second marks. In some examples, the results illustrated in FIG. 1C may be generated by testing for speech sensitivity in a "no-noise" environment, using a single-talker noise from an area or position generally in front of the microphone at a distance of approximately 1.5 meters such as a diffuse noise (e.g., ambient or environmental noise associated with a moving car and surrounding road/vehicle noise). Further, a speech stimulus (i.e., "single-talker noise") may be played in a sound room (e.g., a non-anechoic environment, shielded from outside, ambient noise) using a B&K Head and Torso Simulator (HATS), increasing at 6-dB increments, starting at approximately 60 dB at a mouth reference point (MRP) HATS. This may be configured to test the sensitivity of an AVAD as to a given level of speech.

Figure 1D:
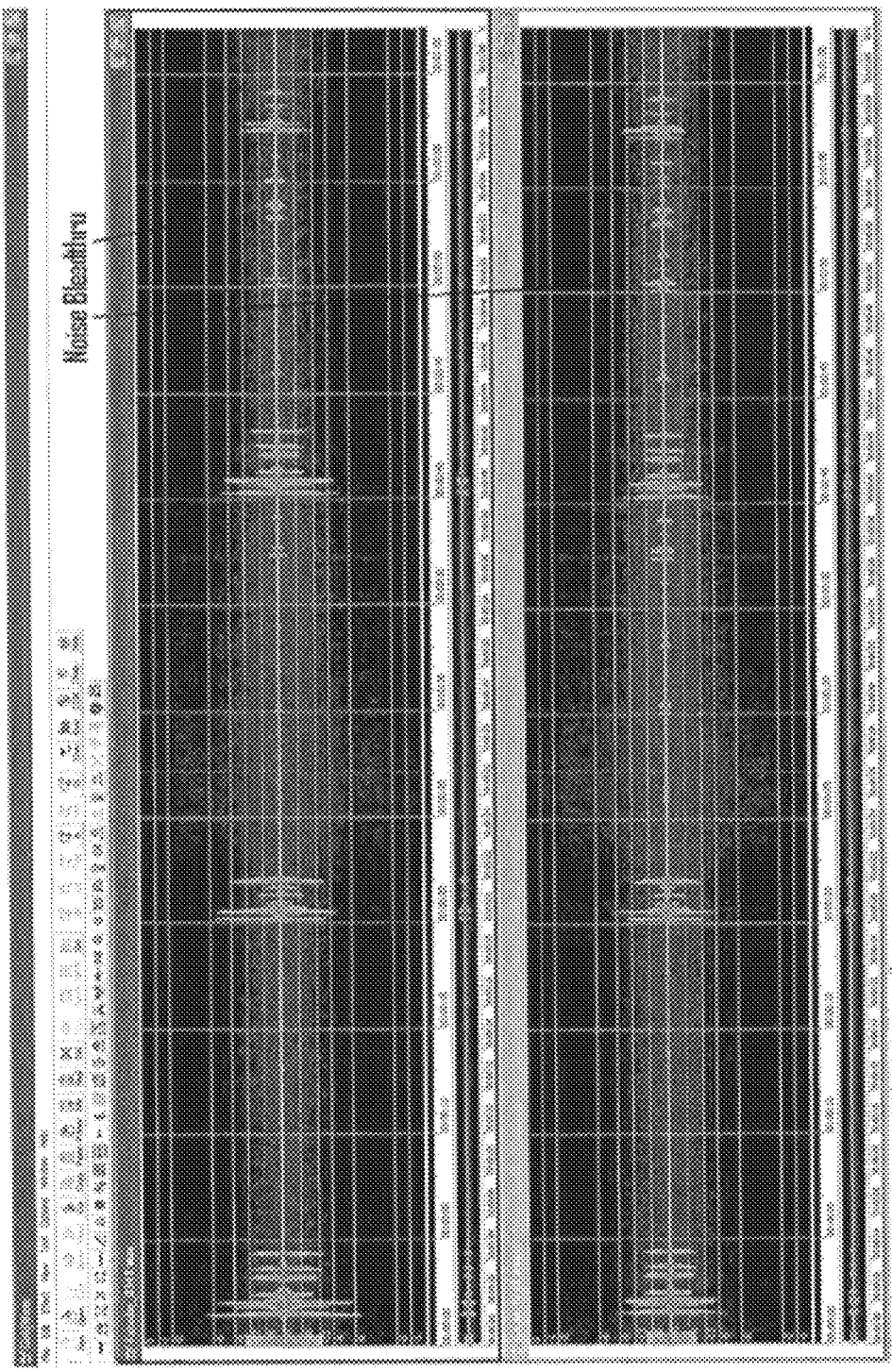
FIG. 1D shows resulting speech sensitivity for single-talker noise from a frontal direction of an exemplary headset.

FIG. 1D is another exemplary chart illustrating resulting speech sensitivity for single-talker noise from a direction generally in front of a headset implemented with the described techniques (top plot) as compared to a headset implemented without the described techniques (bottom plot), in some examples. As shown, the compared headsets have approximately equivalent performance, but the headset implementing the described techniques demonstrates a higher signal-to-noise ratio (SNR) with fewer false positives and therefore reduces denoising. In some examples, single-talker noise starts to bleed thru (i.e., occur) at the 50-second time interval with noise from in front of the headsets creating a difficult environment that can generate an increasing number of false positives (i.e., indications of speech), which hinders noise suppression by allowing a greater amount of noise to be heard.

In some examples, diffuse 4-channel "white noise" may be played from four (4) speakers in front, to the sides, and behind a HATS in the sound room, while speech is played from the HATS mouth. Volume of the noise, in some examples, may be increased in 6 dB increments, reaching 84 dB SPL (i.e., sound pressure level) at ERP (i.e., ear reference point).

Figure 1E:
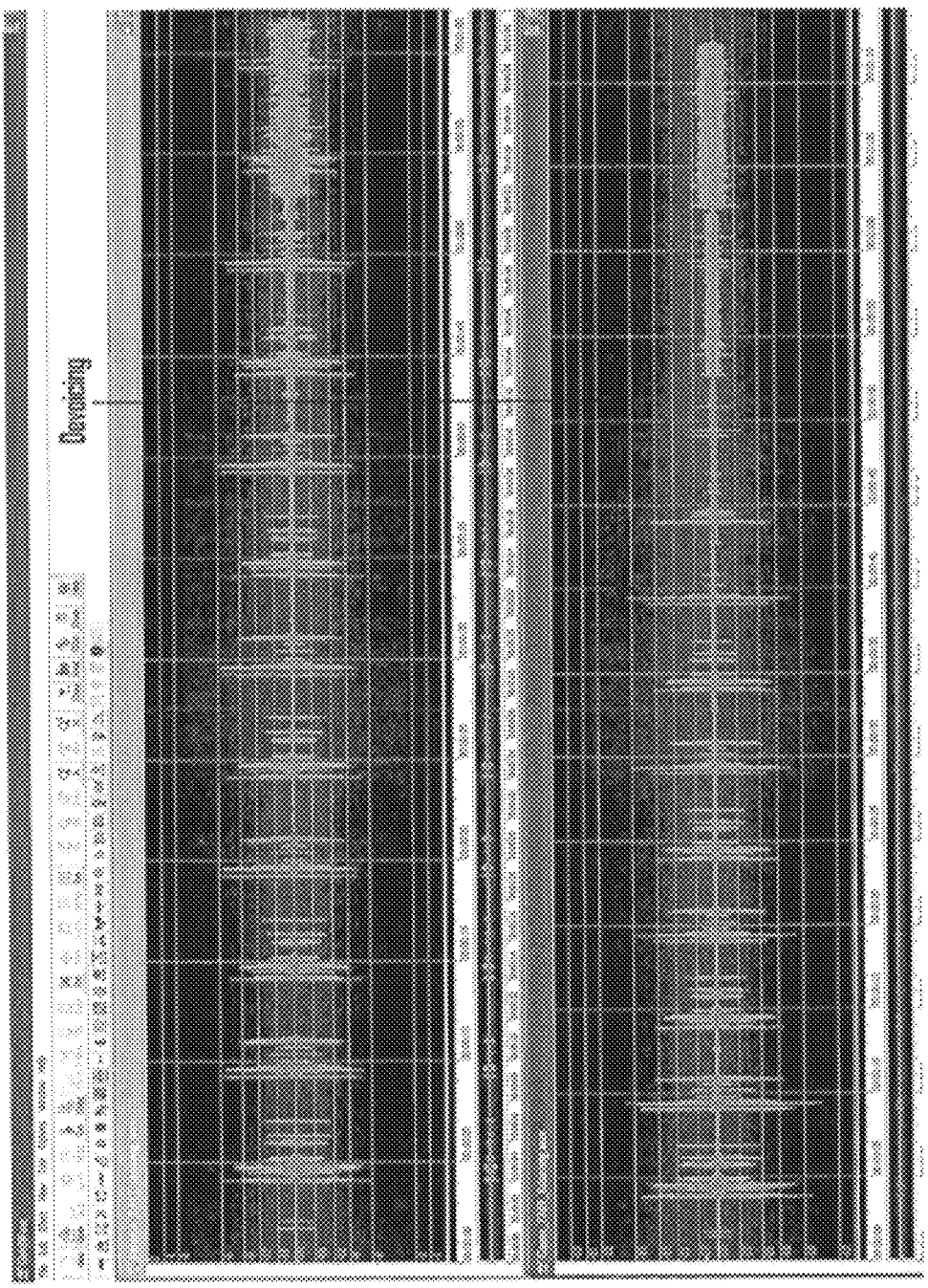
FIG. 1E shows resulting speech sensitivity for diffuse 4-channel noise for an exemplary headset.

FIG. 1E is an exemplary chart showing resulting speech sensitivity for diffuse 4-channel noise for a headset (e.g., ERA™ from Aliph), implemented with the described techniques (i.e., top plot) and a headset (e.g., ICON™ from Aliph) implemented without the described techniques (i.e., bottom plot), in accordance with some embodiments. Here, these plots show that for the headset implemented without the described techniques, devoicing begins when noise volume reaches approximately 72 dB SPL. Alternatively, the headset implemented with the described techniques begins to experience devoicing at approximately 78 dB SPL.

Figure 2:
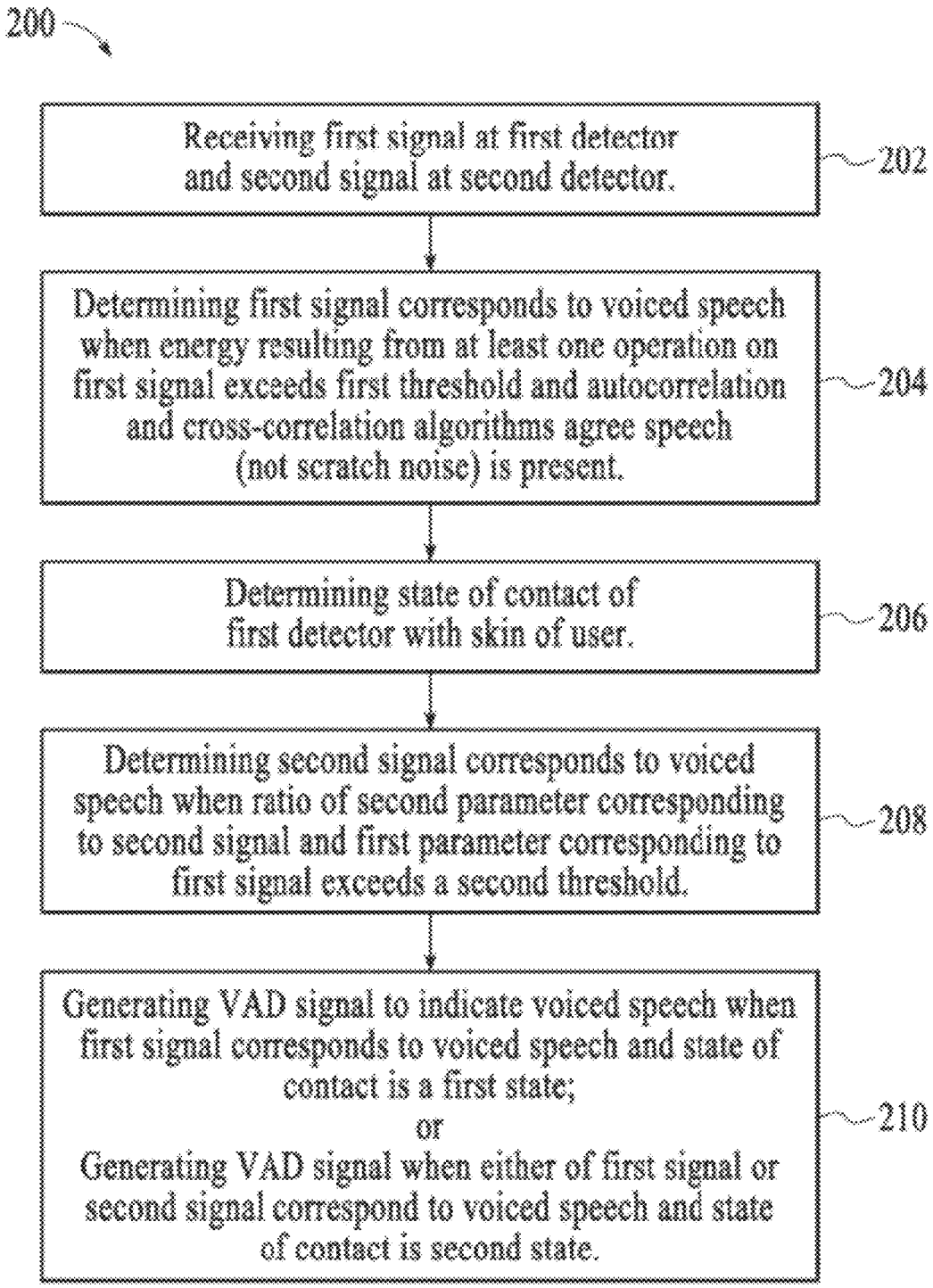
FIG. 2 is a flow diagram for an example of voice activity detection, according to some embodiments.

FIG. 2 is a flow diagram for an example of voice activity detection 200, according to some embodiments. The voice activity detection receives a first signal at a first detector and a second signal at a second detector 202. The first signal is different from the second signal. The voice activity detection determines the first signal corresponds to voiced speech when energy resulting from at least one operation on the first signal exceeds a first threshold 204. The voice activity detection determines a state of contact of the first detector with skin of a user 206. The voice activity detection determines the second signal corresponds to voiced speech when a ratio of a second parameter corresponding to the second signal and a first parameter corresponding to the first signal exceeds a second threshold 208. The voice activity detection algorithm generates a voice activity detection (VAD) signal to indicate a presence of voiced speech when the first signal corresponds to voiced speech and the state of contact is a first state, and/or generates the VAD signal when either of the first signal and the second signal correspond to voiced speech and the state of contact is a second state 210.

The acoustic VAD (AVAD) algorithm described below (see section "Acoustic Voice Activity Detection (AVAD) Algorithm for use with Electronic Systems" below) uses two omnidirectional microphones combined in way that significantly increases VAD accuracy over convention one- and two-microphone systems, but it is limited by its acoustic-based architecture and may begin to exhibit degraded performance in loud, impulsive, and/or reflective noise environments. The vibration sensor VAD (VVAD) described below (see section "Detecting Voiced and Unvoiced Speech Using Both Acoustic and Nonacoustic Sensors" and section "Acoustic Vibration Sensor" below) works very well in almost any noise environment but can exhibit degraded performance if contact with the skin is not maintained or if the speech is very low in energy. In some cases, a VAD may be influenced by movement errors where the vibration sensor moves with respect to the user's skin due to user movement.

A combination of AVAD and VVAD, though, is able to mitigate many of the problems associated with the individual algorithms. Also, extra processing to remove gross movement errors has significantly increased the accuracy of the combined VAD.

The communications headset example used in this disclosure is the Jawbone Prime Bluetooth headset, produced by AliphCom in San Francisco, Calif. This headset uses two omnidirectional microphones to form two virtual microphones using the system described below (see section "Dual Omnidirectional Microphone Array (DOMA)" below) as well as a third vibration sensor to detect human speech inside the cheek on the face of the user. Although the cheek location is preferred, any sensor that is capable of detecting vibrations reliably (such is an accelerometer or radiovibration detector (see section "Detecting Voiced and Unvoiced Speech Using Both Acoustic and Nonacoustic Sensors" below) can be used as well.

Unless specifically stated, the following acronyms and terms are defined as follows.

Denoising is the removal of unwanted noise from an electronic signal.

Devoicing is the removal of desired speech from an electronic signal.

False Negative is a VAD error when the VAD indicates that speech is not present when speech is present.

False Positive is a VAD error when the VAD indicates that speech is present when speech is not present.

Microphone is a physical acoustic sensing element.

Normalized Least Mean Square (NLMS) adaptive filter is a common adaptive filter used to determine correlation between the microphone signals. Any similar adaptive filter may be used.

The term $O_1$ represents the first physical omnidirectional microphone

The term $O_2$ represents the second Physical omnidirectional microphone

Skin Surface Microphone (SSM) is a microphone adapted to detect human speech on the surface of the skin (see section "Acoustic Vibration Sensor" below). Any similar sensor that is capable of detecting speech vibrations in the skin of the user can be substituted.

Voice Activity Detection (VAD) signal is a signal that contains information regarding the location in time of voiced and/or unvoiced speech.

Virtual microphone is a microphone signal comprised of combinations of physical microphone signals.

The VVAD of an embodiment uses the Skin Surface Microphone (SSM) produced by AliphCom, based in San Francisco, Calif. The SSM is an acoustic microphone modified to enable it to respond to vibrations in the cheek of a user (see section "Acoustic Vibration Sensor" below) rather than airborne acoustic sources. Any similar sensor that responds to vibrations (such as an accelerometer or radiovibrometer (see section "Detecting Voiced and Unvoiced Speech Using Both Acoustic and Nonacoustic Sensors" below)) can also be used. These sensors allow accurate detection of user speech even in the presence of loud environmental acoustic noise, but are susceptible to false positives due to gross movement of the sensor with respect to the user. These non-speech movements (generally referred to a "scratches" below) can be generated when the user walks, chews, or is physically located in a vibrating space such a car or train. The algorithms below limit the occurrences of false positives due to these movements.

Figure 3:
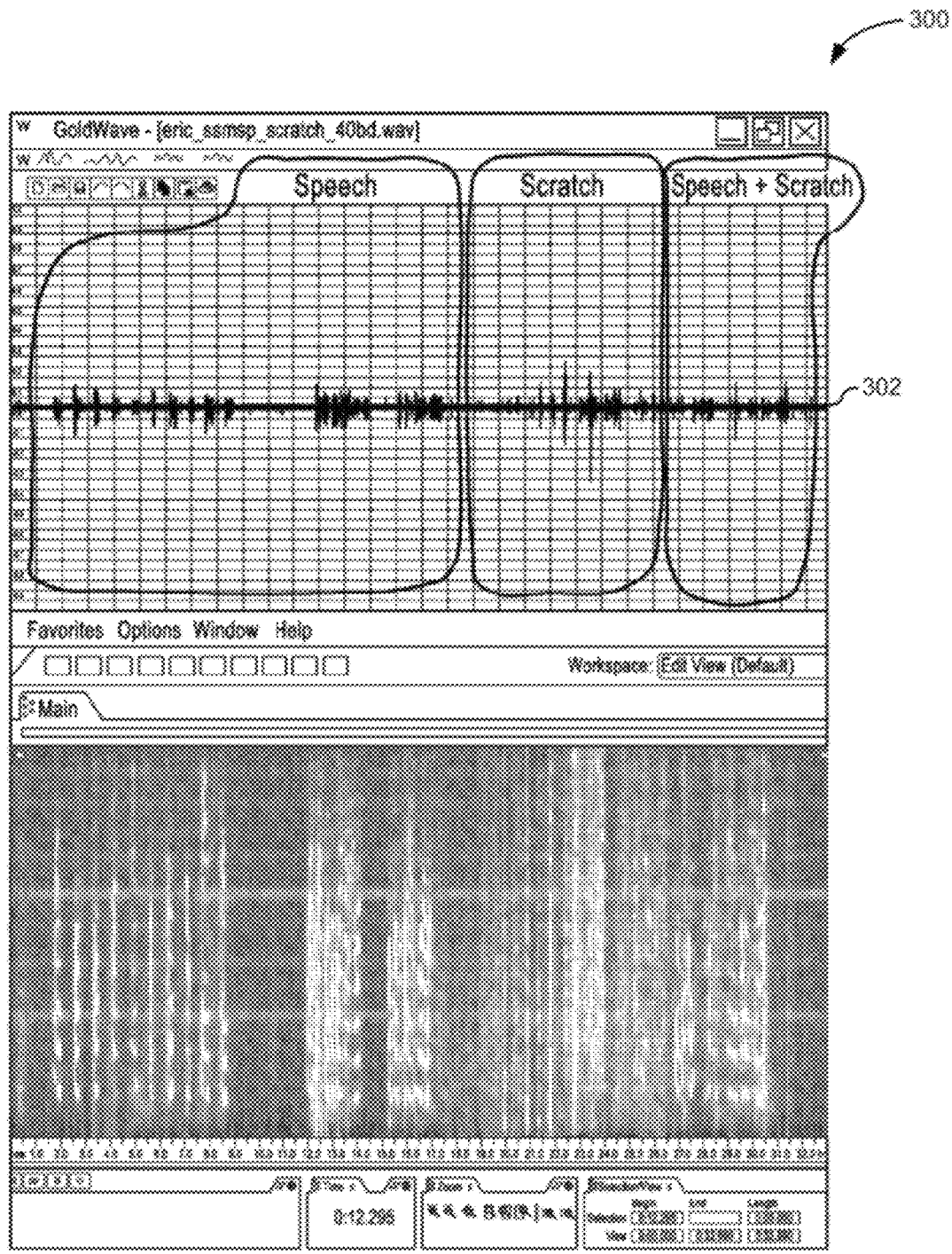
FIG. 3 is an exemplary SSM signal in time (top) and frequency (0-4 kHz, bottom)
Figure 4:
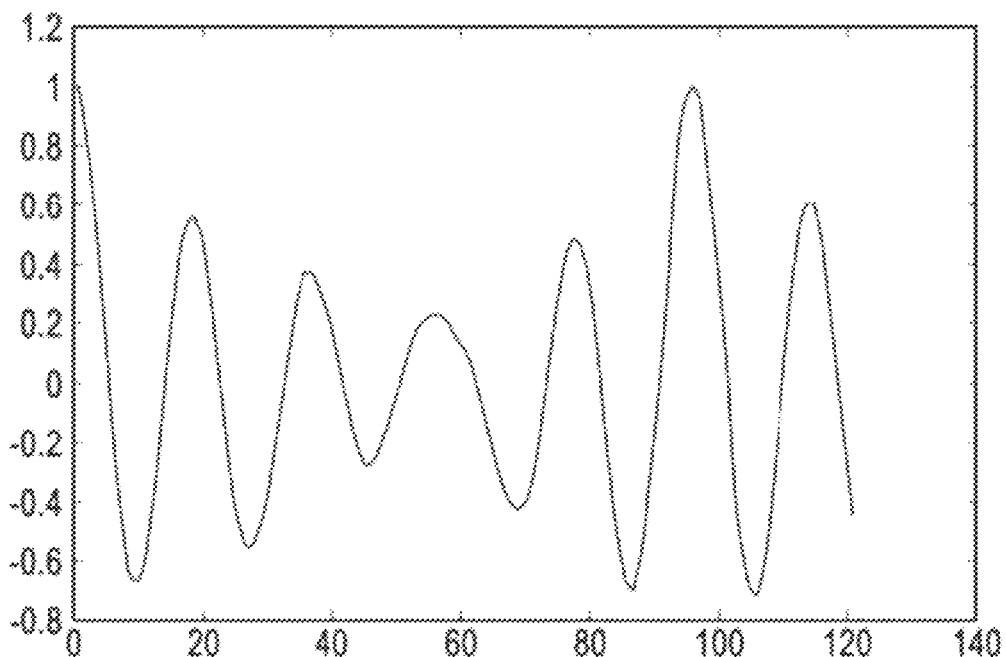
FIG. 4 is an exemplary normalized autocorrelation function for the SSM signal with speech present.
Figure 5:
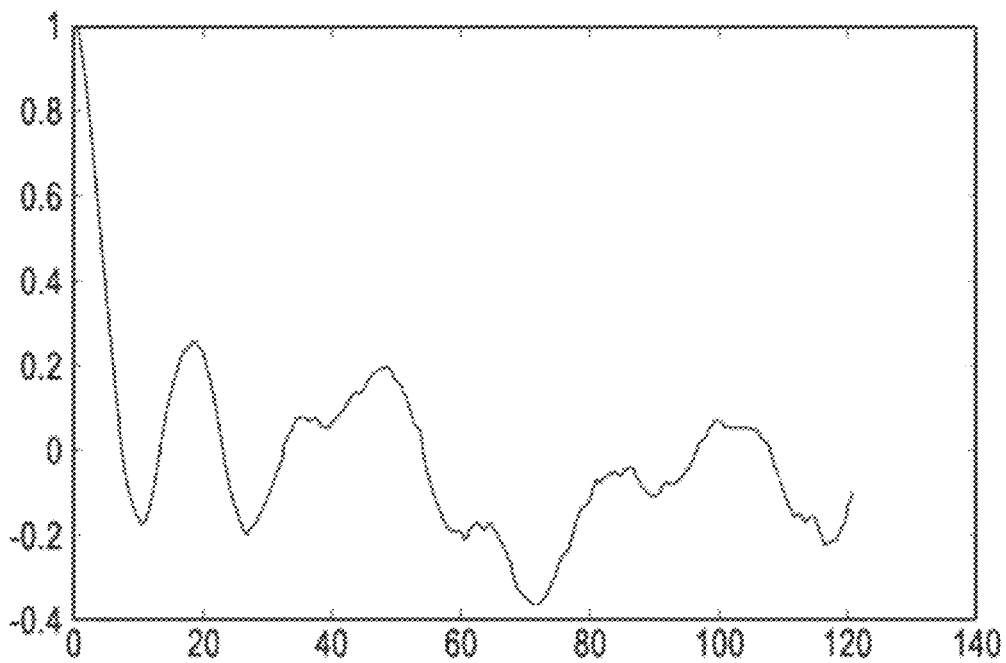
FIG. 5 is an exemplary normalized autocorrelation function for SSM signal with scratch present.

FIG. 3 is an exemplary SSM signal 302 in time (top) and frequency (0-4 kHz, bottom). FIG. 4 is an exemplary normalized autocorrelation function for the SSM signal with speech present. FIG. 5 is an exemplary normalized autocorrelation function for SSM signal with scratch present.

An energy based algorithm has been used for the SSM VAD (see section "Detecting Voiced and Unvoiced Speech Using Both Acoustic and Nonacoustic Sensors" below). It worked quite well in most noise environments, but could have performance issues with non-speech scratches resulting in false positives. These false positives reduced the effectiveness of the noise suppression and a way was sought to minimize them. The result is that the SSM VAD of an embodiment uses a non-energy based method since scratches often generate more SSM signal energy than speech does.

The SSM VAD decision of an embodiment is computed in two steps. The first is the existing energy-based decision technique. When the energy-based technique determines there is speech present is the second step applied in an attempt to reduce false positives.

Before examining the algorithms used to reduce false positives, the following description presents a review of the properties of the SSM and similar vibration sensor signals that operate on the cheek of the user. One property of the SSM and similar vibration sensor signals is that sensor signals for voiced speech are detectable but can be very weak; unvoiced speech is typically too weak to be detected. Another property of an exemplary SSM and similar vibration sensor signals is that they are effectively low-pass filtered, and may have various amounts of energy (e.g., some to significant amounts of energy) below 600-700 Hz. A further property of the SSM and similar vibration sensor signals is that they vary significantly from person to person as well as phoneme to phoneme. Yet another property of the SSM and similar vibration sensor signals is that the relationship between the strength of the sensor signal and the acoustically recorded speech signal is normally inverse— high energy vibration sensor signals correspond to a significant amount of energy inside the mouth of the user (such as an "ee") and a low amount of radiated acoustic energy. In the same manner, low energy vibration sensor signals correlate with high energy acoustic output.

Two main classes of algorithms are used in an embodiment to differentiate between speech signals and "scratch" signals: Pitch detection of the SSM signal and cross-correlation of SSM signal with microphone signal(s). Pitch detection is used because the voiced speech detected by the SSM always has a fundamental and harmonics present, and cross-correlation is used to ensure that speech is being produced by the user. Cross-correlation alone is insufficient as there can be other speech sources in the environment with similar spectral properties.

Pitch detection can simply and effectively implemented by computing the normalized autocorrelation function, finding the peak of it, and comparing it to a threshold.

The autocorrelation sequence used in an embodiment for a window of size N is:

$$R_k = \sum_{i=0}^{N-1-k} S_i S_{i+k} e^{-i/t}$$

where i is the sample in the window, S is the SSM signal, and $e^{-i/t}$ (the exponential decay factor) is applied to provide faster onset of the detection of a speech frame and a smoothing effect. Also, k is the lag, and is computed for the range of 20 to 120 samples, corresponding to pitch frequency range of 400 Hz to 67 Hz. The window size used in computing the autocorrelation function is a fixed size of 2×120=240 samples. This is to ensure that there are at least two complete periods of the wave in the computation.

In actual implementation, to reduce MIPS, the SSM signal is first downsampled by a factor of 4 from 8 kHz to 2 kHz. This is acceptable because the SSM signal has little useful speech energy above 1 kHz. This means that the range of k can be reduced to 5 to 30 samples, and the window size is 2×30=60 samples. This still covers the range from 67 to 400 Hz.

Figure 6:
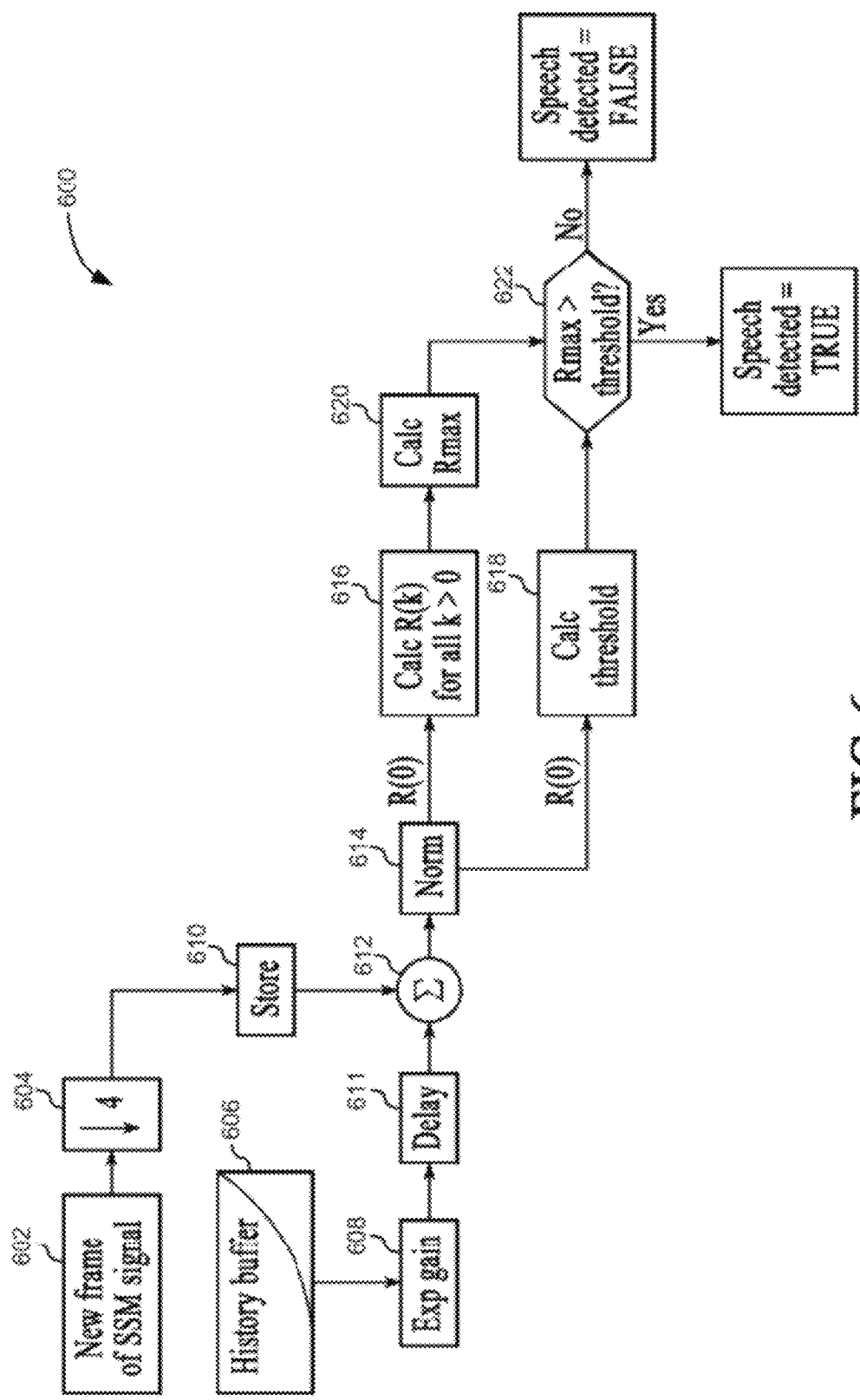
FIG. 6 is an exemplary flow chart for an example of an autocorrelation algorithm, according to some embodiments.

FIG. 6 shows a flow chart 600 for an example of an autocorrelation algorithm, according to some embodiments. The data in a history buffer 606 may be applied with an exponential gain 608 and delayed 611, and then a new frame 602 of down-sampled 604 (e.g., by four) SSM signal gets stored 610 in it. R(0) 614 is calculated once during the current frame. R(k) 616 may be calculated for the range of lags. The maximum R(k) 620 is then compared to T 618× R(0), and if it is greater than T×R(0), then the current frame is denoted as containing speech.

Cross-correlation of the sensor signal with the microphone signal(s) is also very useful, since the microphone signal may not contain a scratch signal. However, detailed examination shows that there are multiple challenges with this method.

The microphone signal and the SSM signal need not necessarily synchronized, and thus time alignment of the signals may performed, according to some examples. O1 or O2 are susceptible to acoustic noise which is not present in the SSM signal, thus in low SNR environments, the signals may have a low correlation value even when speech is present. Also, environmental noise may contain speech elements that correlate with the SSM signal. However, the autocorrelation has been shown to be useful in reducing false positives.

Figure 7:
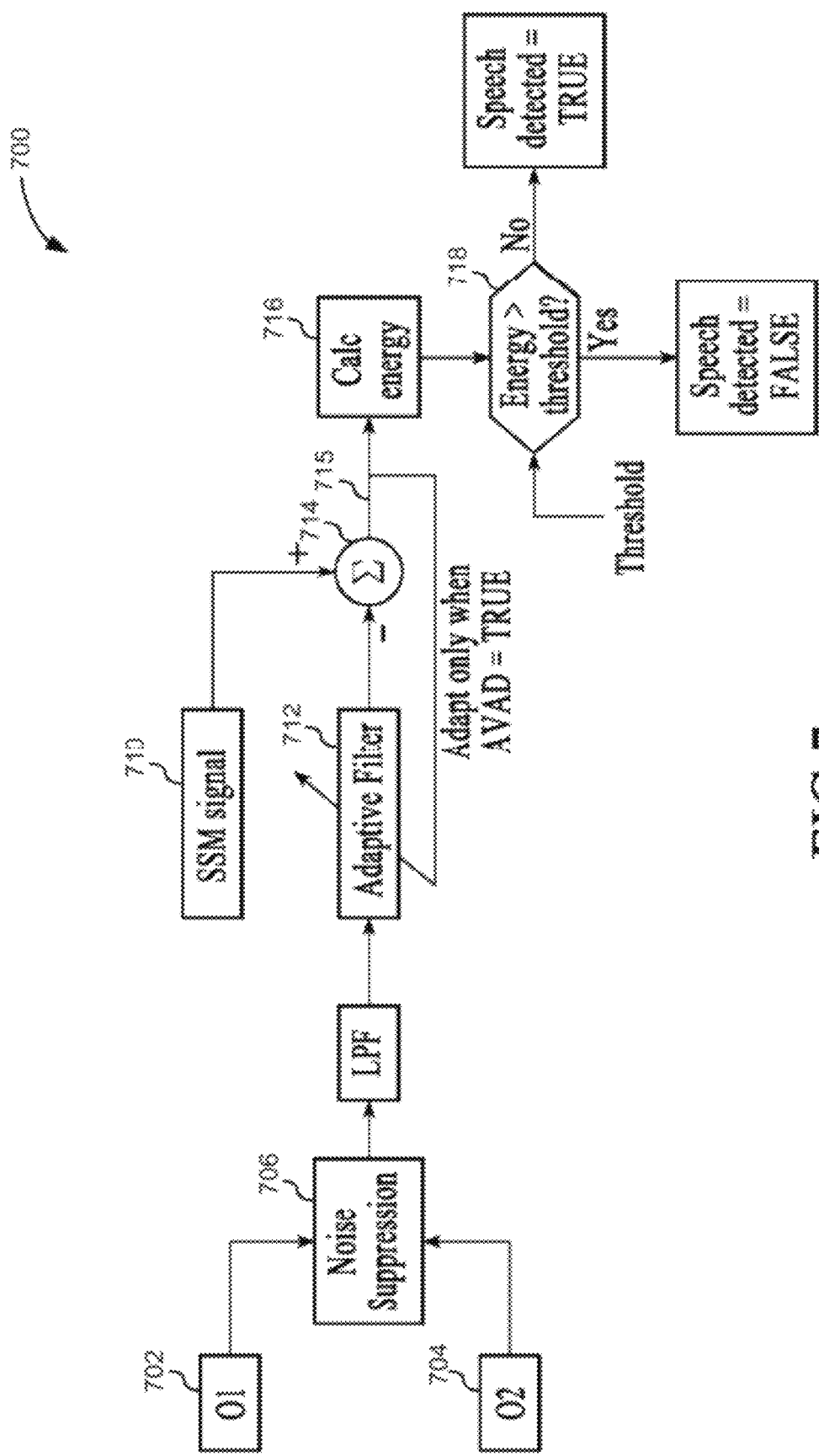
FIG. 7 is a flow chart for an exemplary cross-correlation algorithm, according to some embodiments.

FIG. 7 shows the flow chart 700 of an exemplary cross-correlation algorithm, according to some embodiments. The O1 signal 702 and O2 signal 704 first pass through a noise-suppressor 706 (NS, it may be single channel or dual-channel noise suppression) and are then low-pass filtered (LPF) 708 to make the speech signal to look similar to a SSM signal 710. LPF 708 can model the static response of the SSM signal 710, both in magnitude and phase response. Then the speech signal may be filtered by an adaptive filter (H) 712 that models the dynamic response of the SSM signal when speech is present. The error residual on path 715 drives the adaptation of the filter, and the adaptation may take place when the AVAD detects speech. When speech dominates the SSM signal, the residual energy 716 should be small. When scratch dominates the SSM signal, the residual energy 716 should be large.

Figure 8:
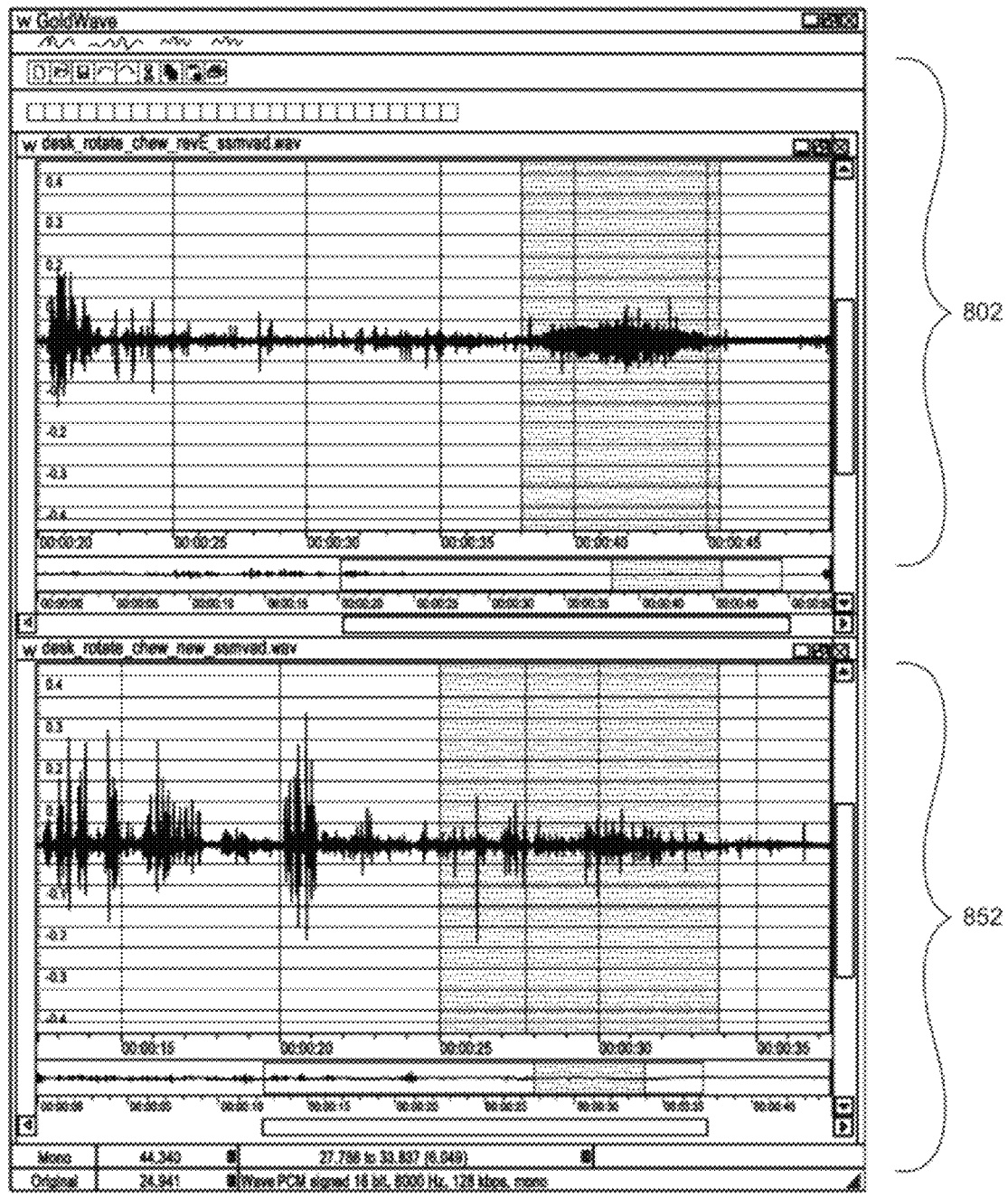
FIG. 8 is an example of the improved denoising performance due to the improvement in SSM VAD, according to some embodiments.

FIG. 8 shows an exemplary effect of scratch resistant VVAD on noise suppression performance, according to some embodiments. That is, FIG. 8 depicts an example of the improved denoising performance due to the improvement in SSM VAD. Top figure 802 shows that the noise suppression system having trouble denoising well due to the false positives of the original VVAD, because it is triggering on scratch due to chewing gum. Bottom figure 852 shows the same noise suppression system, with the improved scratch resistant VVAD implemented. The denoising performance may be enhanced, at least in some examples, because a VVAD need not trigger on scratch and thus allowing the denoising system to adapt and remove noise.

Figure 9:
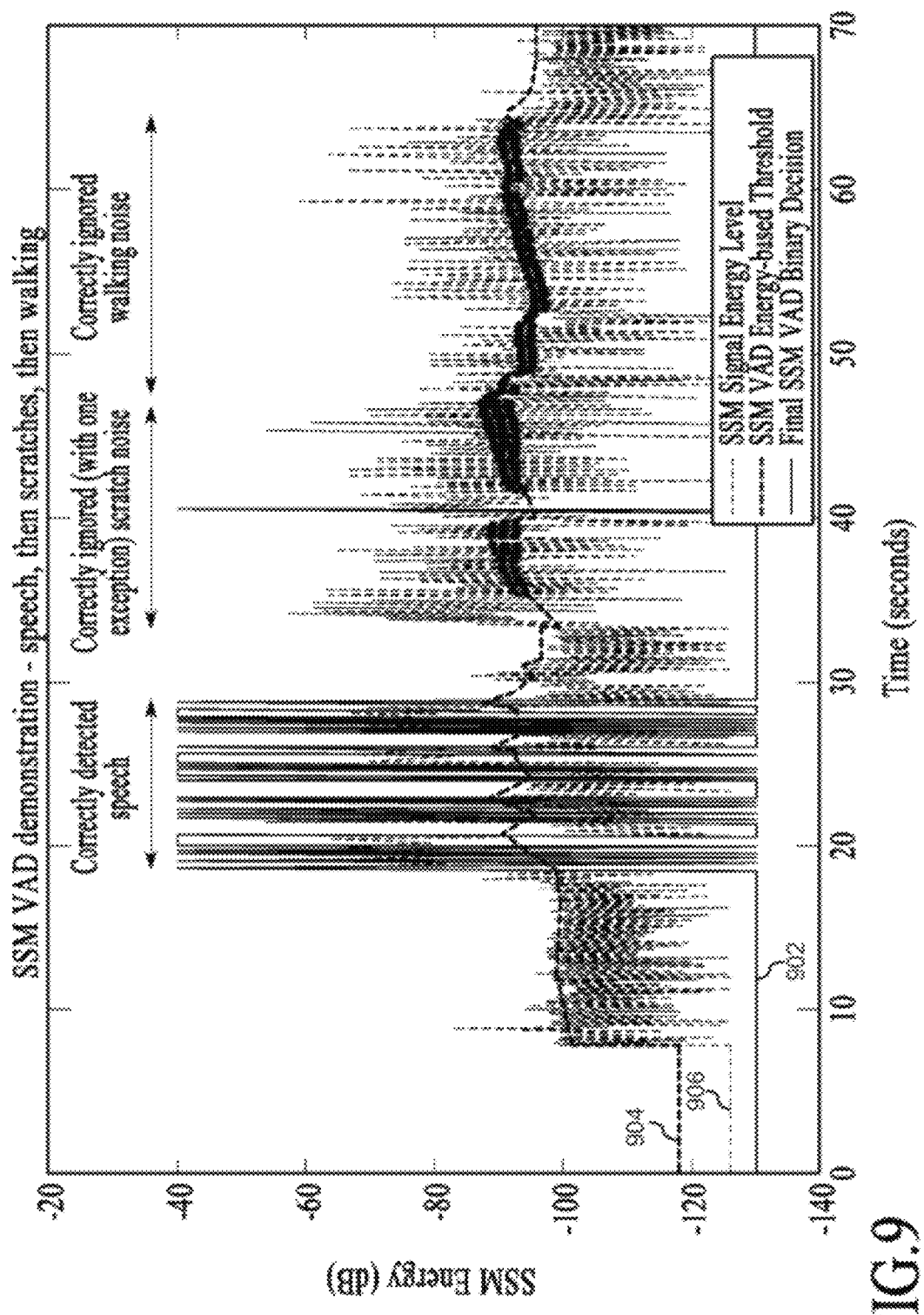
FIG. 9 shows an exemplary implementation of the scratch resistant VVAD, according to some embodiments.

FIG. 9 shows an exemplary implementation of the scratch resistant VVAD, according to some embodiments. FIG. 9 shows the VVAD (solid black line), the adaptive threshold (dashed black line), and the SSM energy (dashed gray line) during periods of speech (as detected), scratch noise due to moving the SSM across a face (as ignored except for a single frame), and scratch noise due to walking (as ignored), according to some embodiments. Solid black line 902 in the figure is an indicator of the output of the VVAD, dashed black line 904 is the adaptive energy threshold, and dashed gray line 906 is the energy of the SSM signal. In this embodiment, to be classified as speech using energy, the energy of the SSM may be more than the adaptive energy threshold. Note how the system correctly identifies the speech segment, but rejects all but a single window of the scratch noise segments, even though most of the scratch energy is well above the adaptive energy threshold. Without the improvements in the VAD algorithm as described herein, many of the high-energy scratch SSM signals may have generated false positive indications, reducing the ability of the system to remove environmental acoustic noise. Thus, this algorithm may significantly reduce or eliminate the number of false positives associated with non-speech vibration sensor signals without significantly affecting the ability of system to identify speech.

In some examples, the combined VAD algorithm can influence and/or contribute to the VAD selection process. For example, neither the AVAD nor the VVAD can be relied upon (e.g., either AVAD or VVAD can be emphasized or deemphasized in structure and/or functionality), so care may be taken to select the combination that is most likely to be correct.

The combination of the AVAD and VVAD of an embodiment is an "OR" combination—if either VVAD or AVAD indicates that the user is producing speech, then the VAD state is set to TRUE. While effective in reducing false negatives, this increases false positives. This is especially true for the AVAD, which is more susceptible to false positive errors, especially in high noise and reflective environments.

To reduce false positive errors, it is useful to attempt to determine how well the SSM is in contact with the skin. In some examples, if there is good contact and the SSM is reliable, then the VVAD may be used. If there is not good contact, then the "OR" combination above may be beneficial, in other examples.

Without a dedicated (hardware) contact sensor, there is no simple way to know in real-time that whether the SSM contact is good or not. The method below uses a conservative version of the AVAD, and whenever the conservative AVAD (CAVAD) detects speech it compares its VAD to the SSM VAD output. If the SSM VAD also detects speech consistently when CAVAD triggers, then SSM contact is determined to be good. Conservative means the AVAD is unlikely to falsely trigger (false-positive) due to noise, but may be very prone to false negatives to speech. The AVAD works by comparing the V1/V2 ratio against a threshold, and AVAD is set to TRUE whenever V1/V2 is greater than the threshold (e.g., approximately 3-6 dB). The CAVAD has a relatively higher (for example, 9+ dB) threshold. At this level, it is extremely unlikely to return false positives but sensitive enough to trigger on speech a significant percentage of the time. It is possible to set this up practically because of the very large dynamic range of the V1/V2 ratio given by the DOMA technique.

Figure 10:
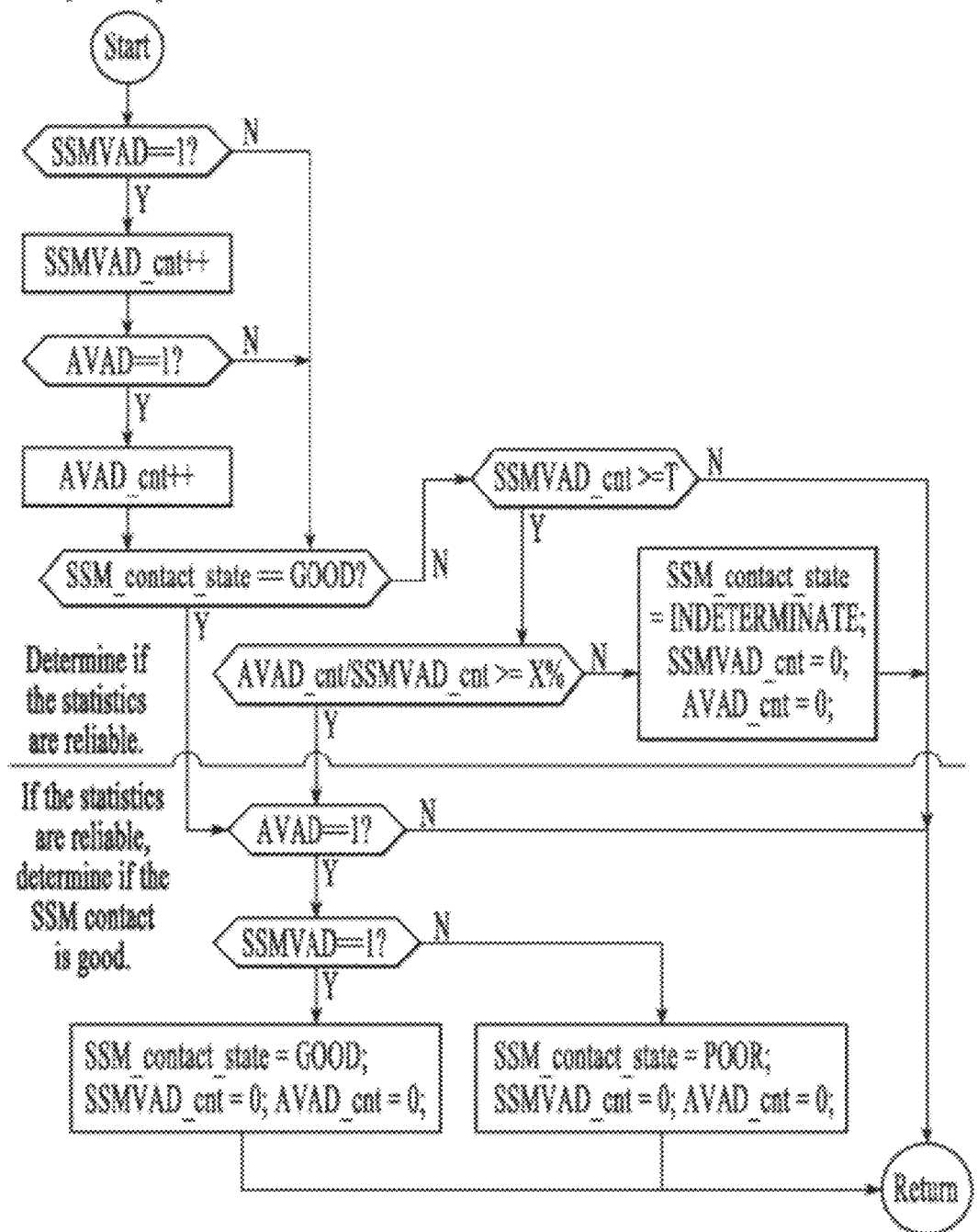
FIG. 10 is a flow chart of an example of a VAD combination algorithm, according to some embodiments.

However, if the AVAD is not functioning properly for some reason, this technique can fail and render the algorithm (and the headset) useless. So, the conservative AVAD is also compared to the VVAD to see if the AVAD is working. FIG. 10 is a flow chart of an example of a VAD combination algorithm, according to some embodiments. The details of this algorithm are shown in FIG. 10, where the SSM_contact_state is the final output. It takes one of the three values: GOOD, POOR or INDETERMINATE. If GOOD, the AVAD output is ignored. If POOR or INDETERMINATE, it is used in the "OR" combination with the VVAD as described above.

Several improvements to the VAD system of a headset that uses dual omnidirectional microphones and a vibration sensor have been described herein. False positives caused by large-energy spurious sensor signals due to relative non-speech movement between the headset and face have been reduced by using both the autocorrelation of the sensor signal and the cross-correlation between the sensor signal and one or both of the microphone signals. False positives caused by the "OR" combination of the acoustic microphone-based VAD and the sensor VAD have been reduced by testing the performance of each against the other and adjusting the combination depending on which is the more reliable sensor.

A dual omnidirectional microphone array (DOMA) that provides improved noise suppression is described herein. Compared to conventional arrays and algorithms, which seek to reduce noise by nulling out noise sources, the array of an embodiment is used to form two distinct virtual directional microphones that are configured to have very similar noise responses and very dissimilar speech responses. The null formed by the DOMA is one used to remove the speech of the user from $V_2$. The two virtual microphones of an embodiment can be paired with an adaptive filter algorithm and/or VAD algorithm to significantly reduce the noise without distorting the speech, significantly improving the SNR of the desired speech over conventional noise suppression systems. The embodiments described herein are stable in operation, flexible with respect to virtual microphone pattern choice, and have proven to be robust with respect to speech source-to-array distance and orientation as well as temperature and calibration techniques.

In the following description, numerous specific details are introduced to provide a thorough understanding of, and enabling description for, embodiments of the DOMA. One skilled in the relevant art, however, may recognize that these embodiments can be practiced without one or more of the specific details, or with other components, systems, etc. In other instances, well-known structures or operations are not shown, or are not described in detail, to avoid obscuring aspects of the disclosed embodiments.

Unless otherwise specified, the following terms have the corresponding meanings in addition to any meaning or understanding conveyed to one of ordinary skill in the art:

The term "bleedthrough" means the undesired presence of noise during speech.

The term "denoising" means removing unwanted noise from Mic1, and refers to the amount of reduction of noise energy in a signal in decibels (dB).

The term "devoicing" means removing/distorting the desired speech from Mic1.

The term "directional microphone (DM)" means a physical directional microphone that is vented on both sides of the sensing diaphragm.

The term "Mic1(M1)" means a general designation for an adaptive noise suppression system microphone that usually contains more speech than noise.

The term "Mic2(M2)" means a general designation for an adaptive noise suppression system microphone that usually contains more noise than speech.

The term "noise" means unwanted environmental acoustic noise.

The term "null" means a zero or minima in the spatial response of a physical or virtual directional microphone.

The term "$O_1$" means a first physical omnidirectional microphone used to form a microphone array.

The term "$O_2$" means a second physical omnidirectional microphone used to form a microphone array.

The term "speech" means desired speech of the user.

The term "Skin Surface Microphone (SSM)" is a microphone used in an earpiece (e.g., the Jawbone earpiece available from Aliph of San Francisco, Calif.) to detect speech vibrations on the user's skin.

The term "$V_1$" means the virtual directional "speech" microphone, which has no nulls.

The term "$V_2$" means the virtual directional "noise" microphone, which has a null for the user's speech.

The term "Voice Activity Detection (VAD) signal" means a signal indicating when user speech is detected.

The term "virtual microphones (VM)" or "virtual directional microphones" means a microphone constructed using two or more omnidirectional microphones and associated signal processing.

Figure 11:
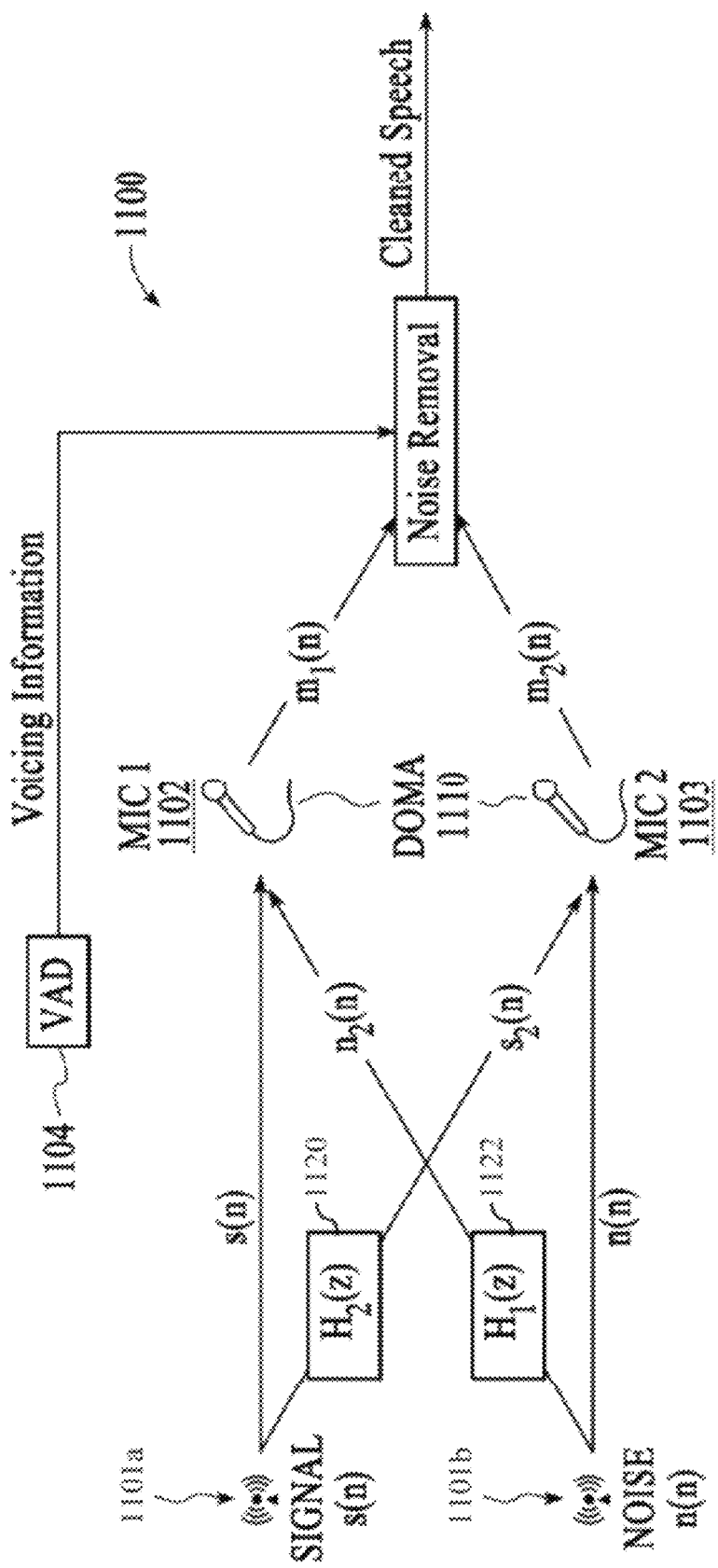
FIG. 11 is an example of a two-microphone adaptive noise suppression system, according to some embodiments.

FIG. 11 is an example of a two-microphone adaptive noise suppression system 1100, according to some embodiments. The two-microphone system 1100 including the combination of physical microphones ("MIC 1") 1102 and ("MIC 2") 1103 along with the processing or circuitry components to which the microphones couple (described in detail below, but not shown in this figure) is referred to herein as the dual omnidirectional microphone array (DOMA) 1110, but the embodiment is not so limited. Referring to FIG. 11, in analyzing the single noise source 1101b and the direct path to the microphones, the total acoustic information coming into MIC 1 (1102, which can be a physical or virtual microphone) is denoted by $m_1(n)$. The total acoustic information coming into MIC 2 (1103, which can also be a physical or virtual microphone) is similarly labeled $m_2(n)$. In the z (digital frequency) domain, these are represented as $M_1(z)$ and $M_2(z)$. Then, $$M_1(z)=S(z)+N_2(z)$$

$$M_2(z)=N(z)+S_2(z)$$

with $$N_2(z)=N(z)H_1(z)$$

$$S_2(z)=S(z)H_2(z),$$

so that $$M_1(z)=S(z)+N(z)H_1(z)$$

$$M_2(z)=N(z)+S(z)H_2(z). \quad\quad\quad \text{Eq. 1}$$

This is the general case for all two microphone systems. Equation 1 has four unknowns and two known relationships and therefore cannot be solved explicitly.

However, there is another way to solve for some of the unknowns in Equation 1. The analysis starts with an examination of the case where the speech is not being generated, that is, where a signal from the VAD subsystem 1104 (optional) equals zero. In this case, s(n)=S(z)=0, and Equation 1 reduces to $$M_{1N}(z)=N(z)H_1(z)$$

$$M_{2N}(z)=N(z),$$

where the N subscript on the M variables indicate that noise is being received. This leads to $$M_{1N}(z) = M_{2N}(z)H_1(z) \qquad \text{Eq. 2}$$
$$H_1(z) = \frac{M_{1N}(z)}{M_{2N}(z)}$$

The function $H_1(z)$ 1122 can be calculated using any of the available system identification algorithms and the microphone outputs when the system is certain that noise is being received. The calculation can be done adaptively, so that the system can react to changes in the noise.

A solution is now available for $H_1(z)$, one of the unknowns in Equation 1. The final unknown, $H_2(z)$ 1120, can be determined by using the instances where speech is being produced and the VAD equals one. When this is occurring, but the recent (perhaps less than 1 second) history of the microphones indicate low levels of noise, it can be assumed that n(s)=N(z)≈0. Then Equation 1 reduces to $$M_{1S}(z)=S(z)$$

$$M_{2S}(z)=S(z)H_2(z),$$

which, in turn, leads to:

$$M_{2S}(z) = M_{1S}(z)H_2(z)$$
$$H_2(z) = \frac{M_{2S}(z)}{M_{1S}(z)},$$

which is the inverse of the $H_1(z)$ 1122 calculation. However, it is noted that different inputs are being used (now the speech is occurring whereas before the noise was occurring). While calculating $H_2(z)$ 1120, the values calculated for $H_1(z)$ are held constant (and vice versa) and it is assumed that the noise level is not high enough to cause errors in the $H_2(z)$ calculation.

After calculating $H_1(z)$ 1122 and $H_2(z)$ 1120, they are used to remove the noise from the signal. If Equation 1 is rewritten as $$S(z)=M_1(z)-N(z)H_1(z)$$

$$N(z)=M_2(z)-S(z)H_2(z)$$

$$S(z)=M_1(z)-[M_2(z)-S(z)H_2(z)]H_1(z)$$

$$S(z)[1-H_2(z)H_1(z)]=M_1(z)-M_2(z)H_1(z),$$

then N(z) may be substituted as shown to solve for S(z) as $$S(z) = \frac{M_1(z) - M_2(z)H_1(z)}{1 - H_1(z)H_2(z)}. \qquad \text{Eq. 3}$$

If the transfer functions $H_1(z)$ 1122 and $H_2(z)$ 1120 can be described with sufficient accuracy, then the noise can be completely removed and the original signal recovered. This remains true without respect to the amplitude or spectral characteristics of the noise. If there is very little or no leakage from the speech source into $M_2$, then $H_2(z)\approx 0$ and Equation 3 reduces to $$S(z)\approx M_1(z)-M_2(z)H_1(z). \qquad \text{Eq. 4}$$

Equation 4 is much simpler to implement and is very stable, assuming $H_1(z)$ is stable. However, if significant speech energy is in $M_2(z)$, devoicing can occur. In order to construct a well-performing system and use Equation 4, consideration is given to the following conditions:

R1. Availability of a perfect (or at least very good) VAD in noisy conditions
R2. Sufficiently accurate $H_3(z)$
R3. Very small (ideally zero) $H_2(z)$.
R4. During speech production, $H_1(z)$ cannot change substantially.
R5. During noise, $H_2(z)$ cannot change substantially.

Condition R1 is easy to satisfy if the SNR of the desired speech to the unwanted noise is high enough. "Enough" means different things depending on the method of VAD generation. If a VAD vibration sensor is used, as in Burnett U.S. Pat. No. 7,256,048, accurate VAD in very low SNRs (–10 dB or less) is possible. Acoustic-related methods using information from $O_1$ and $O_2$ can also return accurate VADs, but are limited to SNRs of –3 dB or greater for adequate performance.

Condition R5 is normally simple to satisfy because for most applications the microphones may not change position with respect to the user's mouth very often or rapidly. In those applications where it may happen (such as hands-free conferencing systems) it can be satisfied by configuring Mic2 1103 so that $H_2(z)\approx 0$. Satisfying conditions R2, R3, and R4 are more difficult but are possible given the right combination of $V_1$ and $V_2$. Methods are examined below that have proven to be effective in satisfying the above, resulting in excellent noise suppression performance and minimal speech removal and distortion in an embodiment.

The DOMA, in various embodiments, can be used with the Pathfinder system as the adaptive filter system or noise removal. The Pathfinder system, available from AliphCom, San Francisco, Calif., is described in detail in other patents and patent applications referenced herein. Alternatively, any adaptive filter or noise removal algorithm can be used with the DOMA in one or more various alternative embodiments or configurations When the DOMA is used with the Pathfinder system, the Pathfinder system generally provides adaptive noise cancellation by combining the two microphone signals (e.g., Mic1, Mic2) by filtering and summing in the time domain. The adaptive filter generally uses the signal received from a first microphone of the DOMA to remove noise from the speech received from at least one other microphone of the DOMA, which relies on a slowly varying linear transfer function between the two microphones for sources of noise. Following processing of the two channels of the DOMA, an output signal is generated in which the noise content is attenuated with respect to the speech content, as described in detail below.

Figure 12:
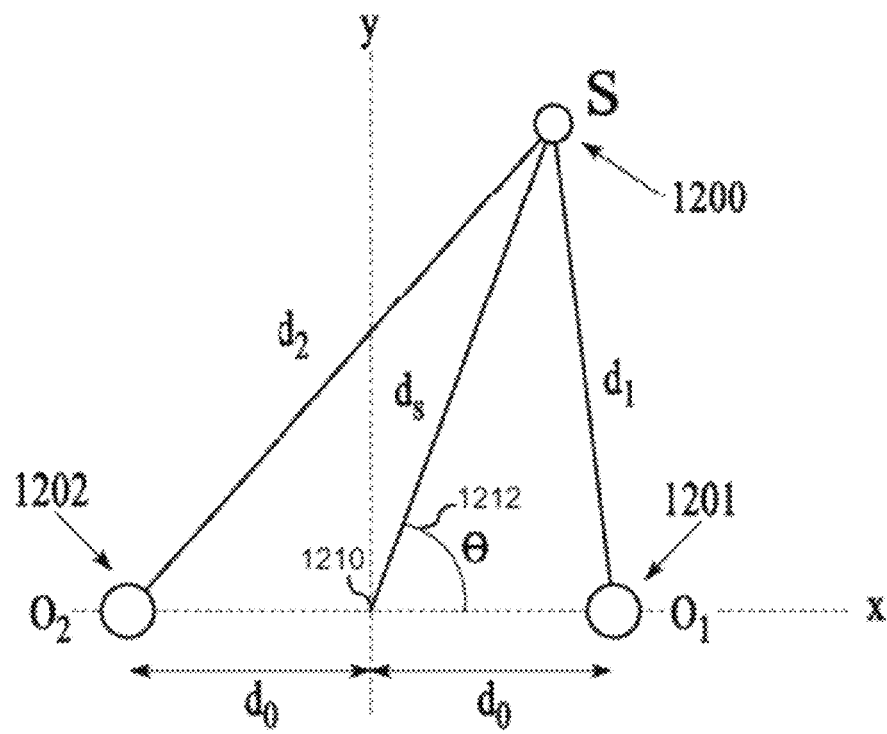
FIG. 12 is an exemplary configuration including an array and speech source (S), according to some embodiments.

FIG. 12 is an exemplary two-microphone array (DOMA) including an array of omnidirectional microphone ("$O_2$") 1202 and omnidirectional microphone ("$O_1$") 1201, and speech source S configuration 1200, according to some embodiments. The microphones can be separated by a distance approximately equal to $2d_0$, and the speech source is located a distance, $d_s$, away from a midpoint of the array at an angle θ. The system may be axially symmetric so $d_s$ and θ may be specified.

Figure 13:
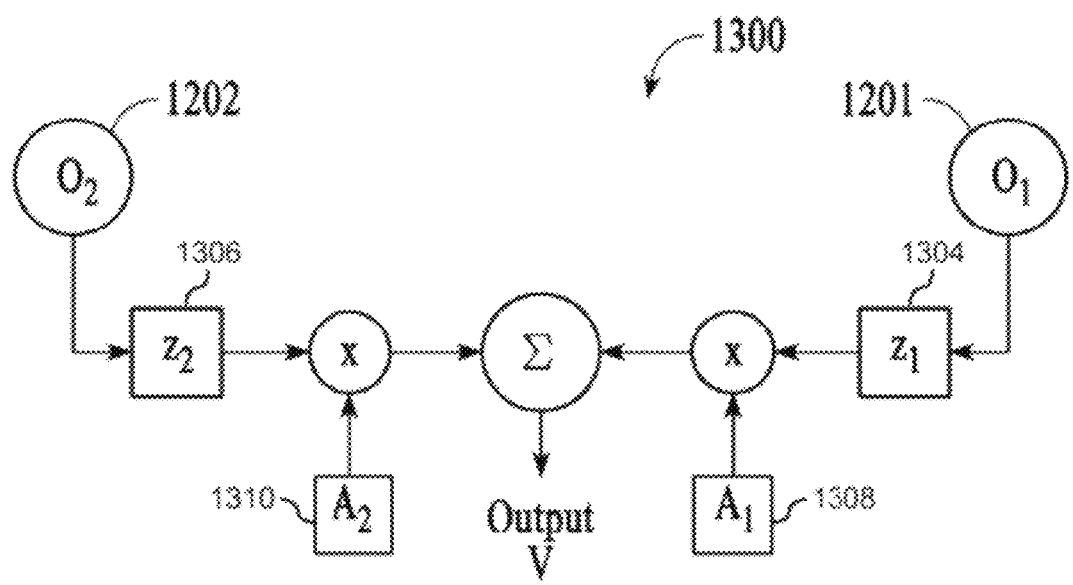
FIG. 13 is a block diagram for an exemplary first order gradient microphone using two omnidirectional elements $O_1$ and $O_2$, according to some embodiments.

FIG. 13 is a system 1300 for generating, producing or emulating an exemplary first order gradient microphone V using two omnidirectional elements ("$O_1$") 1201 and $O_2$ 1202, according to some embodiments. The array of an embodiment includes two physical microphones 1201 and 1202 (e.g., omnidirectional microphones) placed a distance $2d_0$ apart and a speech source 1200 is located a distance $d_s$ away from a reference point 1210 at an angle 1212 of θ. This array is axially symmetric (at least in free space), so no other angle is needed. The output from each microphone 1201 and 1202 can be delayed by delay ("$z_1$") 1304 and delay ("$z_2$") 1306, multiplied by a gain ("$A_1$") 1308 and again ("$A_2$") 1310, and then summed with the other as demonstrated in FIG. 13. The output of the array is or forms at least one virtual microphone, as described in detail below. This operation can be over any frequency range desired. By varying the magnitude and sign of the delays and gains, a wide variety of virtual microphones (VMs), also referred to herein as virtual directional microphones, can be realized, at least in some embodiments. There are other methods known to those skilled in the art for constructing VMs but this is a common one and may be used in the enablement below.

Figure 14:
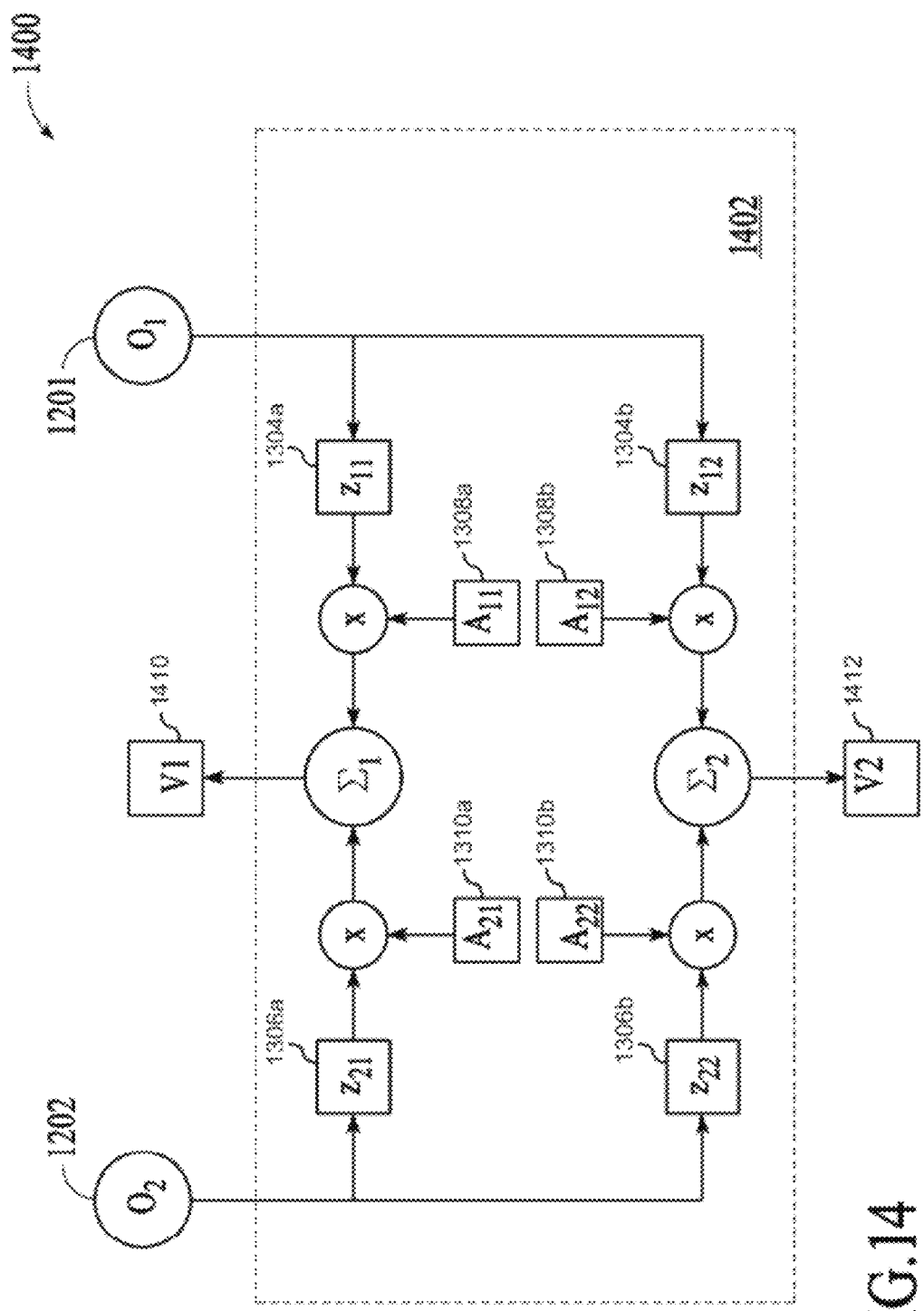
FIG. 14 is a block diagram for a DOMA including an example of two physical microphones configured to form two virtual microphones $V_1$ and $V_2$, according to some embodiments.

As an example, FIG. 14 is a block diagram for a system 1400 (e.g., a DOMA system) including an example of two physical microphones configured to form two virtual microphones $V_1$ 1410 and $V_2$ 1412, according to some embodiments. DOMA 1400 includes two first order gradient microphones $V_1$ and $V_2$ formed using the outputs of two microphones or elements $O_1$ and $O_2$ (1201 and 1202), according to some embodiments. DOMA 1400 of an embodiment includes two physical microphones ("$O_1$") 1201 and ("$O_2$") 1202 that can be omnidirectional microphones, as described above with reference to FIGS. 12 and 13. The output from each microphone is coupled to a processing component 1402, or circuitry, and the processing component outputs signals representing or corresponding to the virtual microphones $V_1$ and $V_2$.

In this example system 1400, the output of physical microphone 1201 is coupled to processing component 1402 that includes a first processing path that includes application of a first delay ("$z_{11}$") 1304a and a first gain ("$A_{11}$") 1308a and a second processing path that includes application of a second delay ("$z_{12}$") 1304b and a second gain ("$A_{12}$") 1306b. The output of physical microphone 1202 is coupled to a third processing path of the processing component 1402 that includes application of a third delay ("$z_{21}$") 1306a and a third gain ("$A_{21}$") 1310a and a fourth processing path that includes application of a fourth delay ("$z_{22}$") 1306b and a fourth gain ("$A_{22}$") 1316b. The output of the first and third processing paths is summed to form virtual microphone ("$V_1$") 1410, and the output of the second and fourth processing paths is summed to form virtual microphone ("$V_2$") 1412.

As described in detail below, varying the magnitude and sign of the delays and gains of the processing paths leads to a wide variety of virtual microphones (VMs), also referred to herein as virtual directional microphones, can be realized. While the processing component 1402 described in this example includes four processing paths generating two virtual microphones or microphone signals, the embodiment is not so limited.

Figure 15:
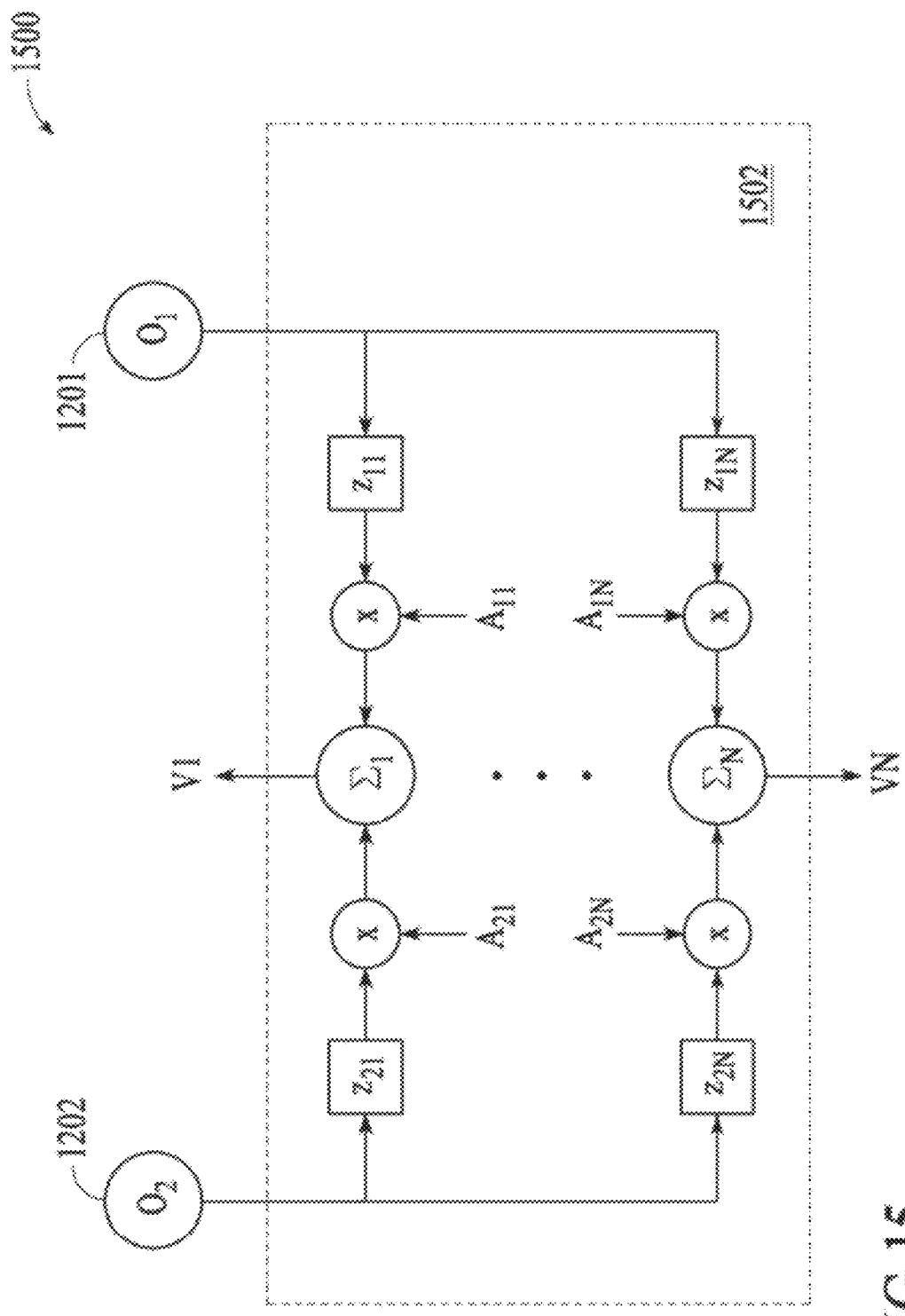
FIG. 15 is a block diagram for an example of a DOMA including two physical microphones configured to form N virtual microphones $V_1$ through $V_N$, where N is any number greater than one, according to some embodiments.

For example, FIG. 15 is a block diagram for an example of a DOMA 1500 including two physical microphones 1201 and 1202 configured to form N virtual microphones $V_1$ through $V_N$, where N is any number greater than one, according to some embodiments. Thus, the DOMA can include a processing component 1502 having any number of processing paths as appropriate to form a number N of virtual microphones.

The DOMA of an embodiment can be coupled or connected to one or more remote devices. In a system configuration, the DOMA outputs signals to the remote devices. The remote devices include, but are not limited to, at least one of cellular telephones, satellite telephones, portable telephones, wireline telephones, Internet telephones, wireless transceivers, wireless communication radios, personal digital assistants (PDAs), personal computers (PCs), headset devices, head-worn devices, and earpieces.

Furthermore, the DOMA of an embodiment can be a component or subsystem integrated with a host device. In this system configuration, the DOMA outputs signals to components or subsystems of the host device. The host device includes, but is not limited to, at least one of cellular telephones, satellite telephones, portable telephones, wireline telephones, Internet telephones, wireless transceivers, wireless communication radios, personal digital assistants (PDAs), personal computers (PCs), headset devices, head-worn devices, and earpieces.

Figure 16:
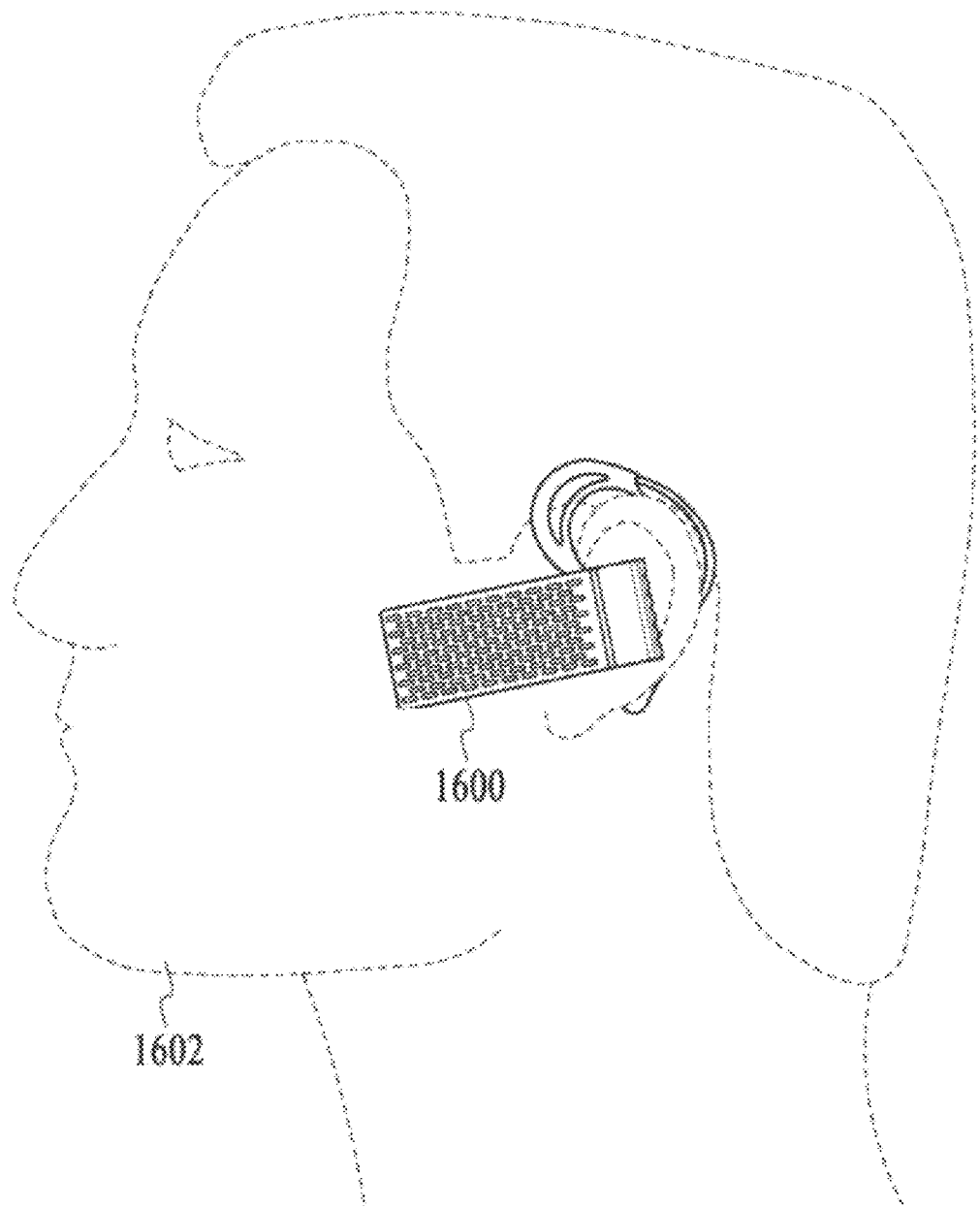
FIG. 16 is an example of a headset or head-worn device that includes the DOMA, as described herein, according to some embodiments.

As an example, FIG. 16 is an example of a headset or head-worn device 1600 that includes the DOMA, as described herein, according to some embodiments. The headset 1600 of an embodiment includes a housing having two areas or receptacles (not shown) that receive and hold two microphones (e.g., $O_1$ and $O_2$). The headset 1600 is generally a device that can be worn by a speaker 1602, for example, a headset or earpiece that positions or holds the microphones in the vicinity of the speaker's mouth. The headset 1600 of an embodiment places a first physical microphone (e.g., physical microphone $O_1$) in a vicinity of a speaker's lips. A second physical microphone (e.g., physical microphone $O_2$) is placed a distance behind the first physical microphone. In some examples, the distance of may be in a range of a few centimeters behind the first physical microphone or as described herein (e.g., described with reference to FIGS. 11-15). The DOMA is symmetric and is used in the same configuration or manner as a single close-talk microphone, but is not so limited.

Figure 17:
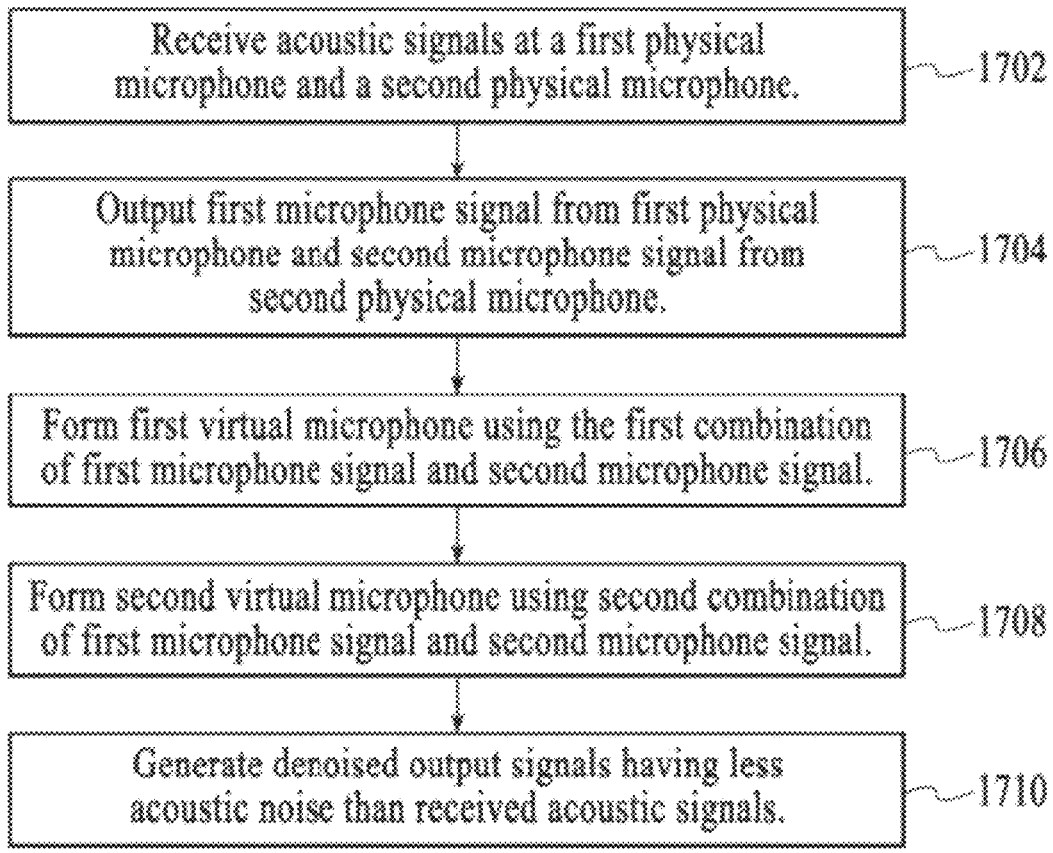
FIG. 17 is a flow diagram for examples of denoising acoustic signals using the DOMA, according to some embodiments.

FIG. 17 is a flow diagram for examples of denoising 1700 acoustic signals using the DOMA, according to some embodiments. The denoising 1700 begins by receiving 1702 acoustic signals at a first physical microphone and a second physical microphone. In response to the acoustic signals, a first microphone signal is output from the first physical microphone and a second microphone signal is output from the second physical microphone 1704. A first virtual microphone is formed 1706 by generating a first combination of the first microphone signal and the second microphone signal. A second virtual microphone is formed 1708 by generating a second combination of the first microphone signal and the second microphone signal, and the second combination is different from the first combination. The first virtual microphone and the second virtual microphone are distinct virtual directional microphones with substantially similar responses to noise and substantially dissimilar responses to speech. The denoising 1700 generates 1710 output signals by combining signals from the first virtual microphone and the second virtual microphone, and the output signals include less acoustic noise than the acoustic signals.

Figure 18:
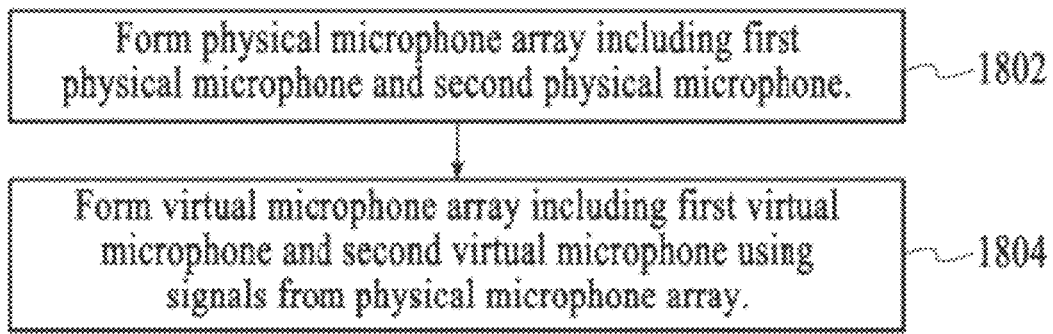
FIG. 18 is a flow diagram for forming an exemplary DOMA, according to some embodiments.

FIG. 18 is a flow diagram for forming 1800 an exemplary DOMA, according to some embodiments. Formation 1800 of the DOMA includes forming 1802 a physical microphone array including a first physical microphone and a second physical microphone. The first physical microphone outputs a first microphone signal and the second physical microphone outputs a second microphone signal. A virtual microphone array is formed 1804 comprising a first virtual microphone and a second virtual microphone. The first virtual microphone comprises a first combination of the first microphone signal and the second microphone signal. The second virtual microphone comprises a second combination of the first microphone signal and the second microphone signal, and the second combination is different from the first combination. The virtual microphone array including a single null oriented in a direction toward a source of speech of a human speaker.

The construction of VMs for the adaptive noise suppression system of an embodiment includes substantially similar noise response in $V_1$ and $V_2$. Substantially similar noise response as used herein means that $H_1(z)$ is simple to model and may not change much during speech, satisfying conditions R2 and R4 described above and allowing strong denoising and minimized bleedthrough.

The construction of VMs for the adaptive noise suppression system of an embodiment includes relatively small speech response for $V_2$. The relatively small speech response for $V_2$ means that $H_2(z) \approx 0$, which may satisfy conditions R3 and R5 described above.

The construction of VMs for the adaptive noise suppression system of an embodiment further includes sufficient speech response for $V_1$ so that the cleaned speech may have significantly higher SNR than the original speech captured by $O_1$.

The description that follows assumes that the responses of the omnidirectional microphones $O_1$ and $O_2$ to an identical acoustic source have been normalized so that they have exactly the same response (amplitude and phase) to that source. This can be accomplished using standard microphone array methods (such as frequency-based calibration) well known to those versed in the art.

Referring to the condition that construction of VMs for the adaptive noise suppression system of an embodiment includes relatively small speech response for $V_2$, it is seen that for discrete systems $V_2(z)$ can be represented as:

$$V_2(z) = O_2(z) - z^{-\gamma} \beta O_1(z)$$

where $$B = \frac{d_1}{d_2}$$

$$\gamma = \frac{d_2 - d_1}{c} \cdot f_s \text{ (samples)}$$

$$d_1 = \sqrt{d_s^2 - 2 d_s d_0 \cos(\theta) + d_0^2}$$

$$d_2 = \sqrt{d_s^2 + 2 d_s d_0 \cos(\theta) + d_0^2}$$

The distances $d_1$ and $d_2$ are the distance from $O_1$ and $O_2$ to the speech source (see FIG. 12), respectively, and $\gamma$ is their difference divided by c, the speed of sound, and multiplied by the sampling frequency $f_s$. Thus $\gamma$ is in samples, but need not be an integer. For non-integer $\gamma$, fractional-delay filters (well known to those versed in the art) may be used.

Note that the β above is not the conventional β used to denote the mixing of VMs in adaptive beamforming; it is a physical variable of the system that depends on the intra-microphone distance $d_0$ (which is fixed) and the distance $d_s$ and angle θ, which can vary. As shown below, for properly calibrated microphones, it is not necessary for the system to be programmed with the exact β of the array. Errors of approximately 10-15% in the actual .beta. (i.e. the β used by the algorithm is not the β of the physical array) have been used with very little degradation in quality. The algorithmic value of may be calculated and set for a particular user or may be calculated adaptively during speech production when little or no noise is present. However, adaptation during use is not required for nominal performance.

Figure 19:
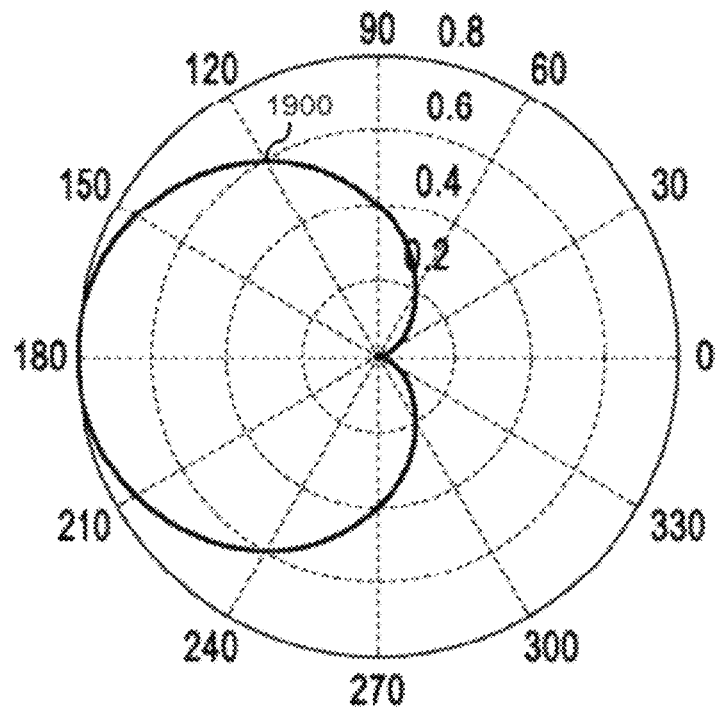
FIG. 19 is a plot of an exemplary linear response of virtual microphone $V_2$ to a speech source at a first distance, according to some embodiments.

FIG. 19 is a plot of an exemplary linear response of virtual microphone $V_2$ to a speech source at a first distance, according to some embodiments. In the example shown, FIG. 19 is a plot of a linear response 1900 of virtual microphone $V_2$ with β=0.8 to a 1 kHz speech source at a distance of 0.1 m, according to some embodiments. The null in the linear response of virtual microphone $V_2$ to speech is located at 0 degrees, where the speech is typically expected to be located. Thus, the null is at 0 degrees, where the speech is normally located.

Figure 20:
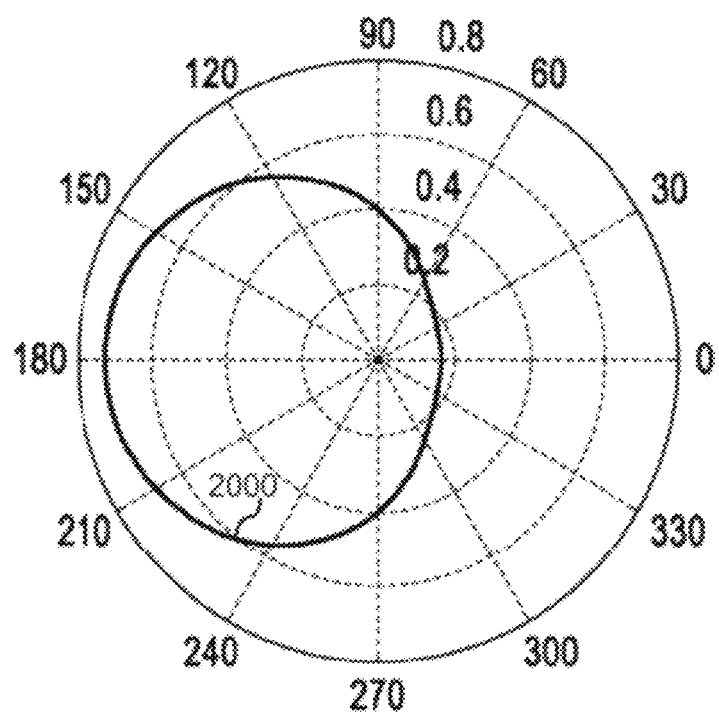
FIG. 20 is a plot of an exemplary linear response of virtual microphone $V_2$ to a noise source at a second distance, according to some embodiments.

FIG. 20 is a plot of an exemplary linear response of virtual microphone $V_2$ to a noise source at a second distance, according to some embodiments. In the example shown, FIG. 20 depicts a plot of a linear response 2000 of virtual microphone $V_2$ with β=0.8 to a 1 kHz noise source at a distance of 1.0 m, according to some embodiments. The linear response of $V_2$ to noise may be devoid of or may include no null. For example, significant or all noise sources may be detected. Thus, there may be no null and most or all noise sources may be detected.

The above formulation for $V_2(z)$ has a null at the speech location and may therefore exhibit minimal response to the speech. This is shown in FIG. 19 for an array with $d_0=10.7$ mm and a speech source on the axis of the array (θ=0) at 10 cm (β=0.8). Note that the speech null at zero degrees is not present for noise in the far field for the same microphone, as shown in FIG. 20 with a noise source distance of approximately 1 meter. This insures that noise in front of the user may be detected so that it can be removed. This differs from conventional systems that can have difficulty removing noise in the direction of the mouth of the user.

The $V_1(z)$ can be formulated using the general form for $V_1(z)$:

$$V_1(z) = \alpha_A O_1(z) \cdot z^{-d_A} - \alpha_B O_2(z) \cdot z^{-d_B}$$

Since $$V_2(z) = O_2(z) - z^{-\gamma} \beta O_1(z)$$

and, since for noise in the forward direction $$O_{2N}(z) = O_{1N}(z) \cdot z^{-\gamma},$$

then $$V_{2N}(z) = O_{1N}(z) \cdot z^{-\gamma} - z^{-\gamma} \beta O_{1N}(z)$$

$$V_{2N}(z) = (1-\beta)(O_{1N}(z) \cdot z^{-\gamma})$$

If this is then set equal to $V_1(z)$ above, the result is $$V_{1N}(z) = \alpha_A O_{1N}(z) \cdot z^{-d_A} - \alpha_B O_{1N}(z) \cdot z^{-\gamma} \cdot z^{-d_B} = (1-\beta)(O_{1N}(z) \cdot z^{-\gamma})$$

thus the following may set $$d_A = \gamma$$

$$d_B = 0$$

$$\alpha_A = 1$$

$$\alpha_B = \beta$$

to get $$V_1(z) = O_1(z) \cdot z^{-\gamma} - \beta O_2(z)$$

The definitions for $V_1$ and $V_2$ above mean that for noise $H_1(z)$ is:

$$H_1(z) = \frac{V_1(z)}{V_2(z)} = \frac{-\beta O_2(z) + O_1(z) \cdot z^{-\gamma}}{O_2(z) - z^{-\gamma}\beta O_1(z)}$$

which, if the amplitude noise responses are about the same, has the form of an allpass filter. Accordingly, the noise can be accurately modeled, especially in magnitude response, satisfying R2. This formulation assures that the noise response may be as similar as possible and that the speech response may be proportional to $(1-\beta^2)$. Since $\beta$ is the ratio of the distances from $O_1$ and $O_2$ to the speech source, it is affected by the size of the array and the distance from the array to the speech source.

Figure 21:
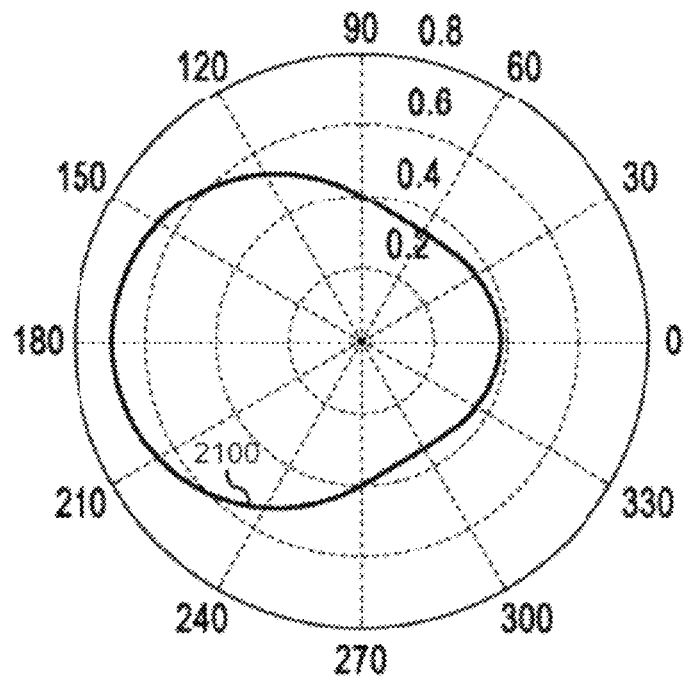
FIG. 21 is a plot of an exemplary linear response of virtual microphone $V_1$ to a speech source at the first distance, according to some embodiments.

FIG. 21 is a plot of an exemplary linear response of virtual microphone $V_1$ to a speech source at the first distance, according to some embodiments. In the example shown, FIG. 21 depicts a plot of a linear response 2100 of virtual microphone $V_1$ with $\beta=0.8$ to a 1 kHz speech source at a distance of 0.1 m, according to some embodiments. The linear response of virtual microphone $V_1$ to speech is devoid of or includes no null and the response for speech is greater than that shown in FIG. 19. In some examples, there is a negligible or no null and the response for speech may be greater than that shown in FIG. 19.

Figure 22:
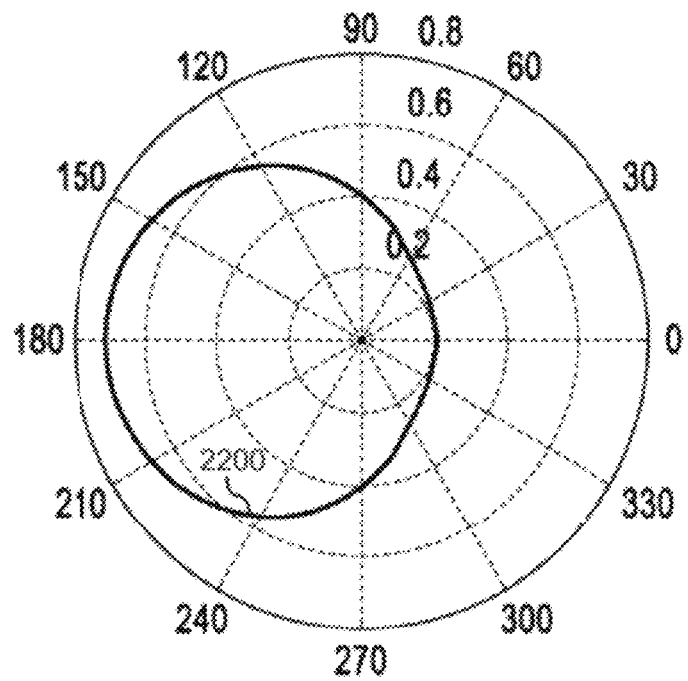
FIG. 22 is a plot of an exemplary linear response of virtual microphone $V_1$ to a noise source at the second distance, according to some embodiments.

FIG. 22 is a plot of an exemplary linear response of virtual microphone $V_1$ to a noise source at the second distance, according to some embodiments. In the example shown, FIG. 22 is a plot of a linear response 2200 of virtual microphone $V_1$ with $\beta=0.8$ to a 1 kHz noise source at a distance of 1.0 m, according to some embodiments. The linear response of virtual microphone $V_1$ to noise is devoid of or includes no null and the response is very similar to $V_2$ shown in FIG. 20. FIG. 22 is a plot of an exemplary linear response of virtual microphone $V_1$ to a 1 kHz noise source at a distance of 1.0 m, according to some embodiments. There is no null and the response is very similar to $V_2$ shown in FIG. 20.

Figure 23:
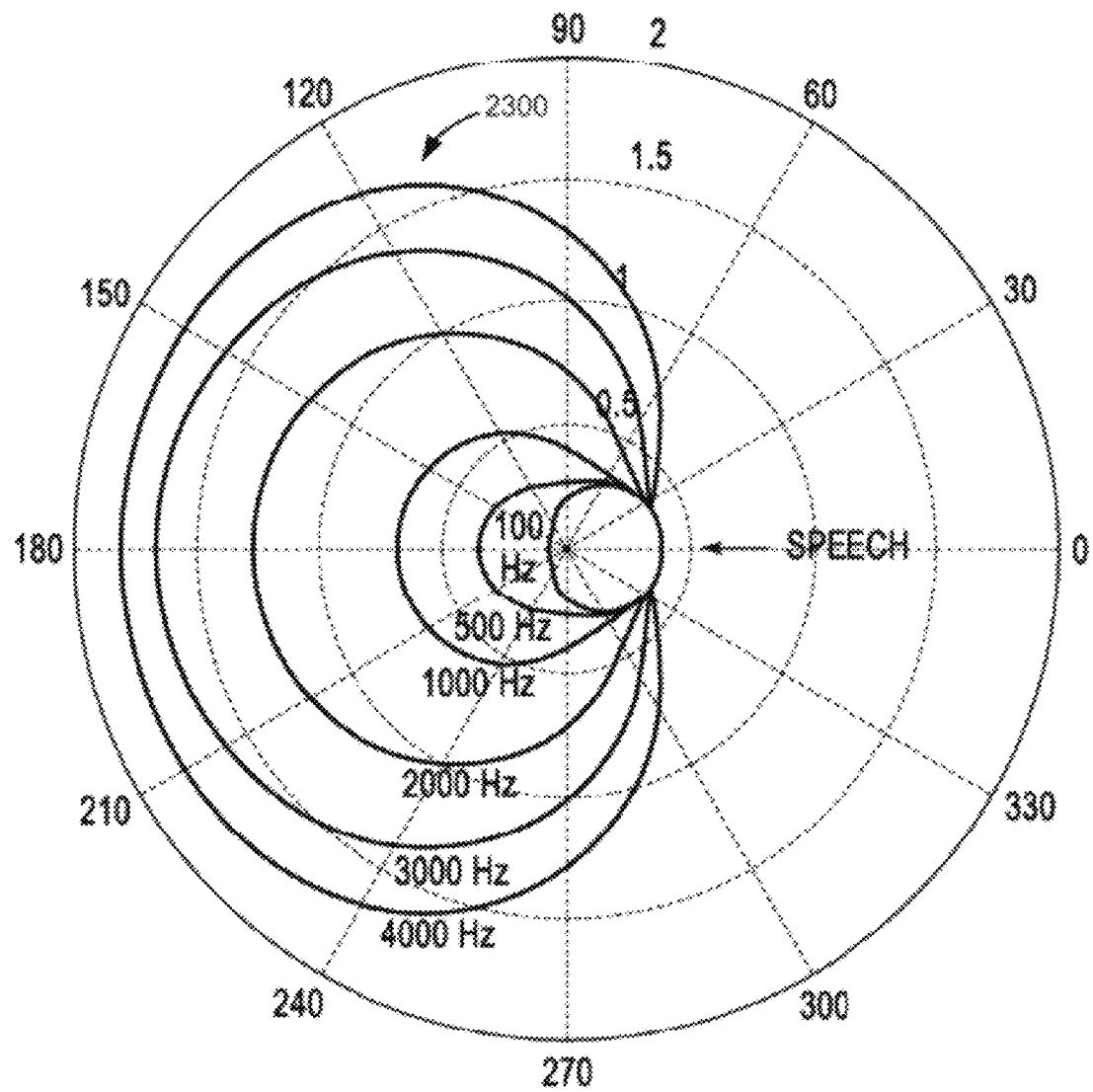
FIG. 23 is a plot of linear response of virtual microphone $V_1$ to a speech source at a distance for exemplary frequencies, according to some embodiments.

FIG. 23 is a plot of linear response of virtual microphone $V_1$ to a speech source at a distance for exemplary frequencies, according to some embodiments. In the example shown, FIG. 23 is a plot of linear responses 2300 of virtual microphone $V_1$ with $\beta=0.8$ to a speech source at a distance of 0.1 m for frequencies of 100, 500, 1000, 2000, 3000, and 4000 Hz, according to some embodiments.

Figure 24:
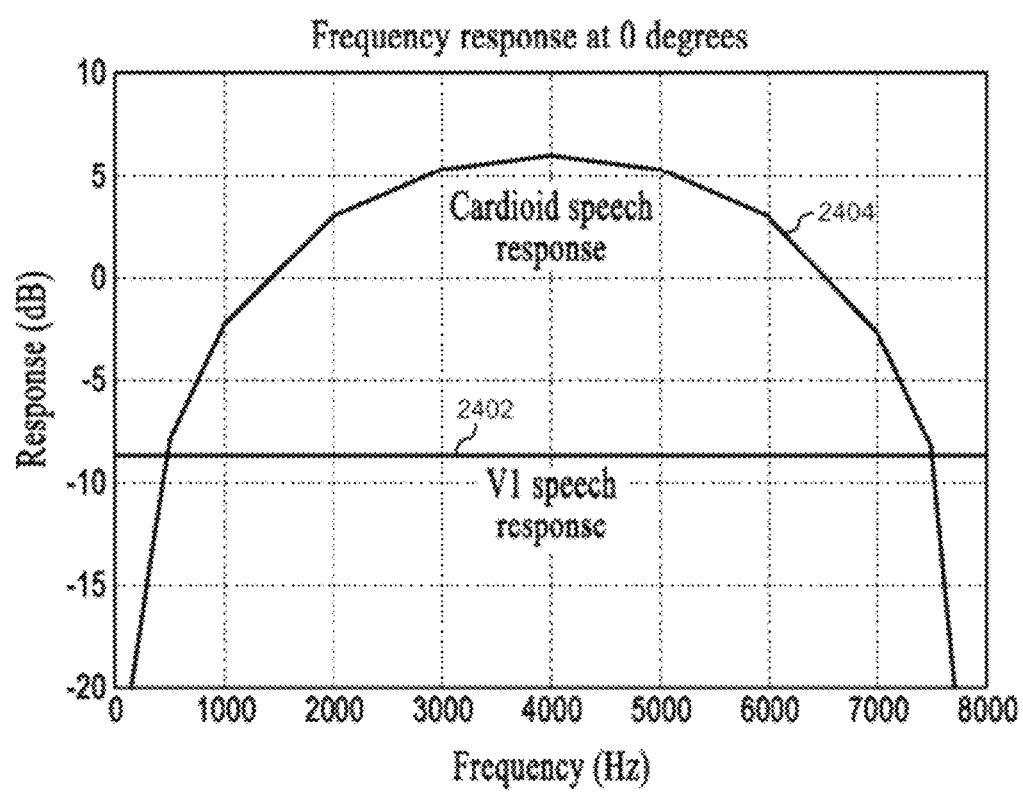
FIG. 24 is a plot showing comparison of frequency responses for speech for the array of an embodiment and for an exemplary cardioid microphone.

FIG. 24 is a plot showing comparison of a frequency response 2402 for speech for the array of an embodiment and of a frequency response 2404 for an exemplary cardioid microphone.

The response of $V_1$ to speech is shown in FIG. 21, and the response to noise in FIG. 22. Note the difference in speech response compared to $V_2$ shown in FIG. 19 and the similarity of noise response shown in FIG. 20. Also note that the orientation of the speech response for $V_1$ shown in FIG. 21 is completely opposite the orientation of conventional systems, where the main lobe of response is normally oriented toward the speech source. The orientation of an embodiment, in which the main lobe of the speech response of $V_1$ is oriented away from the speech source, means that the speech sensitivity of $V_1$ is lower than a normal directional microphone but is flat for all frequencies within approximately +−30 degrees of the axis of the array, as shown in FIG. 23. A flatness of response for speech means that, for example, no shaping postfilter may be needed to restore omnidirectional frequency response. This does come at a price—as shown in FIG. 24, which shows the speech response of $V_1$ with $\beta=0.8$ and the speech response of a cardioid microphone. The speech response of $V_1$ is approximately 0 to ~13 dB less than a normal directional microphone between approximately 500 and 7500 Hz and approximately 0 to 10+dB greater than a directional microphone below approximately 500 Hz and above 7500 Hz for a sampling frequency of approximately 16000 Hz. However, the superior noise suppression made possible using this system more than compensates for the initially poorer SNR.

It should be noted that FIGS. 19-22 assume the speech is located at approximately 0 degrees and approximately 10 cm, $\beta=0.8$, and the noise at all angles is located approximately 1.0 meter away from the midpoint of the array. Generally, the noise distance is not required to be 1 m or more, but the denoising is the best for those distances. For distances less than approximately 1 m, denoising may not be as effective due to the greater dissimilarity in the noise responses of $V_1$ and $V_2$. This has not proven to be an impediment in practical use—in fact, it can be seen as a feature. Any "noise" source that is ~10 cm away from the earpiece may be likely to be desired to be captured and transmitted, at least in some embodiments.

The speech null of $V_2$ means that the VAD signal is no longer a critical component. The VAD's purpose was to ensure that the system would not train on speech and then subsequently remove it, resulting in speech distortion. If, however, $V_2$ contains no speech, the adaptive system cannot train on the speech and cannot remove it. As a result, the system can denoise all the time without fear of devoicing, and the resulting clean audio can then be used to generate a VAD signal for use in subsequent single-channel noise suppression algorithms such as spectral subtraction. In addition, constraints on the absolute value of $H_1(z)$ (i.e., restricting it to absolute values less than two) can keep the system from fully training on speech even if it is detected. In reality, though, speech can be present due to a mis-located $V_2$ null and/or echoes or other phenomena, and a VAD sensor or other acoustic-related VAD is recommended to minimize speech distortion.

Depending on the application, $\beta$ and $\gamma$ may be fixed in the noise suppression algorithm or they can be estimated when the algorithm indicates that speech production is taking place in the presence of little or no noise. In either case, there may be an error in the estimate of the actual $\beta$ and $\gamma$ of the system. The following description examines these errors and their effect on the performance of the system. As above, "good performance" of the system indicates that there is sufficient denoising and minimal devoicing.

The effect of an incorrect $\gamma$ and $\gamma$ on the response of $V_1$ and $V_2$ can be seen by examining the definitions above:

$$V_1(z) = O_1(z) \cdot z^{-\gamma_T} - \beta_T O_2(z)$$

$$V_2(z) = O_2(z) \cdot z^{-\gamma_T} - \beta_T O_1(z)$$

where $\beta_T$ and $\gamma_T$ denote the theoretical estimates of $\beta$ and $\gamma$ used in the noise suppression algorithm. In reality, the speech response of $O_2$ is $$O_{2S}(z) = \beta_R O_{1S}(z) \cdot z^{-\gamma R}$$

where $\beta_R$ and $Y_R$ denote the real $\beta$ and $\gamma$ of the physical system. The differences between the theoretical and actual values of $\beta$ and $\gamma$ can be due to mis-location of a speech source (e.g., the speech source may not be where it is assumed to be) and/or a change in air temperature (which changes the speed of sound). Inserting the actual response of $O_2$ for speech into the above equations for $V_1$ and $V_2$ yields $$V_{1S}(z) = O_{1S}(z)[z^{-\gamma T} - \beta_T \beta_R z^{-\gamma R}]$$

$$V_{2S}(z) = O_{1S}(z)[\beta_R z^{-\gamma R} - \beta_T z^{-\gamma T}]$$

If the difference in phase is represented by $$\gamma_R = \gamma_T + \gamma_D$$

And the difference in amplitude as $$\beta_R = B\beta_T$$

then $$V_{1S}(z) = O_{1S}(z)z^{-\gamma T}[1 - B\beta_T^2 z^{-\gamma D}]$$

$$V_{2S}(z) = \beta_T O_{1S}(z)z^{-\gamma T}[Bz^{-\gamma D} - 1]. \qquad \text{Eq. 5}$$

The speech cancellation in $V_2$ (which directly affects the degree of devoicing) and the speech response of $V_1$ may be dependent on both B and D. An examination of the case where D=0 follows.

Figure 25:
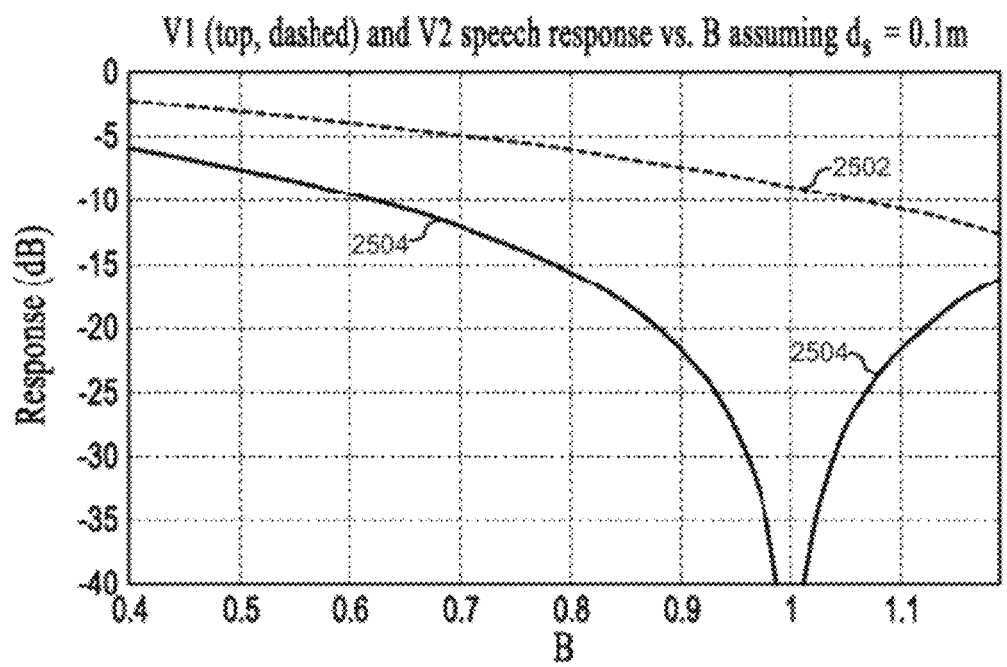
FIG. 25 is a plot showing exemplary speech responses for $V_1$ and $V_2$ versus B with $d_s$, according to some embodiments.

FIG. 25 is a plot showing exemplary speech responses for $V_1$ and $V_2$ versus B with $d_s$, according to some embodiments. In this example, FIG. 25 is a plot showing speech response 2502 for $V_1$ (top, dashed) and speech response 2504 $V_2$ (bottom, solid) versus B with $d_s$, assumed to be 0.1 m, according to some embodiments. In this example, this plot shows the spatial null in $V_2$ to be relatively broad.

Figure 26:
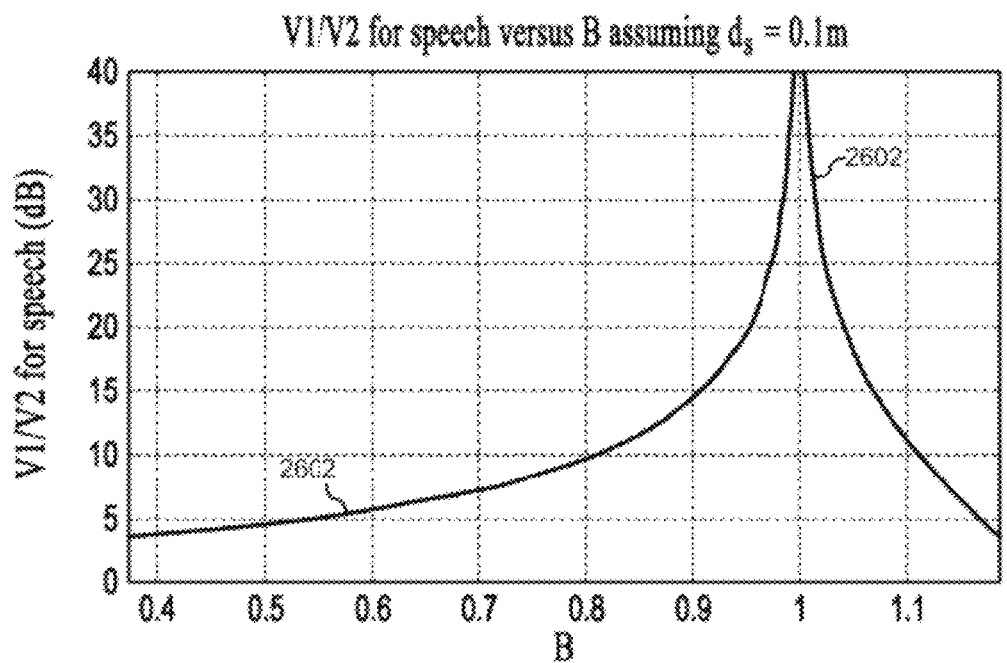
FIG. 26 is a plot showing an exemplary ratio of $V_1V_2$ speech responses versus B, according to some embodiments.

FIG. 26 is a plot showing an exemplary ratio of $V_1/V_2$ speech responses versus B, according to some embodiments. In the example shown, FIG. 26 is a plot showing a ratio 2602 of $V_1/V_2$ speech responses shown in FIG. 20 versus B, according to some embodiments. The ratio of $V_1/V_2$ may be above 10 dB for all 0.8<B<1.1, and this means that the physical $\beta$ of the system need not be exactly modeled for good performance.

Figure 27:
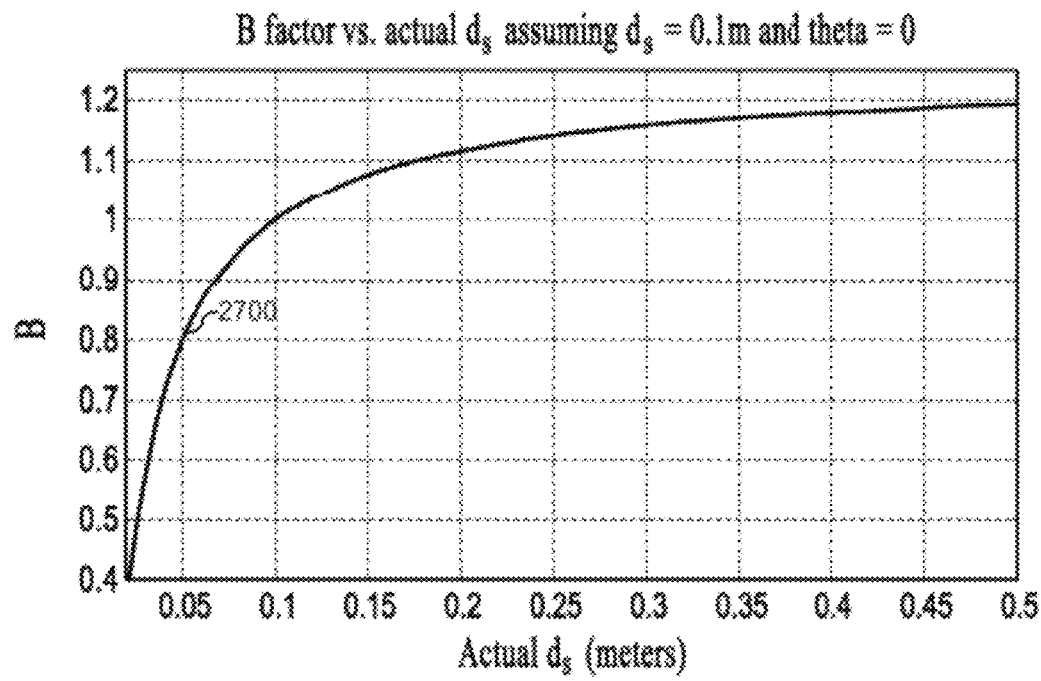
FIG. 27 is a plot of exemplary values of B versus exemplary values of distance of a speech source, $d_s$, according to some embodiments.

FIG. 27 is a plot of exemplary values of B versus exemplary values of distance of a speech source, $d_s$, according to some embodiments. In the example shown, the plot depicts a relationship 2700 between B and actual $d_s$ assuming that $d_s$=10 cm and theta=0, according to some embodiments.

Figure 28:
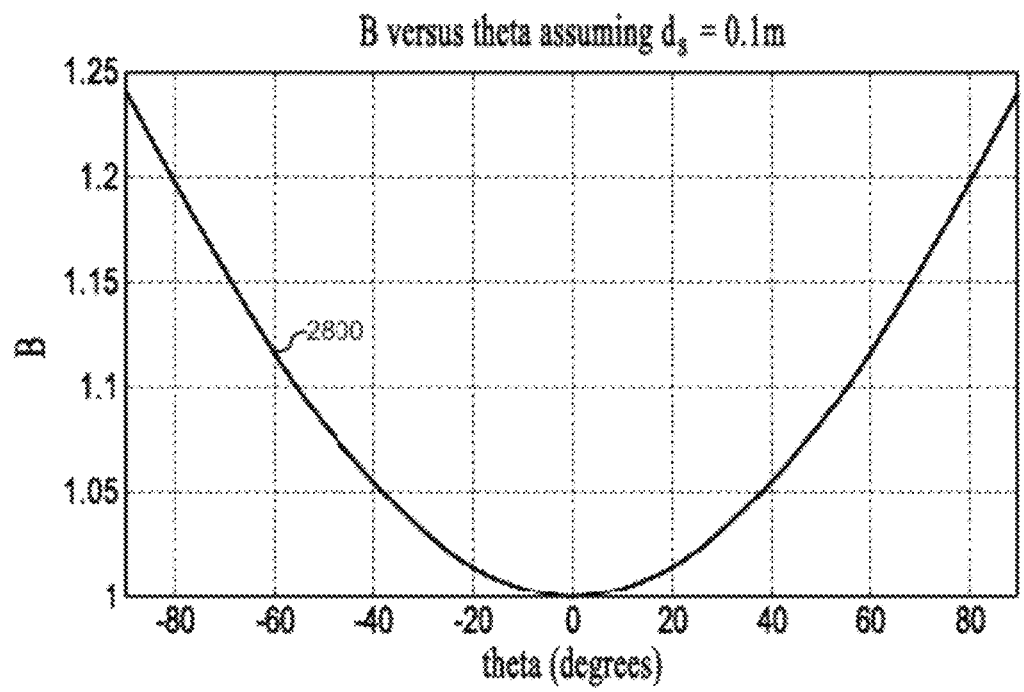
FIG. 28 is a plot of exemplary values of B versus exemplary values of theta, according to some embodiments.

FIG. 28 is a plot of exemplary values of B versus exemplary values of theta, according to some embodiments. In the example shown, the plot depicts a relationship 2800 between B and theta with $d_s$=10 cm, according to some embodiments.

In FIG. 25, the speech response for $V_1$ (upper, dashed) and $V_2$ (lower, solid) compared to $O_1$ is shown versus B when $d_s$ is thought to be approximately 10 cm and $\theta$=0. When B=1, the speech is absent from $V_2$. In FIG. 26, the ratio of the speech responses in FIG. 20 is shown. When 0.8<B<1.1, the $V_1/V_2$ ratio is above approximately 10 dB—enough for good performance. Clearly, if D=0, B can vary significantly without adversely affecting the performance of the system. Again, this assumes that calibration of the microphones so that, for example, the amplitude(s) and phase response(s) are the same for an identical source.

The B factor can be non-unity for a variety of reasons. Either the distance to the speech source or the relative orientation of the array axis and the speech source or both can be different than expected. If both distance and angle mismatches are included for B, then $$B = \frac{\beta_R}{\beta_T} \frac{\sqrt{d_{SR}^2 - 2d_{SR}d_0\cos(\theta_R) + d_0^2}}{\sqrt{d_{SR}^2 + 2d_{SR}d_0\cos(\theta_R) + d_0^2}} \cdot \frac{\sqrt{d_{ST}^2 + 2d_{ST}d_0\cos(\theta_T) + d_0^2}}{\sqrt{d_{ST}^2 - 2d_{ST}d_0\cos(\theta_T) + d_0^2}}$$

where again the T subscripts indicate the theorized values and R the actual values. In FIG. 27, the factor B is plotted with respect to the actual $d_s$ with the assumption that $d_s$=10 cm and $\theta$=0. So, if the speech source in on-axis of the array, the actual distance can vary from approximately 5 cm to 18 cm without significantly affecting performance—a significant amount. Similarly, FIG. 28 shows what happens if the speech source is located at a distance of approximately 10 cm but not on the axis of the array. In this case, the angle can vary up to approximately +−55 degrees and still result in a B less than 1.1, assuring good performance. This is a significant amount of allowable angular deviation. If there is both angular and distance errors, the equation above may be used to determine if the deviations may result in adequate performance. Of course, if the value for $\beta_T$ is allowed to update during speech, essentially tracking the speech source, then B can be kept near unity for almost all configurations.

An examination follows of the case where B is unity but D is nonzero. This can happen if the speech source is not where it is thought to be or if the speed of sound is different from what it is believed to be. From Equation 5 above, a factor that reduces the speech null in $V_2$ for speech is expressed as:

$$N(z) = Bz^{-\gamma D} - 1$$

or in the continuous s domain as:

$$N(s) = Be^{-Ds} - 1.$$

Since $\gamma$ is the time difference between arrival of speech at $V_1$ compared to $V_2$, it can be errors in estimation of the angular location of the speech source with respect to the axis of the array and/or by temperature changes. Examining the temperature sensitivity, the speed of sound varies with temperature as $$c = 331.3 + (0.606T) \text{ m/s}$$

where T is degrees Celsius. As the temperature decreases, the speed of sound also decreases. Setting 20° C. as a design temperature and a maximum expected temperature range to −40° C. to +60° C. (−40° F. to 140° F.). The design speed of sound at 20° C. is 343 m/s and the slowest speed of sound may be 307 m/s at −40° C. with the fastest speed of sound 362 m/s at 60° C. Set the array length ($2d_0$) to be 21 mm. For speech sources on the axis of the array, the difference in travel time for the largest change in the speed of sound is $$\nabla t_{MAX} = \frac{d}{c_1} - \frac{d}{c_2} = 0.021 \text{ m}\left(\frac{1}{343 \text{ m/s}} - \frac{1}{307 \text{ m/s}}\right) = -7.2 \times 10^{-6} \text{ sec}$$

or approximately 7 microseconds. The response for N(s) given B=1 and D=7.2 μsec is shown in FIG. 29.

Figure 29:
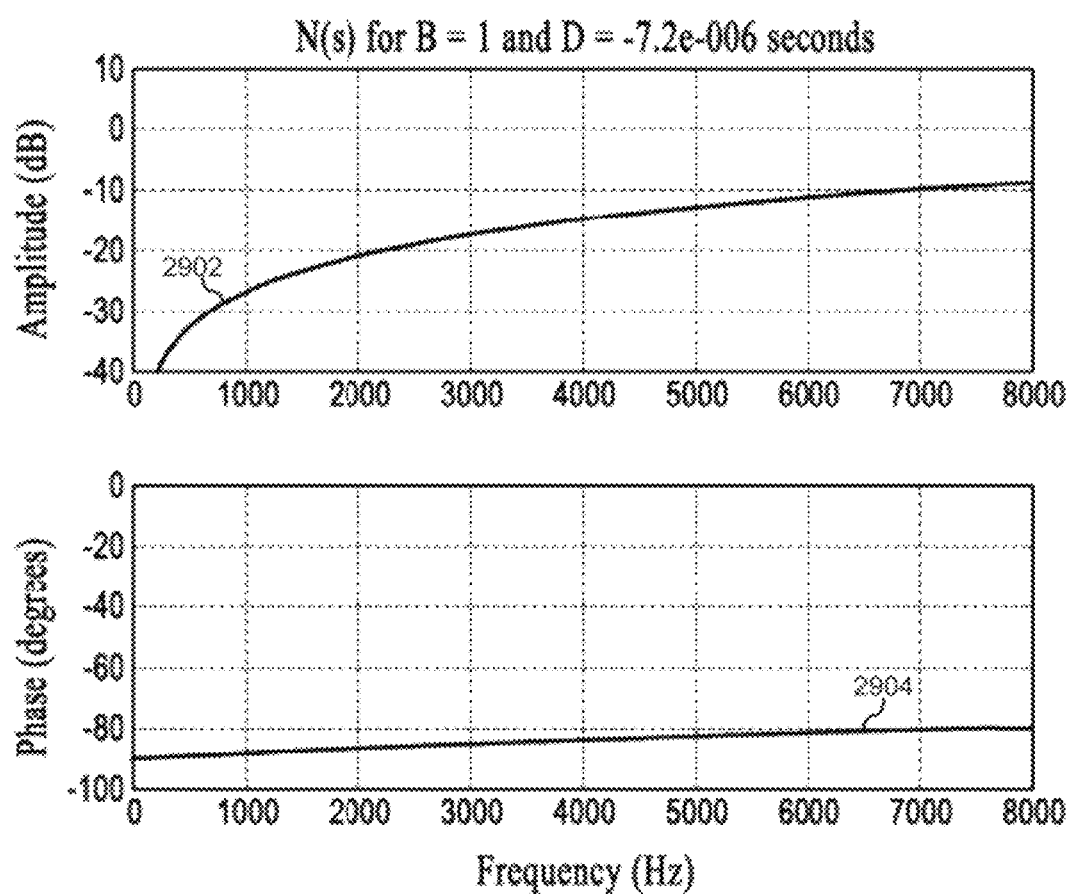
FIG. 29 is a diagram of plots of exemplary amplitudes and exemplary phase responses of N(s), according to some embodiments.
Figure 30:
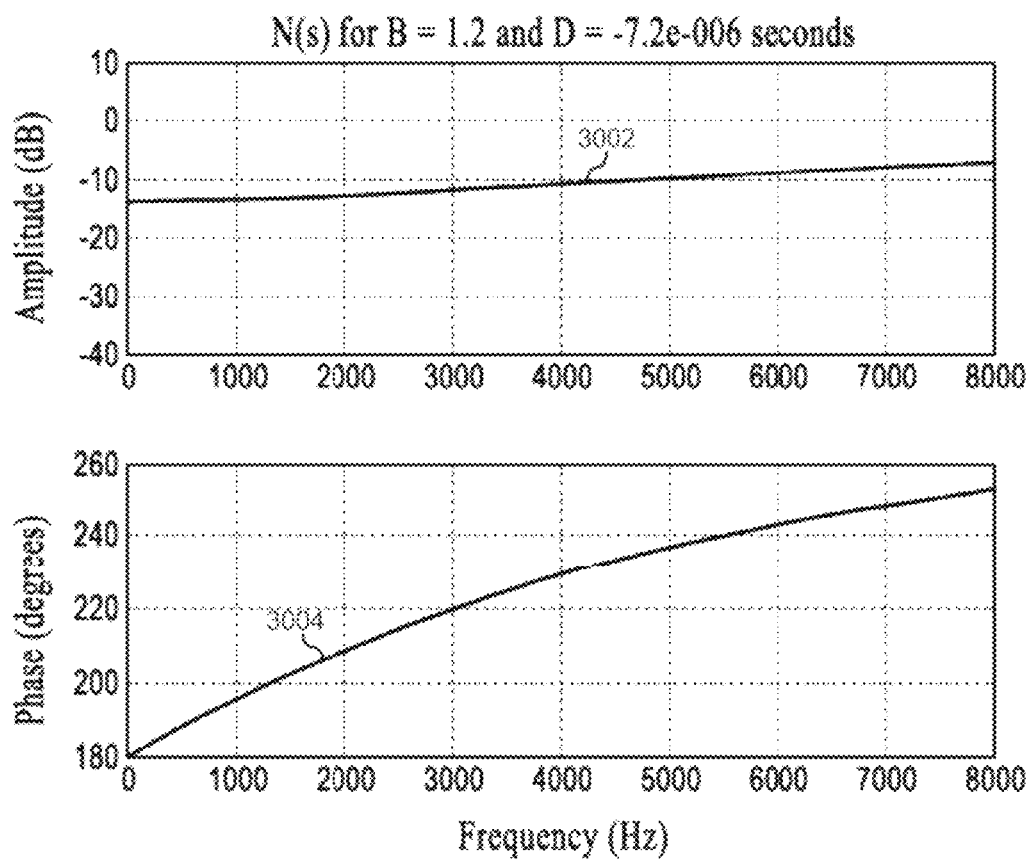
FIG. 30 is a diagram of plots of exemplary amplitudes and exemplary phase responses of N(s) with non-unity B), according to some embodiments.

FIG. 29 is a diagram of plots of exemplary amplitudes and exemplary phase responses of N(s), according to some embodiments. In the example shown, plots of amplitude 2902 (top) and phase 2904 (bottom) response of N(s) with B=1 and D=−7.2 μsec, according to some embodiments. The resulting phase difference may affect some high frequencies more than some low frequencies. The amplitude response is less than approximately −10 dB for all frequencies less than 7 kHz and may be about −9 dB at 8 kHz. Therefore, assuming B=1, this system would likely perform well at frequencies up to approximately 8 kHz. This means that a properly compensated system would work well even up to 8 kHz in an exceptionally wide (e.g., −40 C to 80 C) temperature range. Note that the phase mismatch due to the delay estimation error causes N(s) to be much larger at high frequencies compared to low. If B is not unity, the robustness of the system may be reduced since the effect from non-unity B is cumulative with that of non-zero D. FIG. 30 shows the amplitude 3002 and phase response 3004 for B=1.2 and D=7.2 μsec.

FIG. 30 is a diagram of plots of exemplary amplitudes and exemplary phase responses of N(s) with non-unity B), according to some embodiments. In the example shown, the plots amplitude (top) and phase (bottom) response of N(s) with B=1.2 and D=−7.2 μsec, according to some embodiments. Non-unity B may affect some or the entire frequency range. Now N(s) is below approximately −10 dB for frequencies less than approximately 5 kHz and the response at low frequencies is larger. Such a system would still perform well below 5 kHz and may suffer from slightly elevated devoicing for frequencies above 5 kHz. For ultimate performance, a temperature sensor may be integrated into the system to allow the algorithm to adjust $\gamma_T$ as the temperature varies.

Another way in which D can be non-zero is when the speech source is not where it is believed to be—specifically, the angle from the axis of the array to the speech source is incorrect. The distance to the source may be incorrect as well, but that introduces an error in B, not D.

Referring to FIG. 12, it can be seen that for two speech sources (each with their own $d_s$ and θ) that the time difference between the arrival of the speech at $O_1$ and the arrival at $O_2$ is $$\Delta t = \frac{1}{c}(d_{12} - d_{11} - d_{22} + d_{21})$$

where $$d_{11} = \sqrt{d_{S1}^2 - 2d_{S1}d_0\cos(\theta_1) + d_0^2}$$
$$d_{12} = \sqrt{d_{S1}^2 + 2d_{S1}d_0\cos(\theta_1) + d_0^2}$$
$$d_{21} = \sqrt{d_{S2}^2 - 2d_{S2}d_0\cos(\theta_2) + d_0^2}$$
$$d_{22} = \sqrt{d_{S2}^2 + 2d_{S2}d_0\cos(\theta_2) + d_0^2}$$

Figure 31:
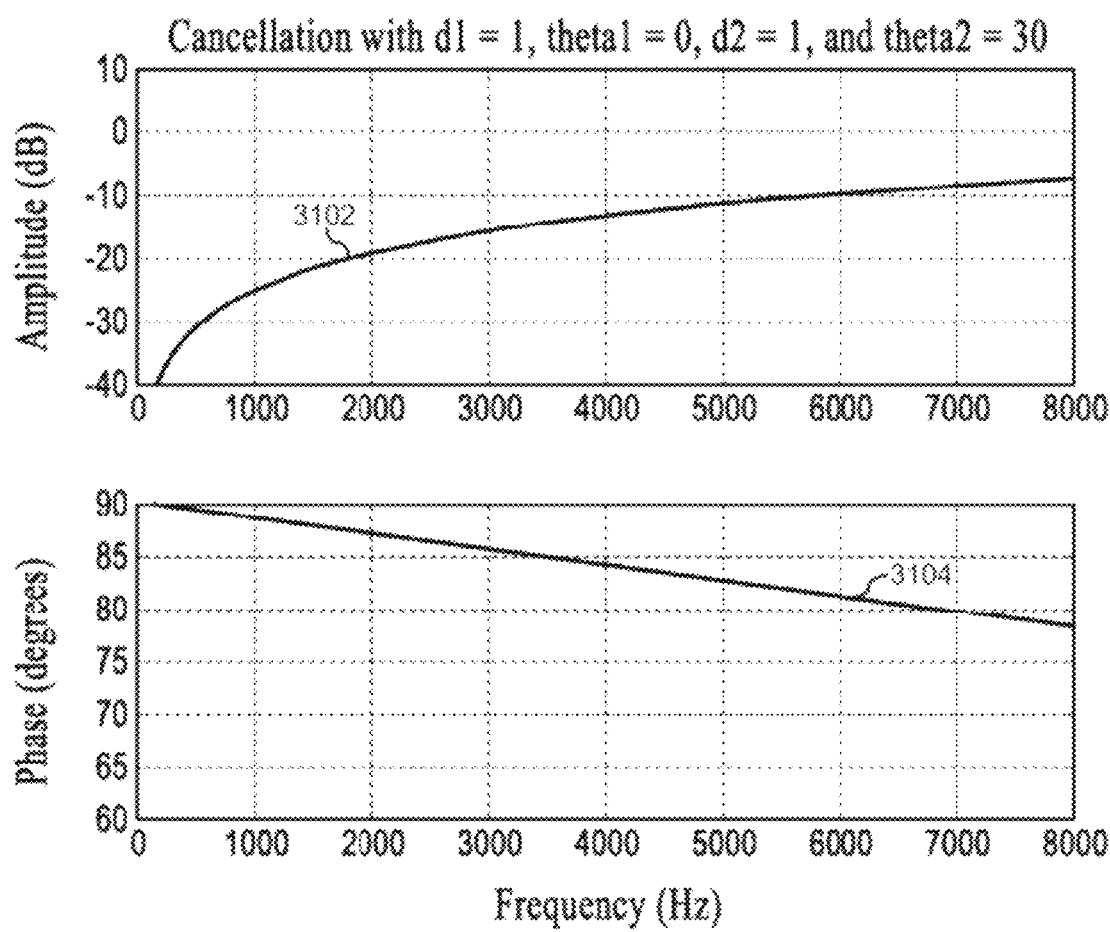
FIG. 31 is a diagram of plots of exemplary amplitudes and exemplary phase responses of the effect on the speech cancellation in $V_2$, according to some embodiments.

The $V_2$ speech cancellation response for $\theta_1$=0 degrees and $\theta_2$=30 degrees and assuming that B=1 is shown in FIG. 31.

FIG. 31 is a diagram of plots of exemplary amplitudes and exemplary phase responses of the effect on the speech cancellation in $V_2$, according to some embodiments. In the example shown, the plots of amplitude 3102 (top) and phase (bottom) response 3104 of the effect on the speech cancellation in $V_2$ may be due to a mistake in the location of the speech source with q1=0 degrees and q2=30 degrees, according to some embodiments. Note that the cancellation may be below −10 dB for frequencies below 6 kHz. The cancellation is still below approximately −10 dB for frequencies below approximately 6 kHz, so an error of this type may not significantly affect the performance of the system. However, if $\theta_2$ is increased to approximately 45 degrees, as shown in FIG. 32, the cancellation is below approximately −10 dB for frequencies below approximately 2.8 kHz.

Figure 32:
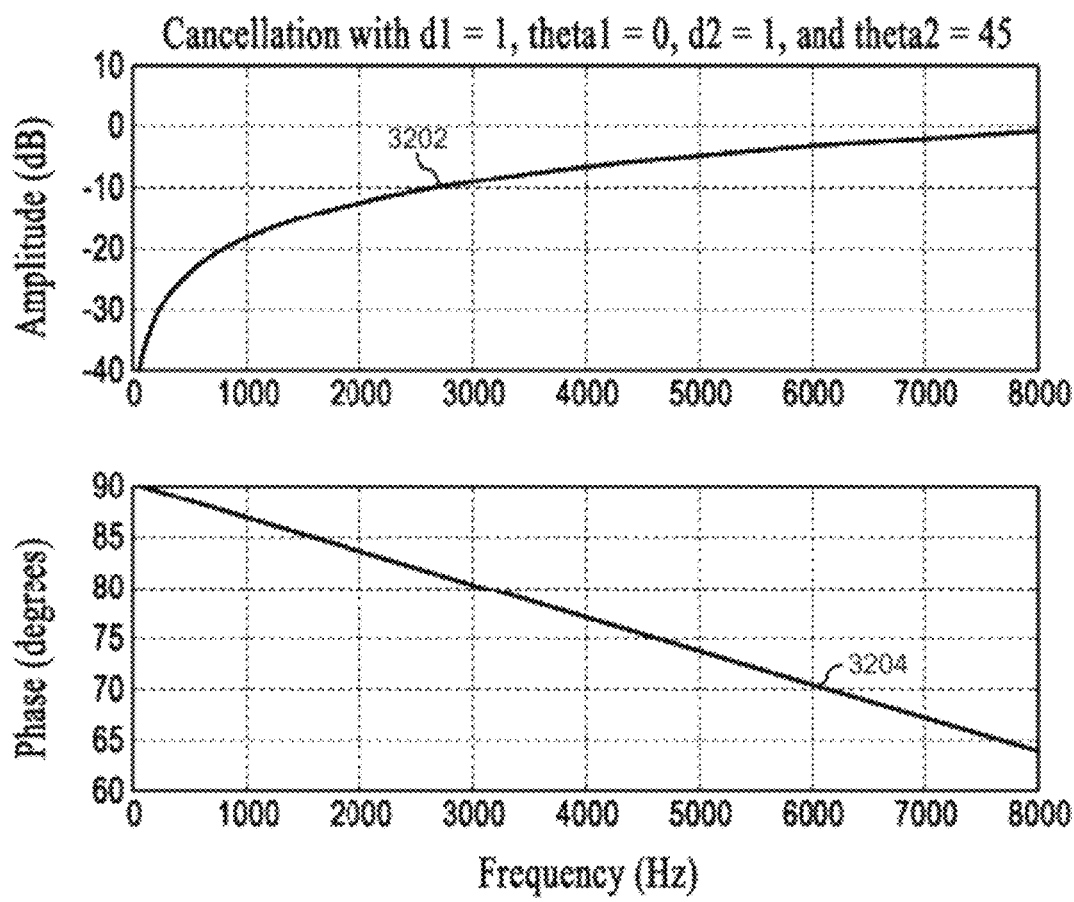
FIG. 32 is a diagram of plots of other exemplary amplitudes and exemplary phase responses of the effect on the speech cancellation in $V_2$, according to some embodiments.

FIG. 32 is a diagram of plots of other exemplary amplitudes and exemplary phase responses of the effect on the speech cancellation in $V_2$, according to some embodiments. In the example shown, the plots of amplitude 3202 (top) and phase (bottom) response 3204 represent exemplary effects on the speech cancellation in $V_2$ due to a mistake in the location of the speech source with q1=0 degrees and q2=45 degrees, according to some embodiments. The cancellation may be below −10 dB for frequencies below about 2.8 kHz and a reduction in performance is expected. Less desirable speech cancellation above approximately 4 kHz may result in significant devoicing for those frequencies.

The description above has assumed that the microphones $O_1$ and $O_2$ were calibrated so that their response to a source located the same distance away was identical for both amplitude and phase. This is not always feasible, so a more practical calibration procedure is presented below. It is not as accurate, but is much simpler to implement. Begin by defining a filter α(z) such that:

$$O_{1C}(z) = \alpha(z)O_{2C}(z)$$

where the "C" subscript indicates the use of a known calibration source. The simplest one to use is the speech of the user. Then $$O_{1S}(z) = \alpha(z)O_{2C}(z)$$

The microphone definitions may be expressed as follows:

$$V_1(z) = O_1(z) \cdot z^{-\gamma} - \beta(z)\alpha(z)O_2(z)$$

$$V_2(z) = \alpha(z)O_2(z) - z^{-\gamma}\beta(z)O_1(z)$$

The β of the system should be fixed and as close to the real value as possible. In practice, the system is not sensitive to changes in β and errors of approximately +−5% are easily tolerated. During times when the user is producing speech but there is little or no noise, the system can train α(z) to remove as much speech as possible. This is accomplished by:

1. Construct an adaptive system as shown in FIG. 11 with $\beta O_{1S}(z)z^{-\gamma}$ in the "MIC1" position, $O_{2S}(z)$ in the "MIC2" position, and α(z) in the $H_1(z)$ position.
2. During speech, adapt α(z) to minimize the residual of the system.
3. Construct $V_1(z)$ and $V_2(z)$ as above.

A simple adaptive filter can be used for α(z) so that the relationship between the microphones is well modeled. The system of an embodiment trains when speech may be produced by the user. A sensor, such as the SSM, can be used to determine when speech is being produced in the absence of noise. If the speech source is fixed in position and may not vary significantly during use (such as when the array is on an earpiece), the adaptation should be infrequent and slow to update in order to minimize any errors introduced by noise present during training.

The above formulation works very well because the noise (far-field) responses of $V_1$ and $V_2$ are very similar while the speech (near-field) responses are very different. However, the formulations for $V_1$ and $V_2$ can be varied and still result in good performance of the system as a whole. If the definitions for $V_1$ and $V_2$ are taken from above and new variables B1 and B2 are inserted, the result is:

$$V_1(z) = O_1(z) \cdot z^{-\gamma T} - B_1 \beta_T O_2(z)$$

$$V_2(z) = O_2(z) - z^{-\gamma T} B_2 \beta_T O_1(z)$$

where B1 and B2 are both positive numbers or zero. If B1 and B2 are set equal to unity, the optimal system results as described above. If B1 is allowed to vary from unity, the response of $V_1$ is affected. An examination of the case where B2 is left at 1 and B1 is decreased follows. As B1 drops to approximately zero, $V_1$ becomes less and less directional, until it becomes a simple omnidirectional microphone when B1=0. Since B2=1, a speech null remains in $V_2$, so very different speech responses remain for $V_1$ and $V_2$. However, the noise responses are much less similar, so denoising may not be as effective. Practically, though, the system still performs well. B1 can also be increased from unity and once again the system may still denoise well, just not as well as with B1=1.

If B2 is allowed to vary, the speech null in $V_2$ is affected. As long as the speech null is still sufficiently deep, the system may still perform well. Practically values down to approximately B2=0.6 have shown sufficient performance, but it is recommended to set B2 close to unity for optimal performance.

Similarly, variables $\in$ and $\Delta$ may be introduced so that:

$$V_1(z) = (\in - \beta) O_{2N}(z) + (1 + \Delta) O_{1N}(z) z^{-\gamma}$$

$$V_2(z) = (1 + \Delta) O_{2N}(z) + (\in - \beta) O_{1N}(z) z^{-\gamma}$$

This formulation also allows the virtual microphone responses to be varied but retains the all-pass characteristic of $H_1(z)$. In conclusion, the system is flexible enough to operate well at a variety of B1 values, but note that, at least in some examples, B2 values may be selected to be close to unity to limit devoicing for enhanced performance.

Figure 33:
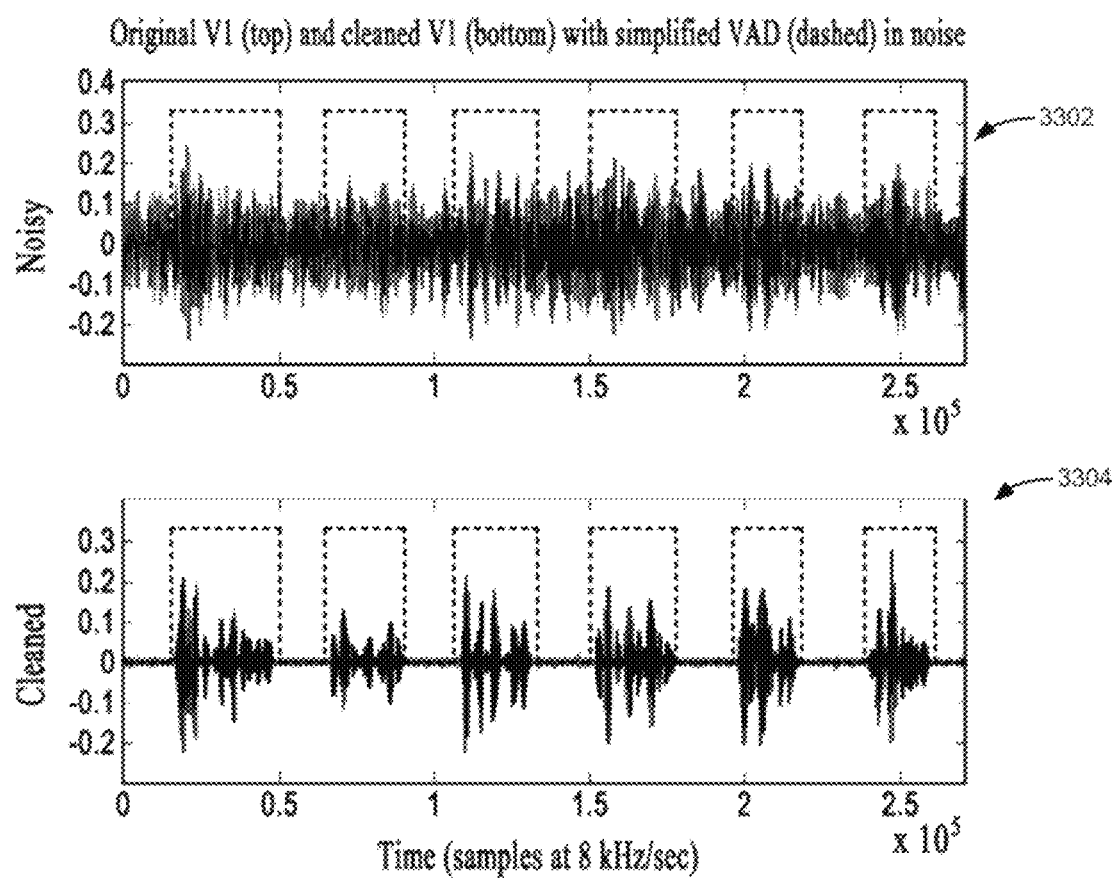
FIG. 33 shows experimental results for an exemplary array using a simulator in a loud noise environment, according to some embodiments.

FIG. 33 shows experimental results for an exemplary array using a simulator in a loud noise environment, according to some embodiments. In the example shown, experimental results are depicted for a $2d_0=19$ mm array using a linear $\beta$ of 0.83 on a Bruel and Kjaer Head and Torso Simulator (HATS) in very loud (~85 dBA) music/speech noise environment, according to some embodiments. The noise may be reduced by about 25 dB and the speech may be negligibly or unaffected, with minimal or no noticeable distortion. An alternate microphone calibration technique discussed above may be used to calibrate the microphones. The noise in diagram 3302 may be reduced by about 25 dB and the speech hardly affected, with no noticeable distortion as depicted in diagram 3304. In various examples, the technique significantly increases the SNR of the original speech, thereby outperforming at least some conventional noise suppression techniques.

The DOMA can be a component of a single system, multiple systems, and/or geographically separate systems. The DOMA can also be a subcomponent or subsystem of a single system, multiple systems, and/or geographically separate systems. The DOMA can be coupled to one or more other components (not shown) of a host system or a system coupled to the host system.

One or more components of the DOMA and/or a corresponding system or application to which the DOMA is coupled or connected includes and/or runs under and/or in association with a processing system. The processing system includes any collection of processor-based devices or computing devices operating together, or components of processing systems or devices, as is known in the art. For example, the processing system can include one or more of a portable computer, portable communication device operating in a communication network, and/or a network server. The portable computer can be any of a number and/or combination of devices selected from among personal computers, cellular telephones, personal digital assistants, portable computing devices, and portable communication devices, but is not so limited. The processing system can include components within a larger computer system.

Acoustic Voice Activity Detection (AVAD) methods and systems are described herein. The AVAD methods and systems, which include algorithms or programs, use microphones to generate virtual directional microphones that have very similar noise responses and very dissimilar speech responses. The ratio of the energies of the virtual microphones is then calculated over a given window size and the ratio can then be used with a variety of methods to generate a VAD signal. The virtual microphones can be constructed using either a fixed or an adaptive filter. The adaptive filter generally results in a more accurate and noise-robust VAD signal but may involve training. In addition, restrictions can be placed on the filter to ensure that it is training on speech and not on environmental noise.

In the following description, numerous specific details are introduced to provide a thorough understanding of, and enabling description for, embodiments. One skilled in the relevant art, however, may recognize that these embodiments can be practiced without one or more of the specific details, or with other components, systems, etc. In other instances, well-known structures or operations are not shown, or are not described in detail, to avoid obscuring aspects of the disclosed embodiments.

Figure 34:
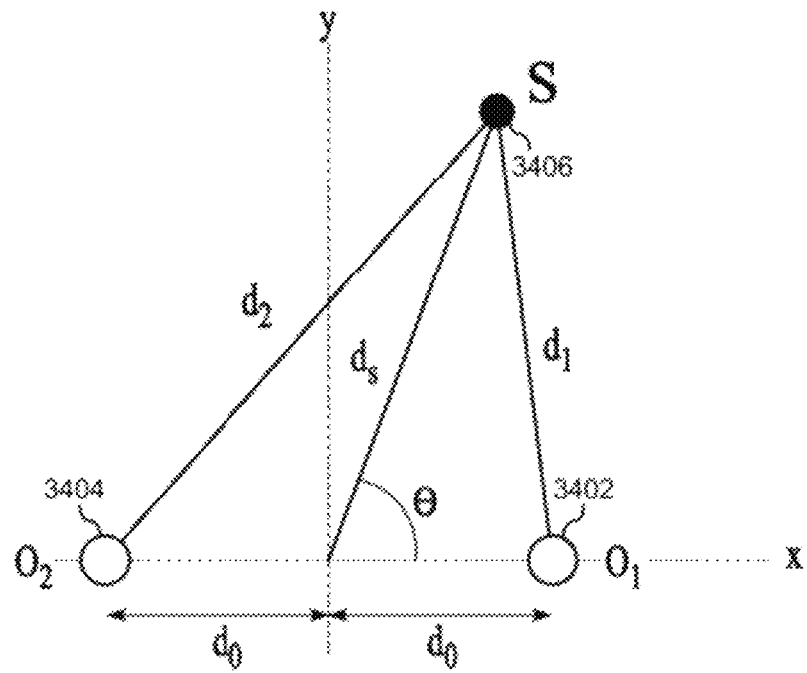
FIG. 34 is an exemplary configuration of a two-microphone array with speech source S, according to some embodiments.

FIG. 34 is an exemplary configuration of a two-microphone array of the AVAD with speech source S 3406; according to some embodiments. The AVAD of an embodiment uses two physical microphones 3402 ("$O_1$") and 3404 ("$O_2$") to form two virtual microphones ($V_1$ and $V_2$). The virtual microphones of an embodiment are directional microphones, but the embodiment is not so limited. The physical microphones of an embodiment include omnidirectional microphones, but the embodiments described herein are not limited to omnidirectional microphones. The virtual microphone (VM) $V_2$ is configured in such a way that it has minimal response to the speech of the user, while $V_1$ is configured so that it does respond to the user's speech but has a very similar noise magnitude response to $V_2$, as described in detail herein. The PSAD VAD methods can then be used to determine when speech is taking place. A further refinement is the use of an adaptive filter to further minimize the speech response of $V_2$, thereby increasing the speech energy ratio used in PSAD and resulting in better overall performance of the AVAD.

The PSAD algorithm as described herein calculates the ratio of the energies of two directional microphones $M_1$ and $M_2$:

$$R = \sum_i \sqrt{\frac{M_1(z_i)^2}{M_2(z_i)^2}}$$

where the "z" indicates the discrete frequency domain and "i" ranges from the beginning of the window of interest to the end, but the same relationship holds in the time domain. The summation can occur over a window of any length; 200 samples at a sampling rate of 8 kHz has been used to good effect. Microphone $M_1$ is assumed to have a greater speech response than microphone $M_2$. The ratio R depends on the relative strength of the acoustic signal of interest as detected by the microphones.

For matched omnidirectional microphones (i.e. they have the same response to acoustic signals for all spatial orientations and frequencies), the size of R can be calculated for speech and noise by approximating the propagation of speech and noise waves as spherically symmetric sources. For these the energy of the propagating wave decreases as $1/r^2$:

$$R = \sum_i \sqrt{\frac{M_1(z_i)^2}{M_2(z_i)^2}} = \frac{d_2}{d_1} = \frac{d_1 + d}{d_1}$$

The distance $d_1$ is the distance from the acoustic source to $M_1$, $d_2$ is the distance from the acoustic source to $M_2$, and $d=d_2-d_1$ (see FIG. 34). It is assumed that microphone ("$O_1$") 3402 is closer to the speech source (the user's mouth) so that d is always positive. If the microphones and the user's mouth are all on a line, then $d=2d_0$, the distance between the microphones. For matched omnidirectional microphones, the magnitude of R, depends on the relative distance between the microphones and the acoustic source. For noise sources, the distances are typically a meter or more, and for speech sources, the distances are on the order of 10 cm, but the distances are not so limited. Therefore for a 2-cm array typical values of R are:

$$R_S = \frac{d_2}{d_1} \approx \frac{12 \text{ cm}}{10 \text{ cm}} = 1.2$$

$$R_N = \frac{d_2}{d_1} \approx \frac{102 \text{ cm}}{100 \text{ cm}} = 1.02$$

where the "S" subscript denotes the ratio for speech sources and "N" the ratio for noise sources. There is not a significant amount of separation between noise and speech sources in this case, and therefore it would be difficult to implement a robust solution using simple omnidirectional microphones.

A better implementation is to use directional microphones where the second microphone has minimal speech response. As described herein, such microphones can be constructed using omnidirectional microphones $O_1$ and $O_2$:

$$V_1(z)=-\beta(z)\alpha(z)O_2(z)+O_1(z)z^{-\gamma}$$

$$V_2(z)=\alpha(z)O_2(z)-\beta(z)O_1(z)z^{-\gamma} \quad [1]$$

where $\alpha(z)$ is a calibration filter used to compensate $O_2$'s response so that it is the same as $O_1$, $\beta(z)$ is a filter that describes the relationship between $O_1$ and calibrated $O_2$ for speech, and $\gamma$ is a fixed delay that depends on the size of the array. There is no loss of generality in defining $\alpha(z)$ as above, as either microphone may be compensated to match the other. For this configuration $V_1$ and $V_2$ have very similar noise response magnitudes and very dissimilar speech response magnitudes if $$\gamma = \frac{d}{c}$$

where again $d=2d_0$ and c is the speed of sound in air, which is temperature dependent and approximately $$c = 331.3\sqrt{1 + \frac{T}{273.15}} \ \frac{\text{m}}{\text{sec}}$$

where T is the temperature of the air in Celsius.

The filter $\beta(z)$ can be calculated using wave theory to be $$\beta(z) = \frac{d_1}{d_2} = \frac{d_1}{d_1 + d} \quad [2]$$

where again $d_k$ is the distance from the user's mouth to $O_k$.

Figure 35:
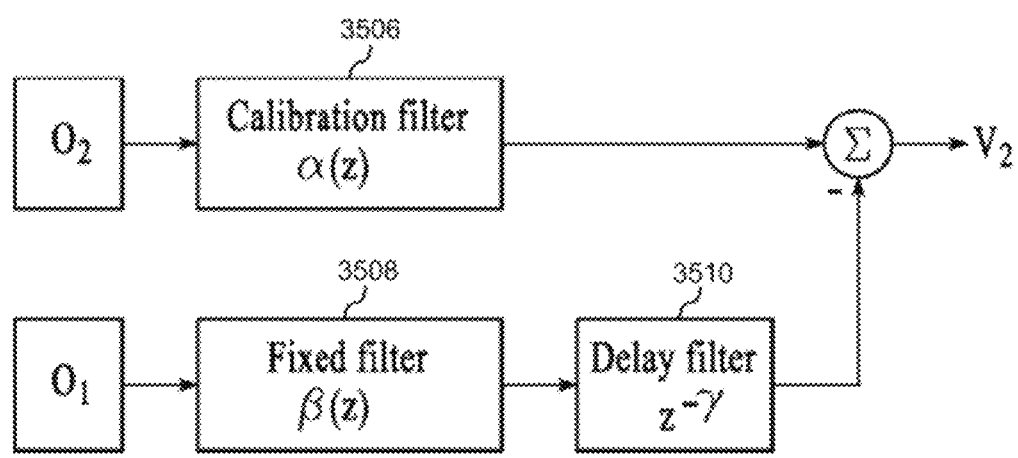
FIG. 35 is an exemplary block diagram of $V_2$ construction using a fixed $\beta(z)$, according to some embodiments.

FIG. 35 is an exemplary block diagram of $V_2$ construction using a fixed $\beta(z)$ filter 3508, according to some embodiments. This fixed (or static) $\beta$ works sufficiently well if the calibration filter $\alpha(z)$ 3506 is accurate and $d_1$ and $d_2$ are accurate for the user. The output of filter 3508 is transmitted to delay filter 3510. This fixed-$\beta$ algorithm, however, neglects effects such as reflection, diffraction, poor array orientation (i.e. the microphones and the mouth of the user are not all on a line), and the possibility of different $d_1$ and $d_2$ values for different users. The filter $\beta(z)$ can also be determined experimentally using an adaptive filter.

Figure 36:
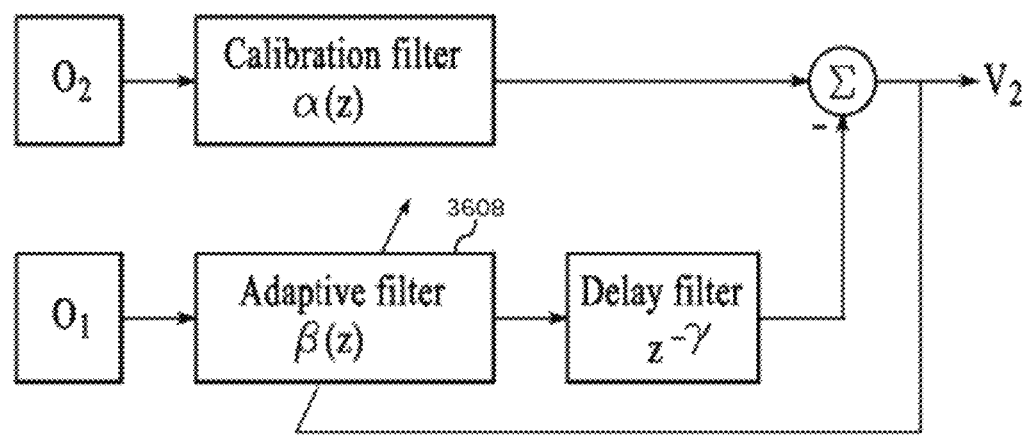
FIG. 36 is an exemplary block diagram of $V_2$ construction using an adaptive $\beta(z)$, according to some embodiments.

FIG. 36 is an exemplary block diagram of $V_2$ construction using an adaptive $\tilde{\beta}(z)$ 3608, according to some embodiments, where:

$$\tilde{\beta}(z) = \frac{\alpha(z)O_2(z)}{z^{-\gamma}O_1(z)}$$

The adaptive process varies $\tilde{\beta}(z)$ to minimize the output of $V_2$ when speech is being received by $O_1$ and $O_2$. A small amount of noise may be tolerated with little ill effect, but it is preferred that speech is being received when the coefficients of {tilde over $\tilde{\beta}$(z) are calculated. Any adaptive process may be used; a normalized least-mean squares (NLMS) algorithm was used in the examples below.

The $V_1$ can be constructed using the current value for $\tilde{\beta}(z)$ or the fixed filter $\beta(z)$ can be used for simplicity.

Figure 37:
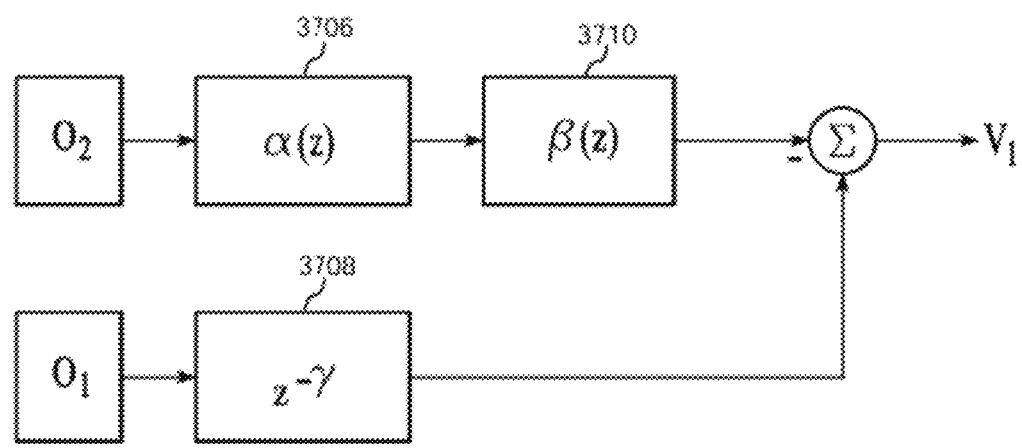
FIG. 37 is an exemplary block diagram of $V_1$ construction, according to some embodiments.

FIG. 37 is an exemplary block diagram of $V_1$ construction, according to some embodiments. An example of ratio R can be expressed as follows:

$$R = \frac{\|V_1(z)\|}{\|V_2(z)\|} = \sqrt{\frac{(-\tilde{\beta}(z)\alpha(z)O_2(z) + O_1(z)z^{-\gamma})^2}{(\alpha(z)O_2(z) - \tilde{\beta}(z)O_1(z)z^{-\gamma})^2}}$$

where double bar indicates norm and again any size window may be used. If $\tilde{\beta}(z)$ has been accurately calculated, the ratio for speech should be relatively high (e.g., greater than approximately 2) and the ratio for noise should be relatively low (e.g., less than approximately 1.1). The ratio calculated may depend on both the relative energies of the speech and noise as well as the orientation of the noise and the reverberance of the environment. In practice, either the adapted filter $\tilde{\beta}(z)$ or the static filter b(z) may be used for $V_1(z)$ with little effect on R—but note the use of the adapted filter $\tilde{\beta}(z)$ in $V_2(z)$ for best performance. Many techniques known to those skilled in the art (e.g., smoothing, etc.) can be used to make R more amenable to use in generating a VAD and the embodiments herein are not so limited.

As shown, FIG. 37 includes a calibration filter 3706, a filter 3710, and a delay 3708. The ratio R can be calculated for the entire frequency band of interest, or can be calculated in frequency subbands. One effective subband discovered was 250 Hz to 1250 Hz, another was 200 Hz to 3000 Hz, but many others are possible and useful.

Once generated, the vector of the ratio R versus time (or the matrix of R versus time if multiple subbands are used) can be used with any detection system (such as one that uses fixed and/or adaptive thresholds) to determine when speech is occurring. While many detection systems and methods are known to exist by those skilled in the art and may be used, the method described herein for generating an R so that the speech is easily discernable is novel. Note that the R does not depend on the type of noise or its orientation or frequency content; R simply depends on the $V_1$ and $V_2$ spatial response similarity for noise and spatial response dissimilarity for speech. In this way it is very robust and can operate smoothly in a variety of noisy acoustic environments.

Figure 38:
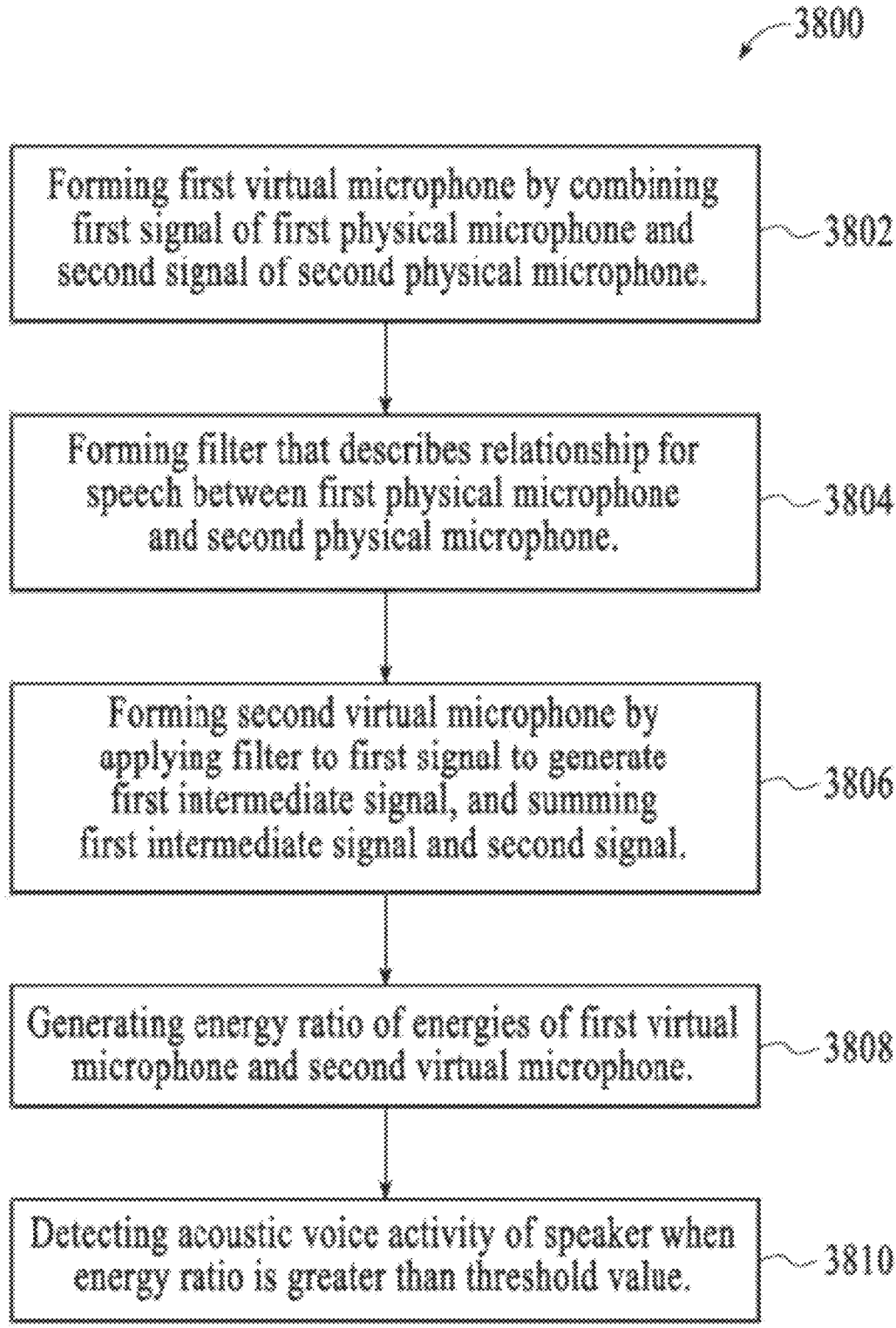
FIG. 38 is an exemplary flow diagram of acoustic voice activity detection, according to some embodiments.

FIG. 38 is an exemplary flow diagram of acoustic voice activity detection 3800, according to some embodiments. The detection comprises forming a first virtual microphone by combining a first signal of a first physical microphone and a second signal of a second physical microphone 3802. The detection comprises forming a filter that describes a relationship for speech between the first physical microphone and the second physical microphone 3804. The detection comprises forming a second virtual microphone by applying the filter to the first signal to generate a first intermediate signal, and summing the first intermediate signal and the second signal 3806. The detection comprises generating an energy ratio of energies of the first virtual microphone and the second virtual microphone 3808. The detection comprises detecting acoustic voice activity of a speaker when the energy ratio is greater than a threshold value 3810.

The accuracy of the adaptation to the $\beta(z)$ of the system is a factor in determining the effectiveness of the AVAD. A more accurate adaptation to the actual $\beta(z)$ of the system leads to lower energy of the speech response in $V_2$, and a higher ratio R. The noise (far-field) magnitude response is largely unchanged by the adaptation process, so the ratio R may be near unity for accurately adapted beta. For purposes of accuracy, the system can be trained on speech alone, or the noise should be low enough in energy so as not to affect or to have a minimal affect the training.

To make the training as accurate as possible, the coefficients of the filter $\beta(z)$ of an embodiment are generally updated under the following conditions, but the embodiment is not so limited: speech is being produced (as described, in some examples, as a Skin Surface Microphone (SSM) as described in U.S. patent application Ser. No. 10/769,302, filed Jan. 30, 2004, which is incorporated by reference herein in its entirety); no wind is detected (wind can be detected using many different methods known in the art, such as examining the microphones for uncorrelated low-frequency noise); and the current value of R is much larger than a smoothed history of R values (this ensures that training occurs when strong speech is present). These procedures are flexible and others may be used without significantly affecting the performance of the system. These restrictions can make the system relatively more robust.

Even with these precautions, it is possible that the system accidentally trains on noise (e.g., there may be a higher likelihood of this without use of a non-acoustic VAD device such as the SSM used in the Jawbone headset produced by Aliph, San Francisco, Calif.). Thus, an embodiment includes a further failsafe system to preclude accidental training from significantly disrupting the system. The adaptive $\beta$ is limited to certain values expected for speech. For example, values for $d_1$ for an ear-mounted headset may normally fall between 9 and 14 centimeters, so using an array length of $2d_0$=2.0 cm and Equation 2 above, $$|\beta(z)| = \frac{d_1}{d_2} \approx \frac{d_1}{d_1 + 2d_0}$$

which means that $$0.82 < |\beta(z)| < 0.88.$$

The magnitude of the $\beta$ filter can therefore be limited to between approximately 0.82 and 0.88 to preclude problems if noise is present during training. Looser limits can be used to compensate for inaccurate calibrations (the response of omnidirectional microphones is usually calibrated to one another so that their frequency response is the same to the same acoustic source—if the calibration is not completely accurate the virtual microphones may not form properly).

Similarly, the phase of the .beta. filter can be limited to be what is expected from a speech source within +−30 degrees from the axis of the array. As described herein, and with reference to FIG. 34, $$\gamma = \frac{d_2 - d_1}{c} \text{ (seconds)}$$

$$d_1 = \sqrt{d_s^2 - 2d_s d_0 \cos(\theta) + d_0^2}$$

$$d_2 = \sqrt{d_s^2 + 2d_s d_0 \cos(\theta) + d_0^2}$$

where $d_s$ is the distance from the midpoint of the array to the speech source. Varying $d_s$ from 10 to 15 cm and allowing .theta. to vary between 0 and +−30 degrees, the maximum difference in $\gamma$ results from the difference of .gamma. at 0 degrees (58.8 μsec) and $\gamma$ at +−30 degrees for $d_s$=10 cm (50.8 μsec). This means that the maximum expected phase difference is 58.8−50.8=8.0 μsec, or 0.064 samples at an 8 kHz sampling rate. Since $$\varphi(f) = 2\pi f t = 2\pi f (8.0 \times 10^{-6}) \text{rad}$$

the maximum phase difference realized at 4 kHz may be 0.2 rad or about 11.4 degrees, a small amount, but not a negligible one. Therefore the $\beta$ filter should almost linear phase, but some allowance made for differences in position and angle. In practice a slightly larger amount was used (0.071 samples at 8 kHz) in order to compensate for poor calibration and diffraction effects, and this worked well. The limit on the phase in the example below was implemented as the ratio of the central tap energy to the combined energy of the other taps:

$$\text{phase limit ratio} = \frac{(\text{center tap})^2}{\|\beta\|}$$

where $\beta$ is the current estimate. This limits the phase by restricting the effects of the non-center taps. Other ways of limiting the phase of the beta filter are known to those skilled in the art and the algorithm presented here is not so limited.

Embodiments are presented herein that use both a fixed $\beta(z)$ and an adaptive $\beta(z)$, as described in detail above. In both cases, R was calculated using frequencies between 250 and 3000 Hz using a window size of 200 samples at 8 kHz. The results for $V_1$ (top plot), $V_2$ (middle plot), R (bottom plot, solid line, windowed using a 200 sample rectangular window at 8 kHz) and the VAD (bottom plot, dashed line) are shown in FIGS. 39-44. FIGS. 39-44 demonstrate the use of a fixed beta filter $\beta(z)$ in conditions of noise (street and bus noise, approximately 70 dB SPL at the ear), speech (normalized to 94 dB SPL at the mouth reference point (MRP)), and mixed noise and speech, respectively. A Bruel & Kjaer Head and Torso Simulator (HATS) was used for the tests and the omnidirectional microphones mounted on HATS' ear with the midline of the array approximately 11 cm from the MRP. The fixed beta filter used was $\beta_F(z)=0.82$, where the "F" subscript indicates a fixed filter. The VAD was calculated using a fixed threshold of 1.5.

Figure 39:
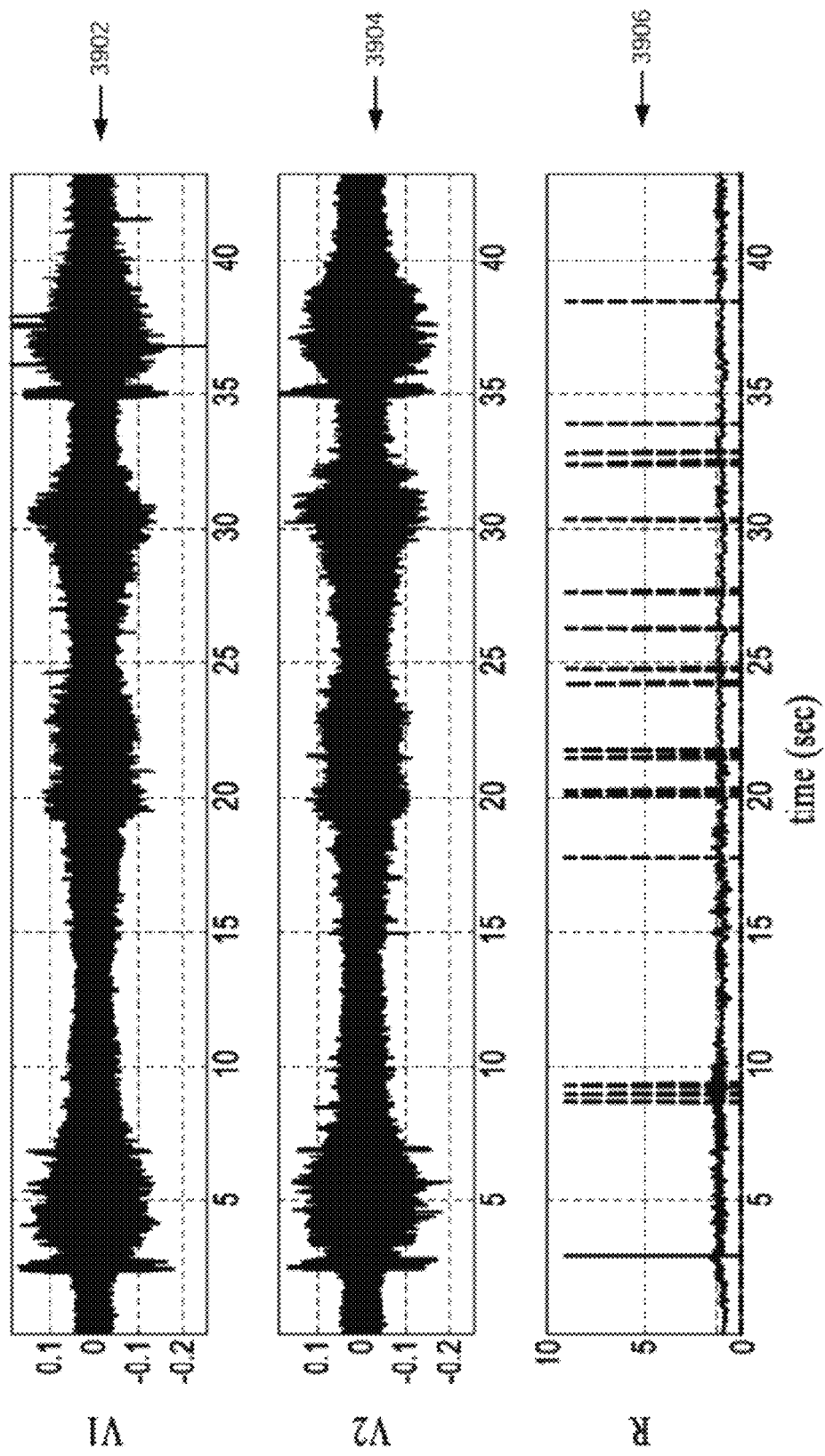
FIG. 39 shows experimental results of an exemplary algorithm using a fixed beta when noise is present, according to some embodiments.

FIG. 39 shows experimental results of an exemplary algorithm using a fixed beta when noise is present, according to some embodiments. The top plot is $V_1$ 3902, the middle plot is $V_2$ 3904, and the bottom plot is R 3906 (solid line) and the VAD result (dashed line) versus time. Examining FIG. 39, the response of both $V_1$ and $V_2$ are very similar, and the ratio R is very near unity for the entire sample. The VAD response has occasional false positives denoted by spikes in the R plot (windows that are identified by the algorithm as containing speech when they do not), but these are easily removed using standard pulse removal algorithms and/or smoothing of the R results.

Figure 40:
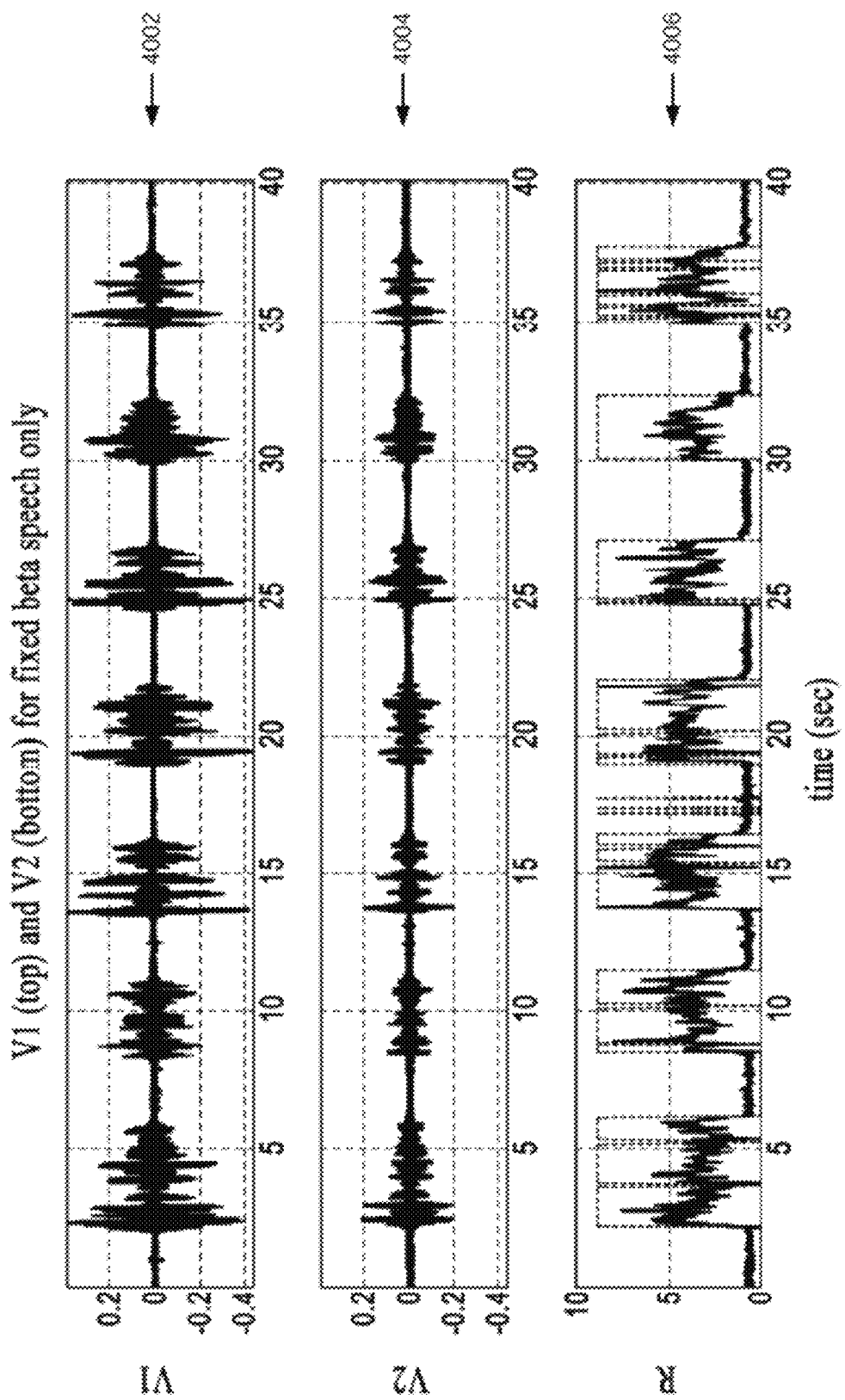
FIG. 40 shows experimental results of an exemplary algorithm using a fixed beta when speech is present, according to some embodiments.

FIG. 40 shows experimental results of an exemplary algorithm using a fixed beta when speech is present, according to some embodiments. The top plot is $V_1$ 4002, the middle plot is $V_2$ 4004, and the bottom plot is R 4006 (solid line) and the VAD result (dashed line) versus time. The R ratio is between approximately 2 and approximately 7 on average, and the speech is easily discernable using the fixed threshold. These results show that the response of the two virtual microphones to speech are very different, and indeed that ratio R varies from 2-7 during speech. In some examples, there may be few false positives and few false negatives (i.e., windows that contain speech but are not identified as speech windows). Accordingly, the speech may be accurately detected.

Figure 41:
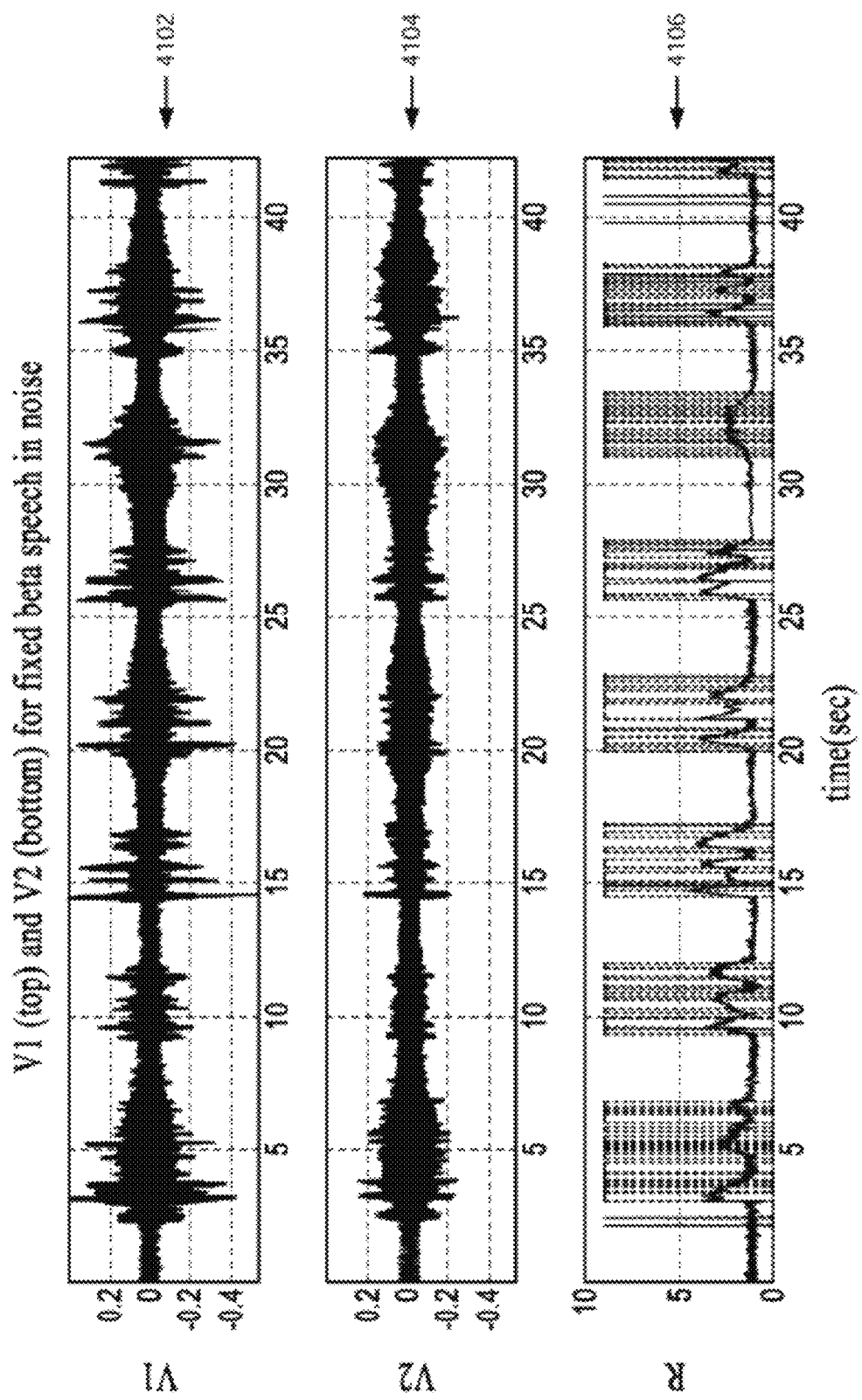
FIG. 41 shows experimental results of an exemplary algorithm using a fixed beta when speech and noise is present, according to some embodiments.

FIG. 41 shows experimental results of an exemplary algorithm using a fixed beta when speech and noise is present, according to some embodiments. The top plot is $V_1$ 4102, the middle plot is $V_2$ 4104, and the bottom plot is R 4106 (solid line) and the VAD result (dashed line) versus time. The R ratio is lower than when no noise is present, but the VAD remains accurate with a few false positives. There are more false negatives than with no noise, but the speech remains easily detectable using standard thresholding algorithms. Even in a moderately loud noise environment (FIG. 41) the R ratio remains significantly above unity, and the VAD once again returns few false positives. More false negatives are observed, but these may be reduced using standard methods such as smoothing of R and allowing the VAD to continue reporting voiced windows for a few windows after R is under the threshold.

Figure 42:
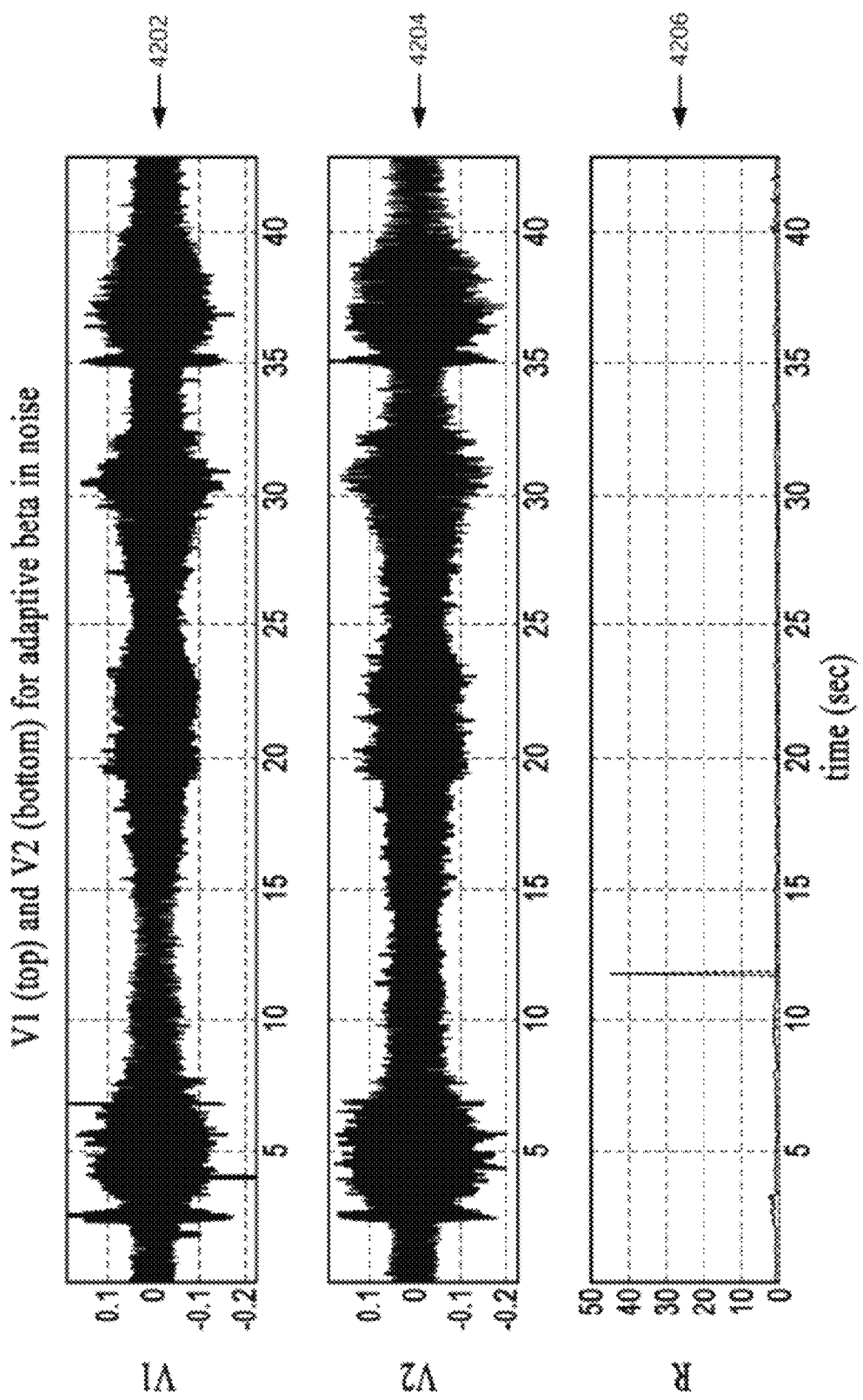
FIG. 42 shows experimental results of an exemplary algorithm using an adaptive beta when noise is present, according to some embodiments.
Figure 43:
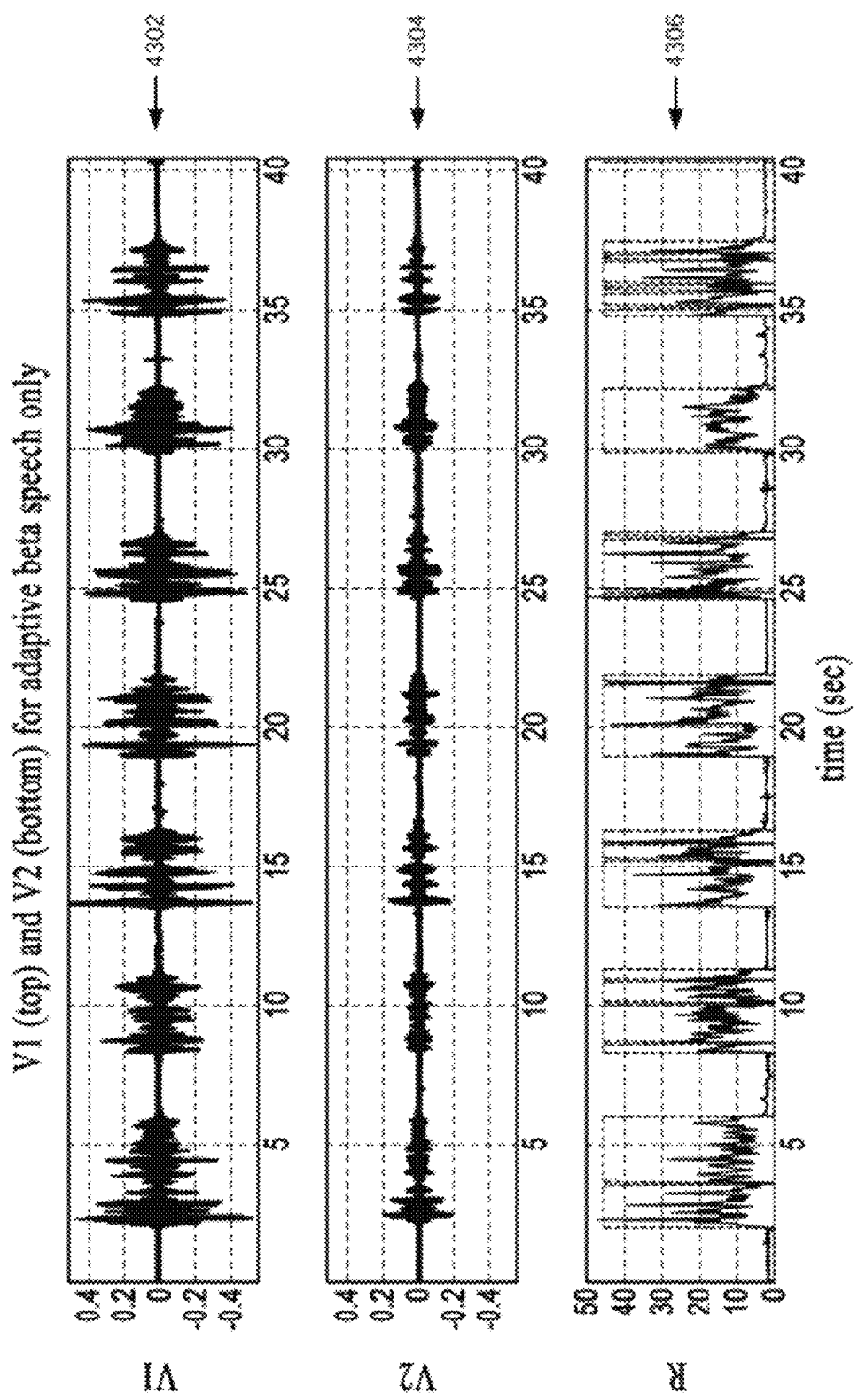
FIG. 43 shows experimental results of an exemplary algorithm using an adaptive beta when speech is present, according to some embodiments.
Figure 44:
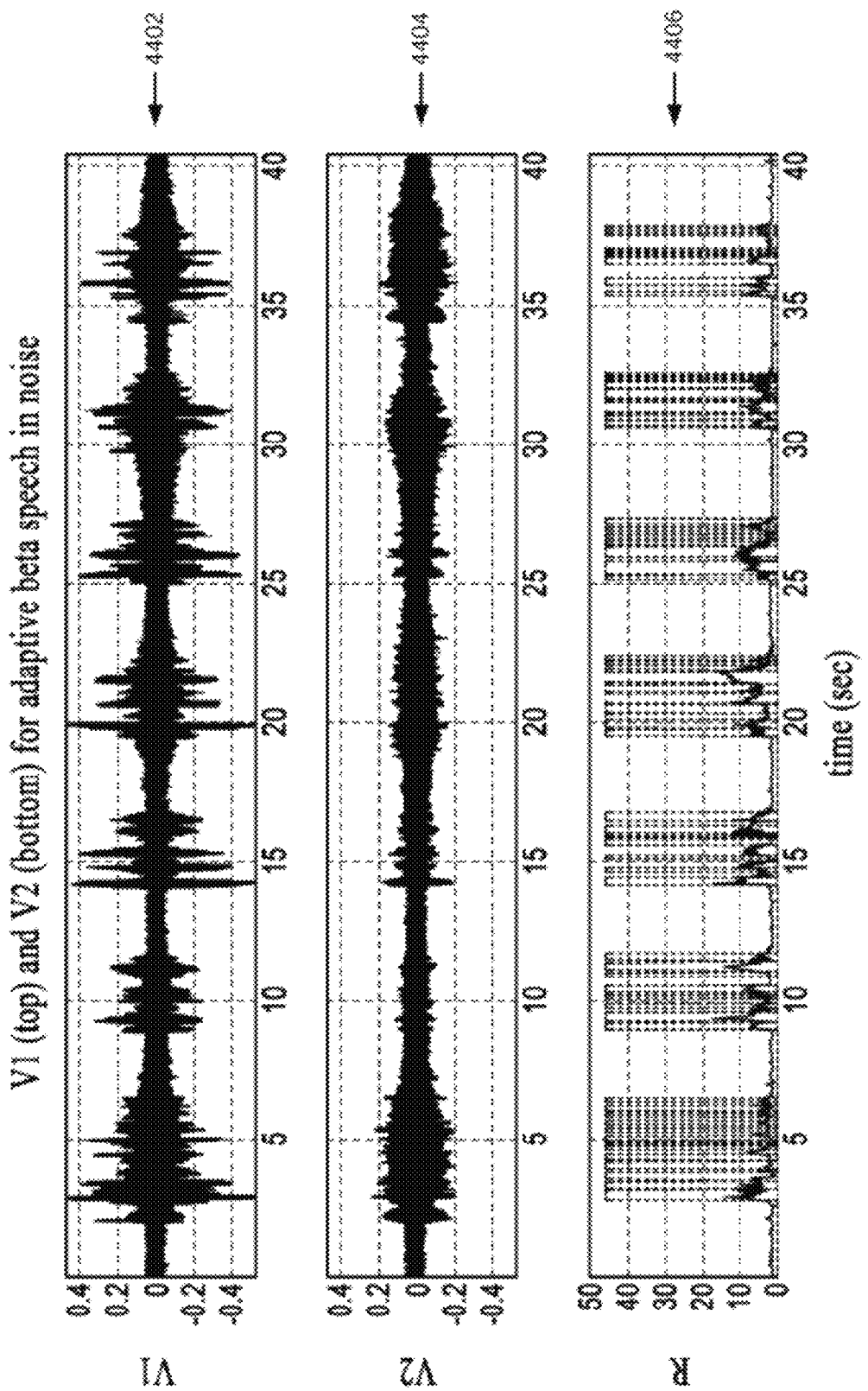
FIG. 44 shows experimental results of an exemplary algorithm using an adaptive beta when speech and noise is present, according to some embodiments.

Results using the adaptive beta filter are shown in FIGS. 42-44. The adaptive filter used was a five-tap NLMS FIR filter using the frequency band from 100 Hz to 3500 Hz. A fixed filter of $z^{-0.43}$ is used to filter $O_1$ so that $O_1$ and $O_2$ are aligned for speech before the adaptive filter is calculated. The adaptive filter was constrained using the methods above using a low $\beta$ limit of 0.73, a high $\beta$ limit of 0.98, and a phase limit ratio of 0.98. Again a fixed threshold was used to generate the VAD result from the ratio R, but in this case a threshold value of 2.5 was used since the R values using the adaptive beta filter are normally greater than when the fixed filter is used. This allows for a reduction of false positives without significantly increasing false negatives.

FIG. 42 shows experimental results of an exemplary algorithm using an adaptive beta when noise is present, according to some embodiments. The top plot is $V_1$ 4202, the middle plot is $V_2$ 4204, and the bottom plot is R 4206 (solid line) and the VAD result (dashed line) versus time, with the y-axis expanded to 0-50. Again, $V_1$ and $V_2$ are very close in energy and the R ratio is near unity. A single false positive may be generated.

FIG. 43 shows experimental results of an exemplary algorithm using an adaptive beta when speech is present, according to some embodiments. The top plot is $V_1$ 4302, the middle plot is $V_2$ 4304, and the bottom plot is R 4306 (solid line) and the VAD result (dashed line) versus time, expanded to 0-50. The $V_2$ response is greatly reduced using the adaptive beta, and the R ratio has increased from the range of approximately 2-7 to the range of approximately 5-30 on average, making the speech even simpler to detect using standard thresholding algorithms. There are almost no false positives or false negatives. Therefore, the response of $V_2$ to speech is minimal, R is very high, and all of the speech is easily detected with almost no false positives.

FIG. 44 shows experimental results of an exemplary algorithm using an adaptive beta when speech and noise is present, according to some embodiments. The top plot is $V_1$ 4402, the middle plot is $V_2$ 4404, and the bottom plot is R 4406 (solid line) and the VAD result (dashed line) versus time, with the y-axis expanded to 0-50. The R ratio is again lower than when no noise is present, but this R with significant noise present results in a VAD signal that is about the same as the case using the fixed beta with no noise present. This shows that use of the adaptive beta allows the system to perform well in higher noise environments than the fixed beta. Therefore, with mixed noise and speech, there are again very few false positives and fewer false negatives than in the results of FIG. 41, demonstrating that the adaptive filter can outperform the fixed filter in the same noise environment. In practice, the adaptive filter has proven to be significantly more sensitive to speech and less sensitive to noise.

Systems and methods for discriminating voiced and unvoiced speech from background noise are provided below including a Non-Acoustic Sensor Voiced Speech Activity Detection (NAVSAD) system and a Pathfinder Speech Activity Detection (PSAD) system. The noise removal and reduction methods provided herein, while allowing for the separation and classification of unvoiced and voiced human speech from background noise, address the shortcomings of typical systems known in the art by cleaning acoustic signals of interest without distortion.

Figure 45:
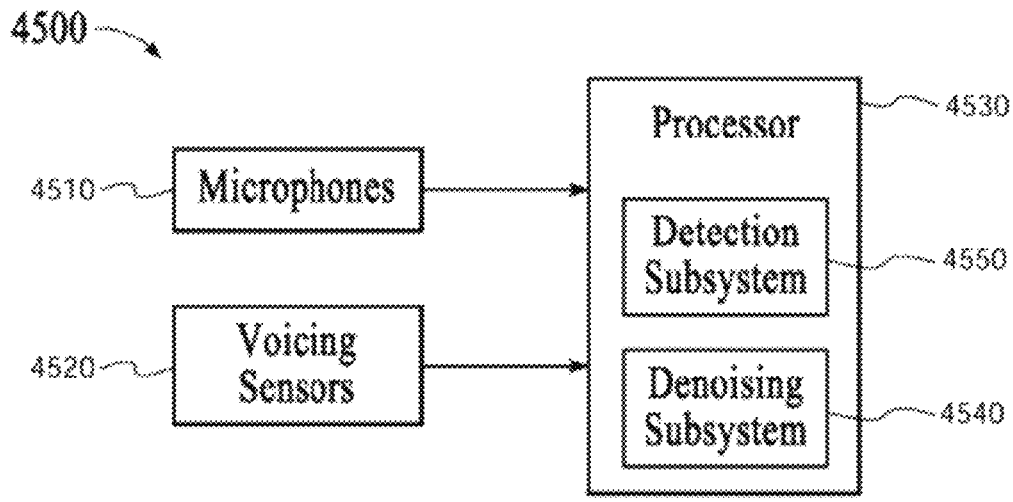
FIG. 45 is an exemplary block diagram of a NAVSAD system, according to some embodiments.

FIG. 45 is an exemplary block diagram of a NAVSAD system 4500, according to some embodiments. The NAVSAD system couples microphones 4510 and sensors 4520 to at least one processor 4530. The sensors 4520 of an embodiment include voicing activity detectors or non-acoustic sensors. The processor 4530 controls subsystems including a detection subsystem 4550, referred to herein as a detection algorithm, and a denoising subsystem 4540. Operation of the denoising subsystem 4540 is described in detail in the Related Applications. The NAVSAD system works extremely well in any background acoustic noise environment.

Figure 46:
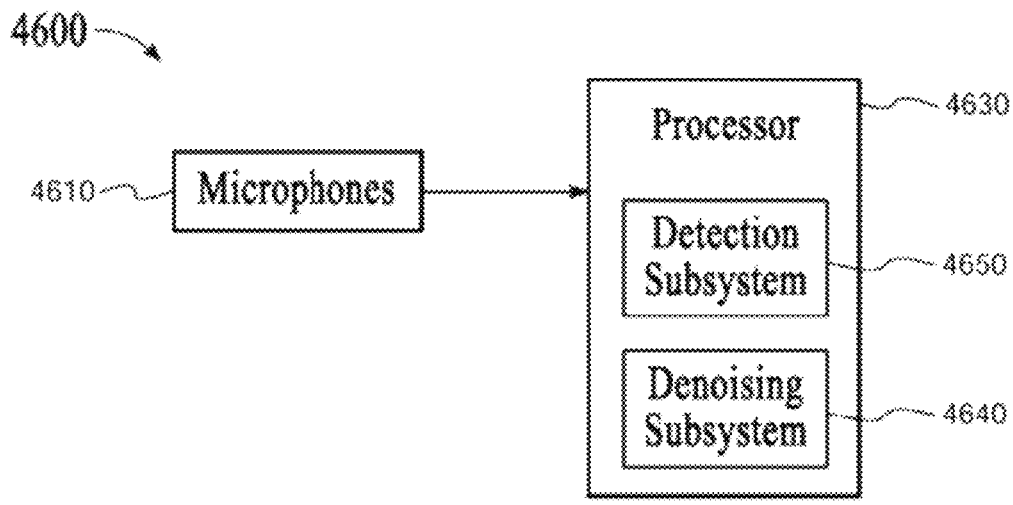
FIG. 46 is an exemplary block diagram of a PSAD system, according to some embodiments.

FIG. 46 is an exemplary block diagram of a PSAD system 4600, according to some embodiments. The PSAD system couples microphones 4610 to at least one processor 4630. The processor 4630 includes a detection subsystem 4650, referred to herein as a detection algorithm, and a denoising subsystem 4640. The PSAD system is highly sensitive in low acoustic noise environments and relatively insensitive in high acoustic noise environments. The PSAD can operate independently or as a backup to the NAVSAD, detecting voiced speech if the NAVSAD fails.

Note that the detection subsystems 4650 and denoising subsystems 4640 of both the NAVSAD and PSAD systems of an embodiment are algorithms controlled by the processor 4630, but are not so limited. Alternative embodiments of the NAVSAD and PSAD systems can include detection subsystems 4650 and/or denoising subsystems 4640 that comprise additional hardware, firmware, software, and/or combinations of hardware, firmware, and software. Furthermore, functions of the detection subsystems 4650 and denoising subsystems 4640 may be distributed across numerous components of the NAVSAD and PSAD systems.

Figure 47:
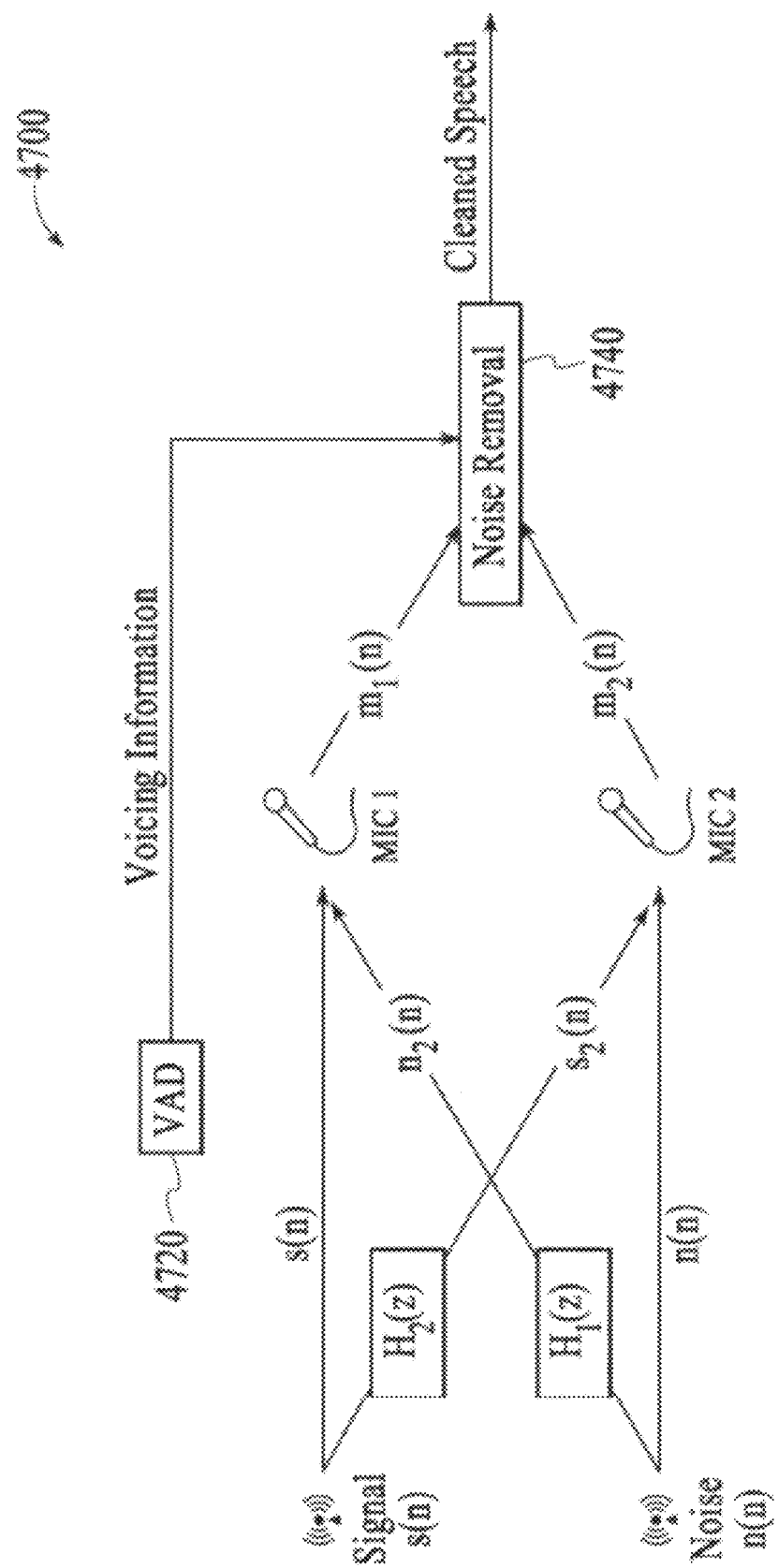
FIG. 47 is an exemplary block diagram of a denoising system, referred to herein as the Pathfinder system, according to some embodiments.

FIG. 47 is an exemplary block diagram of a denoising subsystem 4700, referred to herein as the Pathfinder system, according to some embodiments. An example of the Pathfinder system is briefly described below, and is described in detail in the Related Applications. Two microphones Mic 1 and Mic 2 are used in the Pathfinder system, and Mic 1 is considered the "signal" microphone. With reference to FIG. 45, the Pathfinder system 4700 is equivalent to the NAVSAD system 4500 when the voicing activity detector (VAD) 4720 is a non-acoustic voicing sensor 20 and the noise removal subsystem 4740 includes the detection subsystem 50 and the denoising subsystem 40. With reference to FIG. 46, the Pathfinder system 4700 is equivalent to the PSAD system 4600 in the absence of the VAD 4720, and when the noise removal subsystem 4740 includes the detection subsystem 50 and the denoising subsystem 40.

The NAVSAD and PSAD systems support a two-level commercial approach in which (i) a relatively less expensive PSAD system supports an acoustic approach that functions in most low- to medium-noise environments, and (ii) a NAVSAD system adds a non-acoustic sensor to enable detection of voiced speech in any environment. Unvoiced speech is normally not detected using the sensor, as it normally does not sufficiently vibrate human tissue. However, in high noise situations detecting the unvoiced speech is not as important, as it is normally very low in energy and easily washed out by the noise. Therefore in high noise environments the unvoiced speech is unlikely to affect the voiced speech denoising. Unvoiced speech information may occur in the presence of little to no noise and, therefore, the unvoiced detection should be highly sensitive in low noise situations, and insensitive in high noise situations. This is not easily accomplished, and comparable acoustic unvoiced detectors known in the art are incapable of operating under these environmental constraints.

The NAVSAD and PSAD systems include an array algorithm for speech detection that uses the difference in frequency content between two microphones to calculate a relationship between the signals of the two microphones. This is in contrast to conventional arrays that attempt to use the time/phase difference of each microphone to remove the noise outside of an "area of sensitivity". The methods described herein provide a significant advantage, as they do not require a specific orientation of the array with respect to the signal.

Further, the systems described herein are sensitive to noise of every type and every orientation, unlike conventional arrays that depend on specific noise orientations. Consequently, the frequency-based arrays presented herein are unique as they depend on the relative orientation of the two microphones themselves with no dependence on the orientation of the noise and signal with respect to the microphones. This results in a robust signal processing system with respect to the type of noise, microphones, and orientation between the noise/signal source and the microphones.

The systems described herein use the information derived from the Pathfinder noise suppression system and/or a non-acoustic sensor described in the Related Applications to determine the voicing state of an input signal, as described in detail below. The voicing state includes silent, voiced, and unvoiced states. The NAVSAD system, for example, includes a non-acoustic sensor to detect the vibration of human tissue associated with speech. The non-acoustic sensor of an embodiment is a General Electromagnetic Movement Sensor (GEMS) as described briefly below and in detail in the Related Applications, but is not so limited. Alternative embodiments, however, may use any sensor that is able to detect human tissue motion associated with speech and is unaffected by environmental acoustic noise.

The GEMS is a radio frequency device (2.4 GHz) that allows the detection of moving human tissue dielectric interfaces. The GEMS includes an RF interferometer that uses homodyne mixing to detect small phase shifts associated with target motion. In essence, the sensor sends out weak electromagnetic waves (less than 1 milliwatt) that reflect off of whatever is around the sensor. The reflected waves are mixed with the original transmitted waves and the results analyzed for any change in position of the targets. Anything that moves near the sensor may cause a change in phase of the reflected wave that may be amplified and displayed as a change in voltage output from the sensor. A similar sensor is described by Gregory C. Burnett (1999) in "The physiological basis of glottal electromagnetic micropower sensors (GEMS) and their use in defining an excitation function for the human vocal tract"; Ph.D. Thesis, University of California at Davis.

Figure 48:
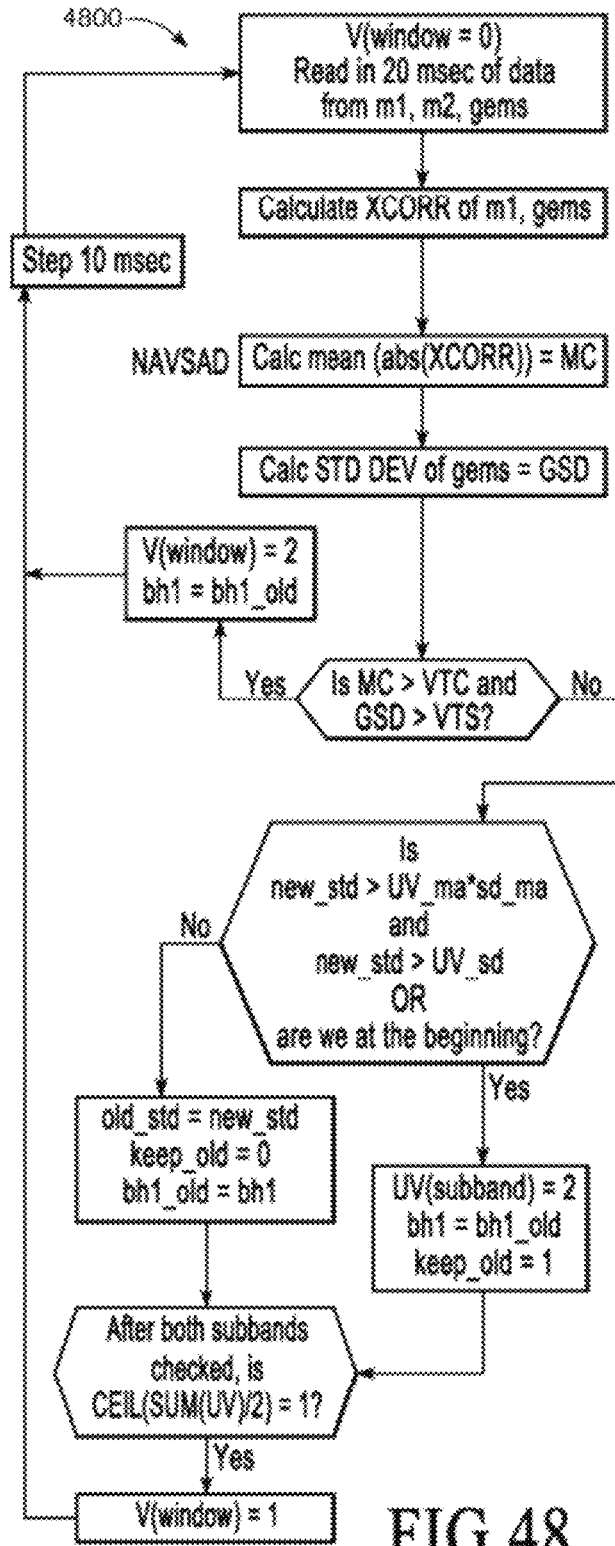
FIG. 48 is an exemplary flow diagram of a detection algorithm for use in detecting voiced and unvoiced speech, according to some embodiments.

FIG. 48 is an exemplary flow diagram of a detection flow 4800 for use in detecting voiced and unvoiced speech, according to some embodiments. With reference to FIGS. 45 and 46, both the NAVSAD and PSAD systems of an embodiment include the detection flow 4800 as the detection subsystem 4550 of FIG. 45. This detection flow 4500 operates in real-time and, in an embodiment, operates on 20 millisecond windows and steps 10 milliseconds at a time, but is not so limited. The voice activity determination is recorded for the first 10 milliseconds, and the second 10 milliseconds functions as a "look-ahead" buffer. While an embodiment uses the 20/10 windows, alternative embodiments may use numerous other combinations of window values.

Consideration was given to a number of multi-dimensional factors in developing the detection flow 4800. The biggest consideration was to maintaining the effectiveness of the Pathfinder denoising technique, described in detail in the Related Applications and reviewed herein. Pathfinder performance can be compromised if the adaptive filter training is conducted on speech rather than on noise. Note that exclusion of any significant amount of speech from the VAD may be avoided in various examples to keep such disturbances to a minimum Consideration was also given to the accuracy of the characterization between voiced and unvoiced speech signals, and distinguishing each of these speech signals from noise signals. This type of characterization can be useful in such applications as speech recognition and speaker verification.

Furthermore, the systems using the detection algorithm of an embodiment function in environments containing varying amounts of background acoustic noise. If the non-acoustic sensor is available, this external noise is not a problem for voiced speech. However, for unvoiced speech (and voiced if the non-acoustic sensor is not available or has malfunctioned) reliance is placed on acoustic data alone to separate noise from unvoiced speech. An advantage inheres in the use of two microphones in an embodiment of the Pathfinder noise suppression system, and the spatial relationship between the microphones is exploited to assist in the detection of unvoiced speech. However, there may occasionally be noise levels high enough that the speech may be nearly undetectable and the acoustic-related method may fail. In these situations, the non-acoustic sensor (or hereafter just the sensor) as described herein may be implemented.

In a two-microphone system, for example, a speech source may be relatively louder in one designated microphone when compared to another microphone, which may be achieved when microphones are placed on a head, as noise may result in an $H_1$ with a gain near unity.

Regarding the NAVSAD system, and with reference to FIG. 45 and FIG. 47, the NAVSAD relies on two parameters to detect voiced speech. These two parameters include the energy of the sensor in the window of interest, determined in an embodiment by the standard deviation (SD), and optionally the cross-correlation (XCORR) between the acoustic signal from microphone 1 and the sensor data. The energy of the sensor can be determined in any one of a number of ways, and the SD is just one convenient way to determine the energy.

For the sensor, the SD is akin to the energy of the signal, which normally corresponds quite accurately to the voicing state, but may be susceptible to movement noise (relative motion of the sensor with respect to the human user) and/or electromagnetic noise. To further differentiate sensor noise from tissue motion, the XCORR can be used. The XCORR is calculated to 15 delays, which corresponds to just under 2 milliseconds at 8000 Hz.

The XCORR can also be useful when the sensor signal is distorted or modulated in some fashion. For example, there are sensor locations (such as the jaw or back of the neck) where speech production can be detected but where the signal may have incorrect or distorted time-based information. That is, they may not have well defined features in time that may match with the acoustic waveform. However, XCORR is more susceptible to errors from acoustic noise, and in high (<0 dB SNR) environments is almost useless. Therefore it should not be the sole source of voicing information.

The sensor detects human tissue motion associated with the closure of the vocal folds, so the acoustic signal produced by the closure of the folds is highly correlated with the closures. Therefore, sensor data that correlates highly with the acoustic signal is declared as speech, and sensor data that does not correlate well is termed noise. The acoustic data is expected to lag behind the sensor data by about 0.1 to 0.8 milliseconds (or about 1-7 samples) as a result of the delay time due to the relatively slower speed of sound (around 330 m/s). However, an embodiment uses a 15-sample correlation, as the acoustic wave shape varies significantly depending on the sound produced, and a larger correlation width is needed to ensure detection.

The SD and XCORR signals are related, but are sufficiently different so that the voiced speech detection is more reliable. For simplicity, though, either parameter may be used. The values for the SD and XCORR are compared to empirical thresholds, and if both are above their threshold, voiced speech is declared. Example data is presented and described below.

Figure 49A:
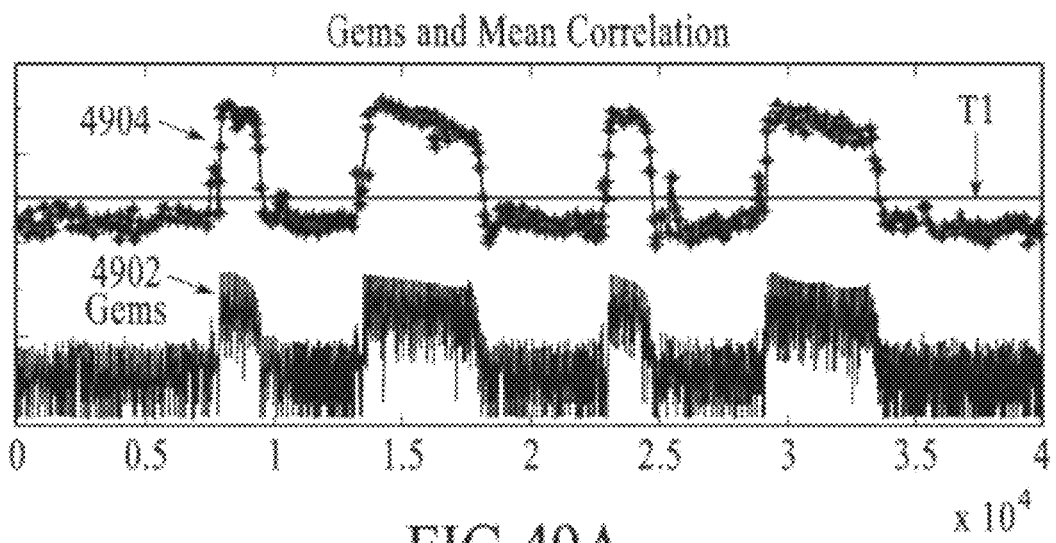
FIG. 49A is a diagram of a plot depicting a received GEMS signal for an utterance along with the mean correlation, according to some embodiments.
Figure 49B:
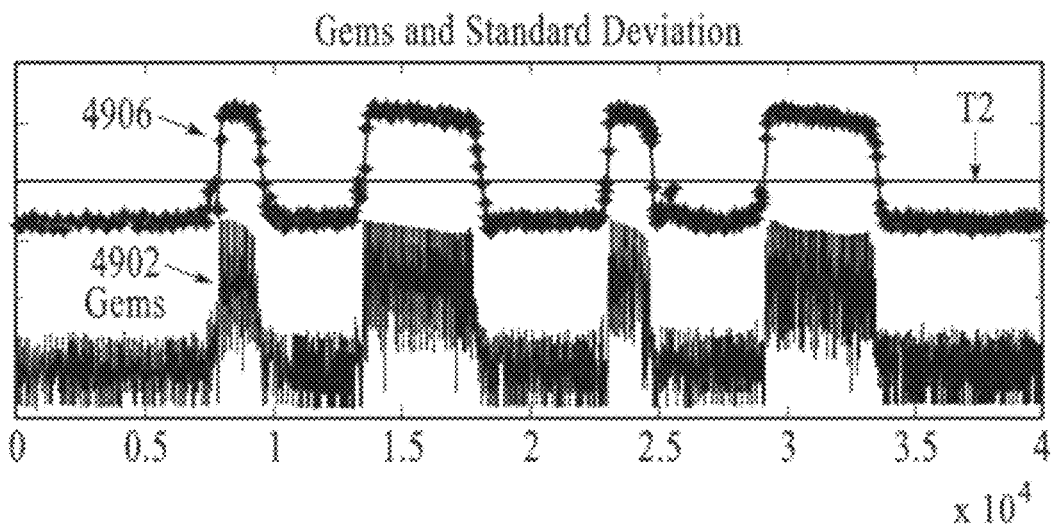
FIG. 49B is a diagram of a plot depicting a received GEMS signal for an utterance along with the standard deviation of the GEMS signal and the threshold for voiced speech detection, according to some embodiments.
Figure 50:
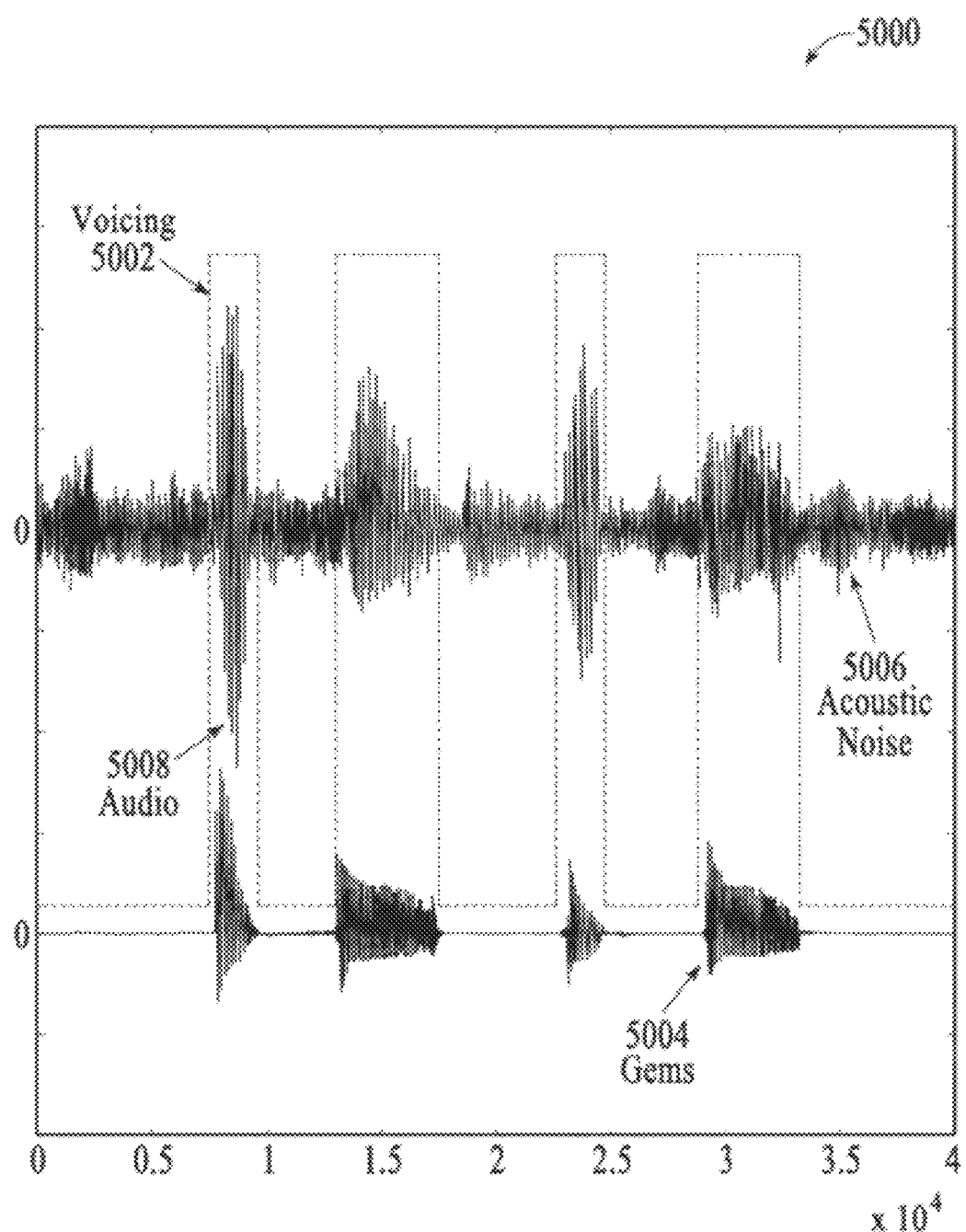
FIG. 50 is a diagram of a plot depicting voiced speech detected from an utterance along with the GEMS signal and the acoustic noise, according to some embodiments.

FIGS. 49A, 49B, and 50 show data plots for an example in which a subject twice speaks the phrase "pop pan", according to some embodiments. FIG. 49A is a diagram of a plot depicting a received GEMS signal for an utterance along with the mean correlation, according to some embodiments. In the example shown, GEMS signal 4902 for this utterance is depicted along with the mean correlation 4904 between the GEMS signal and the Mic 1 signal and the threshold T1 used for voiced speech detection.

FIG. 49B is a diagram of a plot depicting a received GEMS signal for an utterance along with the standard deviation of the GEMS signal and the threshold for voiced speech detection, according to some embodiments. In the example shown, the plot depicts a received GEMS signal 4902 for this utterance along with the standard deviation 4906 of the GEMS signal and the threshold T2 used for voiced speech detection.

FIG. 50 is a diagram of a plot depicting voiced speech detected from an utterance along with the GEMS signal and the acoustic noise, according to some embodiments. In the example shown, voiced speech 5002 detected from the acoustic or audio signal 5008 is depicted, along with the GEMS signal 5004 and the acoustic noise 5006; no unvoiced speech is detected in this example because of the heavy background babble noise 5006. The thresholds have been set so that there are virtually no false negatives, and occasional false positives. A voiced speech activity detection accuracy of greater than 99% has been attained under any acoustic background noise conditions.

The NAVSAD can determine when voiced speech is occurring with high degrees of accuracy due to the non-acoustic sensor data. However, the sensor offers little assistance in separating unvoiced speech from noise, as unvoiced speech normally causes no detectable signal in most non-acoustic sensors. If there is a detectable signal, the NAVSAD can be used. In the absence of a detectable signal use is made of the system and methods of the Pathfinder noise removal algorithm in determining when unvoiced speech is occurring. A brief review of the Pathfinder algorithm is described below, while a detailed description is provided in the Related Applications.

With reference to FIG. 47, the acoustic information coming into Microphone 1 is denoted by m.sub.1(n), the information coming into Microphone 2 is similarly labeled m.sub.2(n), and the GEMS sensor is assumed available to determine voiced speech areas. In the z (digital frequency) domain, these signals are represented as M.sub.1(z) and M.sub.2(z). Then $$M_1(z)=S(z)+N_2(z)$$

$$M_2(z)=N(z)+S_2(z)$$

with $$N_2(z)=N(z)H_1(z)$$

$$S_2(z)=S(z)H_2(z)$$

so that $$M_1(z) = S(z) + N_2(z)H_1(z)$$

$$M_2(z) = N(z) + S_2(z)H_2(z)$$

This is the general case for all two microphone systems. There is always going to be some leakage of noise into Mic 1, and some leakage of signal into Mic 2. Equation 1 has four unknowns and two relationships and cannot be solved explicitly.

However, there is another way to solve for some of the unknowns in Equation 1. Examine the case where the signal is not being generated—that is, where the GEMS signal indicates voicing is not occurring. In this case, s(n)=S(z)=0, and Equation 1 reduces to $$M_{1n}(z) = N(z)H_1(z)$$

$$M_{2n}(z) = N(z)$$

where the n subscript on the M variables indicate that noise is being received. This leads to $$M_{1n}(z) = M_{2n}(z)H_1(z)$$

$$H_1(z) = \frac{M_{1n}(z)}{M_{2n}(z)}$$

$H_1(z)$ can be calculated using any of the available system identification algorithms and the microphone outputs when noise is being received. The calculation can be done adaptively, so that if the noise changes significantly $H_1(z)$ can be recalculated quickly.

With a solution for one of the unknowns in Equation 1, solutions can be found for another, $H_2(z)$, by using the amplitude of the GEMS or similar device along with the amplitude of the two microphones. When the GEMS indicates voicing, but the recent (less than 1 second) history of the microphones indicate low levels of noise, assume that n(s)=N(z)~0. Then Equation 1 reduces to $$M_{1s}(z) = S(z)$$

$$M_{2s}(z) = S(z)H_2(z)$$

which in turn leads to $$M_{2s}(z) = M_{1s}(z)H_2(z)$$

$$H_2(z) = \frac{M_{2s}(z)}{M_{1s}(z)}$$

which is the inverse of the $H_1(z)$ calculation, but note that different inputs are being used.

After calculating $H_1(z)$ and $H_2(z)$ above, they are used to remove the noise from the signal. Rewrite Equation 1 as $$S(z) = M_1(z) - N(z)H_1(z)$$

$$N(z) = M_2(z) - S(z)H_2(z)$$

$$S(z) = M_1(z) - [M_2(z) - S(z)H_2(z)]H_1(z),$$

$$S(z)[1 - H_2(z)H_1(z)] = M_1(z) - M_2(z)H_1(z)$$

and solve for S(z) as:

$$S(z) = \frac{M_1(z) - M_2(z)H_1(z)}{1 - H_2(z)H_1(z)}$$

In practice $H_2(z)$ is usually quite small, so that $H_2(z)H_1(z) \ll 1$, and $$S(z) \approx M_1(z) - M_2(z)H_1(z),$$

obviating the need for the $H_2(z)$ calculation.

With reference to FIG. 46 and FIG. 47, the PSAD system is described. As sound waves propagate, they normally lose energy as they travel due to diffraction and dispersion. Assuming the sound waves originate from a point source and radiate isotropically, their amplitude may decrease as a function of 1/r, where r is the distance from the originating point. This function of 1/r proportional to amplitude is the worst case, if confined to a smaller area the reduction may be less. However it is an adequate model for the configurations of interest, specifically the propagation of noise and speech to microphones located somewhere on the user's head.

Figure 51:
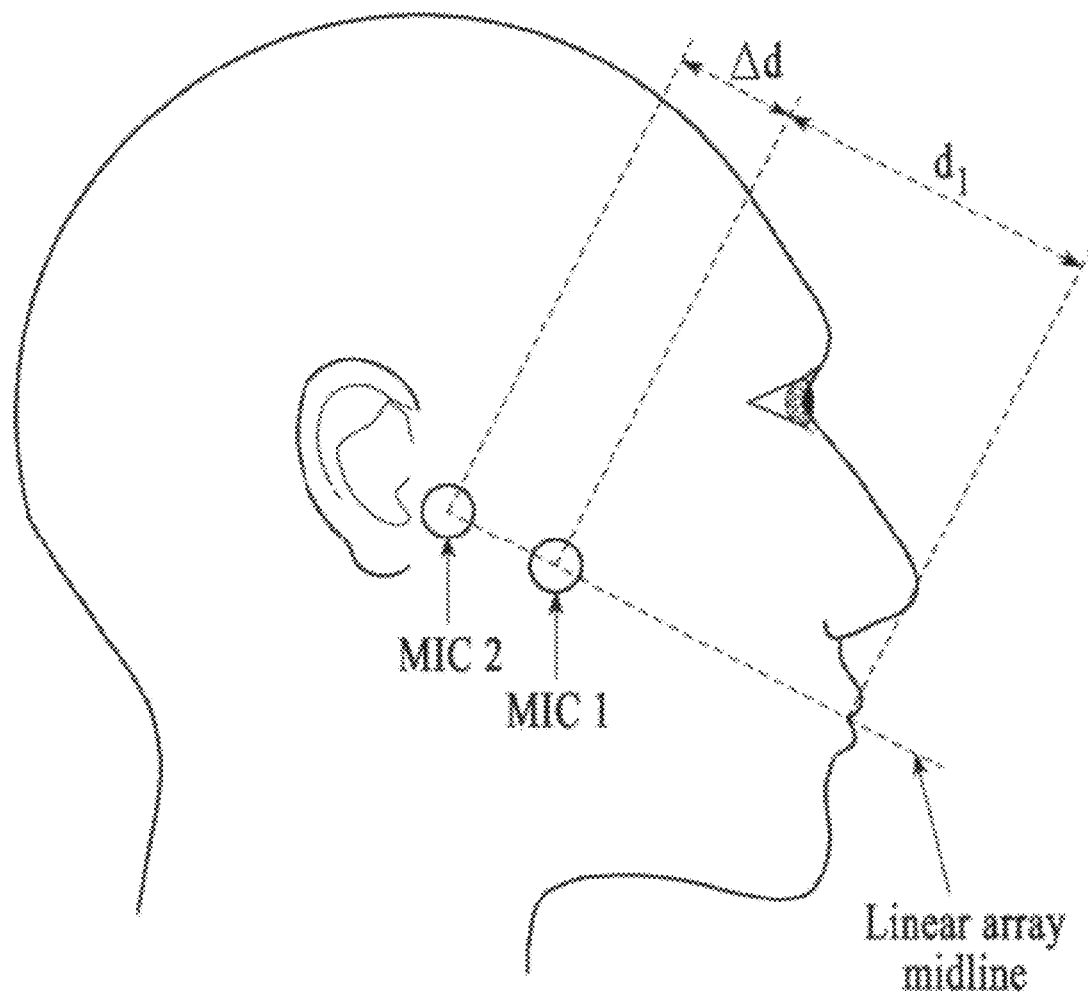
FIG. 51 is an exemplary microphone array for use according to some embodiments of the PSAD system.

FIG. 51 is an exemplary microphone array for use according to some embodiments of the PSAD system. Placing the microphones Mic 1 and Mic 2 in a linear array with the mouth on the array midline, the difference in signal strength in Mic 1 and Mic 2 (assuming the microphones have identical frequency responses) may be proportional to both $d_1$ and M. Assuming a 1/r (or in this case 1/d) relationship, it is seen that $$\Delta M = \frac{|Mic1|}{|Mic2|} = \Delta H_1(z) \propto \frac{d_1 + \Delta d}{d_1},$$

where $\Delta M$ is the difference in gain between Mic 1 and Mic 2 and therefore $H_1(z)$, as above in Equation 2. The variable d.sub.1 is the distance from Mic 1 to the speech or noise source.

Figure 52:
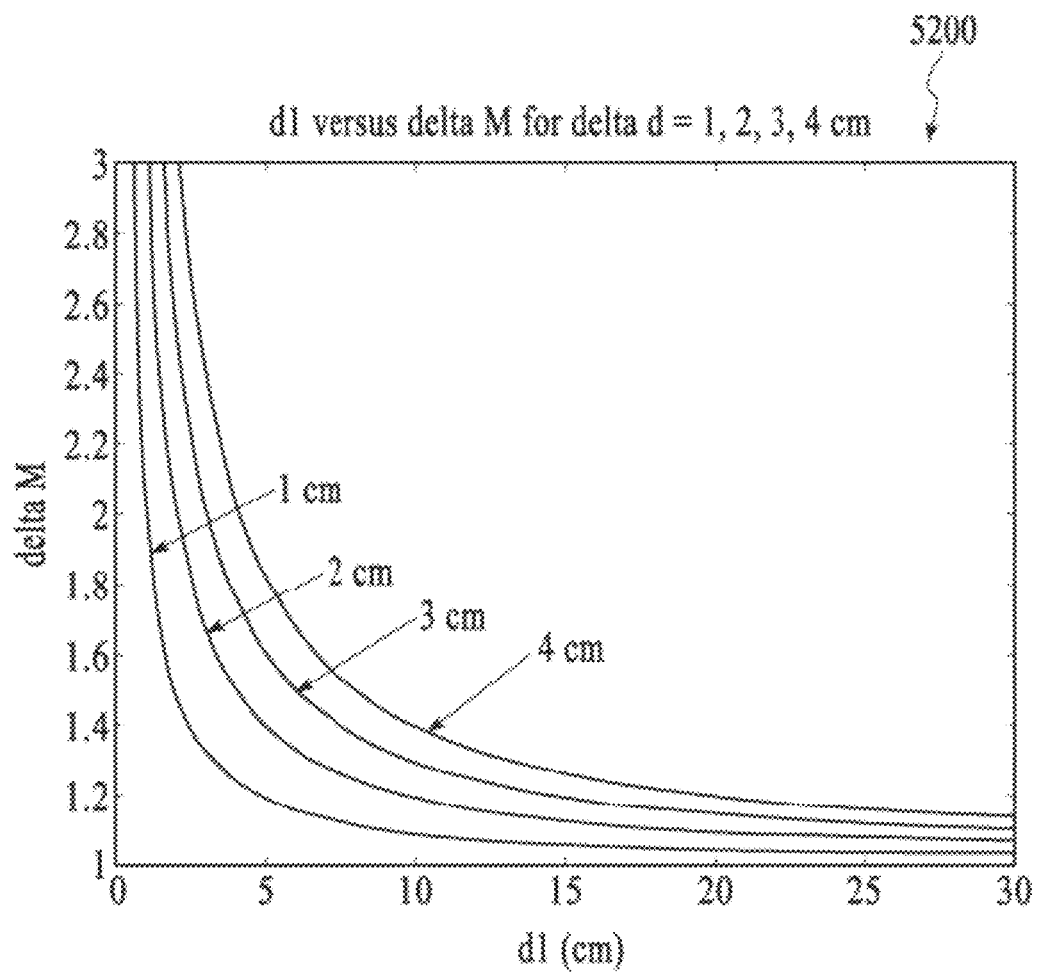
FIG. 52 is a plot of $\Delta M$ versus $d_1$ for several $\Delta d$ exemplary values, according to some embodiments.

FIG. 52 is a plot 5200 of $\Delta M$ versus $d_1$ for several $\Delta d$ exemplary values, according to some embodiments. It is clear that as $\Delta d$ becomes larger and the noise source is closer, $\Delta M$ becomes larger. The variable $\Delta d$ may change depending on the orientation to the speech/noise source, from the maximum value on the array midline to zero perpendicular to the array midline. From the plot 5200 it is clear that for small $\Delta d$ and for distances over approximately 30 centimeters (cm), $\Delta M$ is close to unity. Since most noise sources are farther away than 30 cm and are unlikely to be on the midline on the array, it is probable that when calculating $H_1(z)$ as above in Equation 2, $\Delta M$ (or equivalently the gain of $H_1(z)$) may be close to unity. Conversely, for noise sources that are close (within a few centimeters), there could be a substantial difference in gain depending on which microphone is closer to the noise.

If the "noise" is the user speaking, and Mic 1 is closer to the mouth than Mic 2, the gain increases. Since environmental noise normally originates much farther away from the user's head than speech, noise may be found during the time when the gain of $H_1(z)$ is near unity or some fixed value, and speech can be found after a sharp rise in gain. The speech can be unvoiced or voiced, as long as it is of sufficient volume compared to the surrounding noise. The gain may stay somewhat high during the speech portions, then descend quickly after speech ceases. The rapid increase and decrease in the gain of $H_1(z)$ should be sufficient to allow the detection of speech under almost any circumstances. The gain in this example is calculated by the sum of the absolute value of the filter coefficients. This sum is not equivalent to the gain, but the two are related in that a rise in the sum of the absolute value reflects a rise in the gain.

Figure 53:
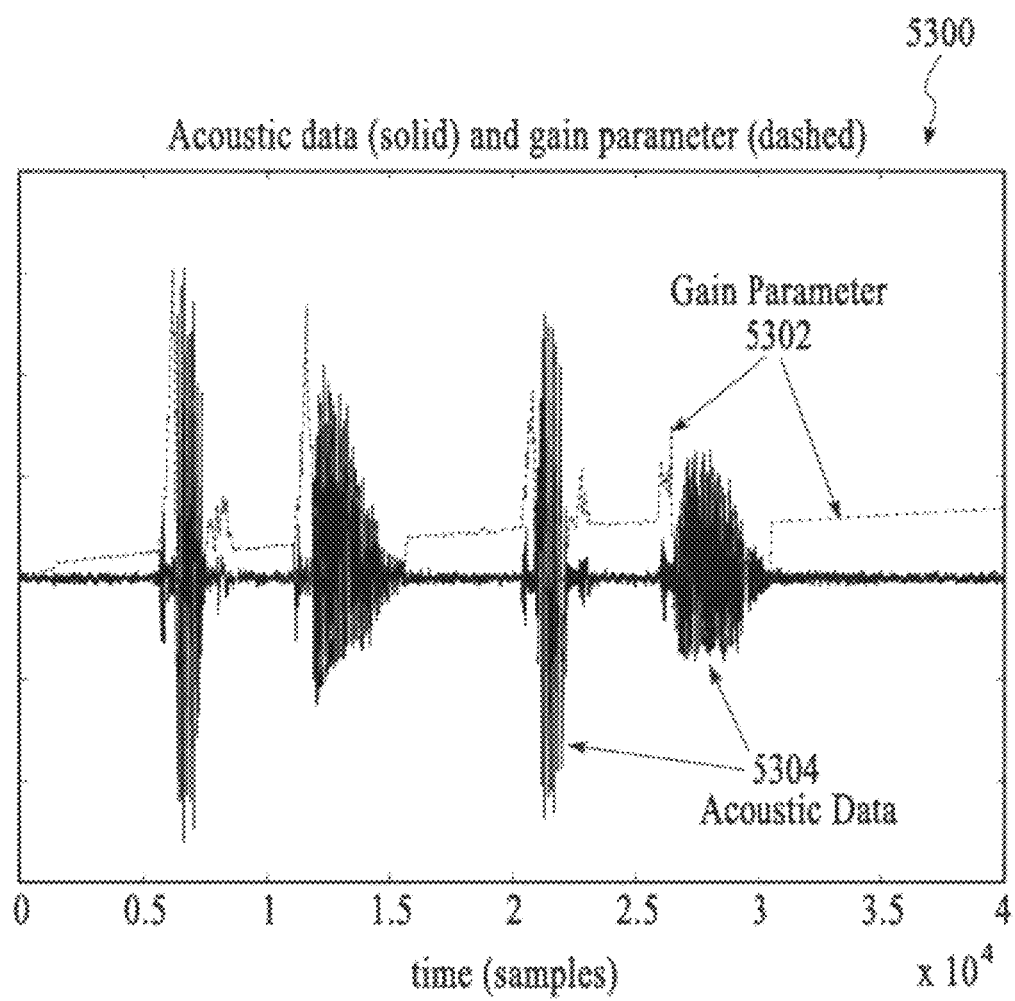
FIG. 53 shows a plot of an exemplary gain parameter as the sum of the absolute values of $H_1(z)$ and the acoustic data or audio from microphone 1, according to some embodiments.

As an example of this behavior, FIG. 53 shows a plot 5300 of an exemplary gain parameter 5302 as the sum of the absolute values of $H_1(z)$ and the acoustic data 5304 or audio from microphone 1, according to some embodiments. The speech signal was an utterance of the phrase "pop pan", repeated twice. The evaluated bandwidth included the frequency range from 2500 Hz to 3500 Hz, although 1500 Hz to 2500 Hz was additionally used in practice. Note the rapid increase in the gain when the unvoiced speech is first encountered, then the rapid return to normal when the speech ends. The large changes in gain that result from transitions between noise and speech can be detected by any standard signal processing techniques. The standard deviation of the last few gain calculations is used, with thresholds being defined by a running average of the standard deviations and the standard deviation noise floor. The later changes in gain for the voiced speech are suppressed in this plot 5300 for clarity.

Figure 54:
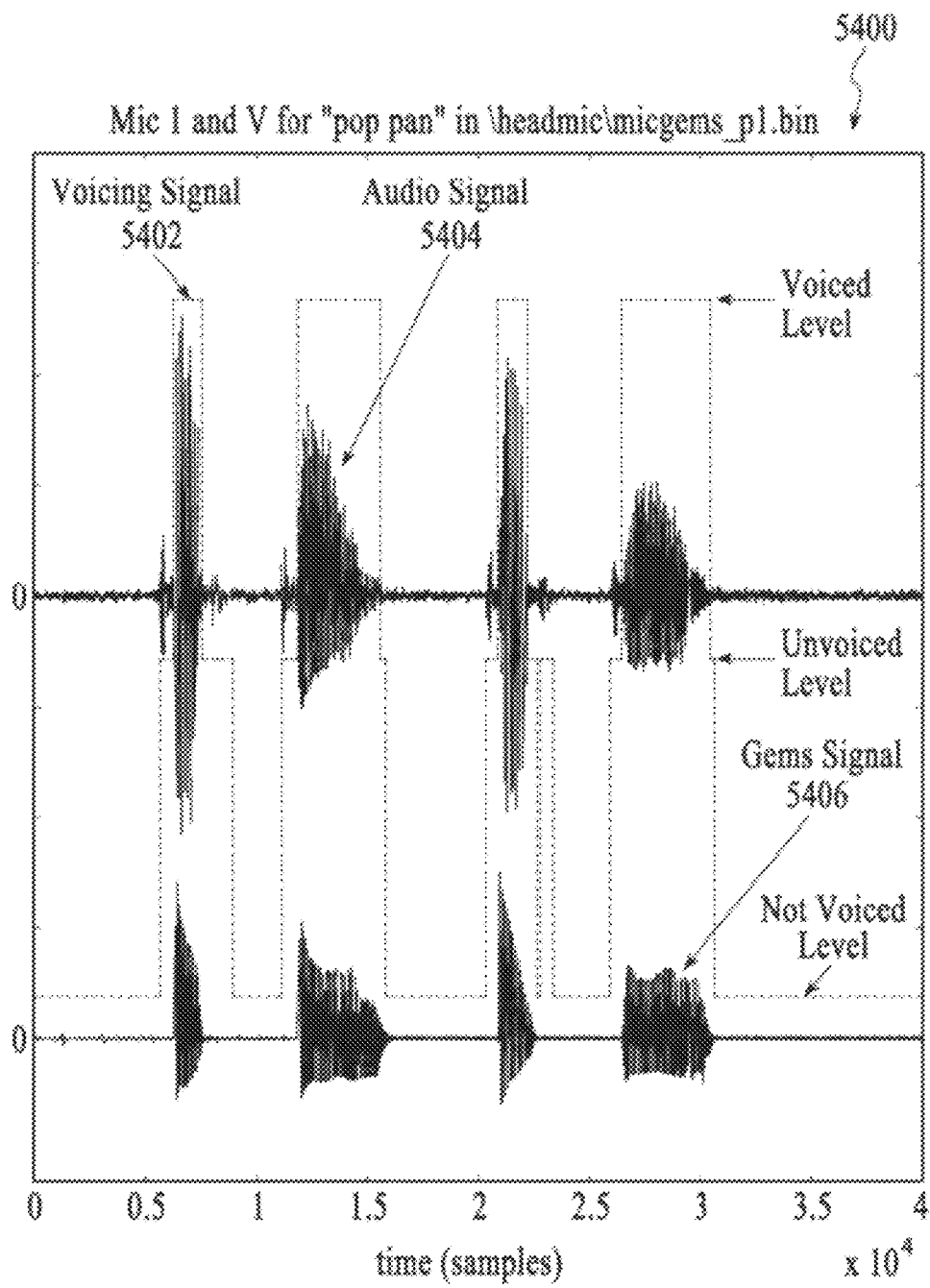
FIG. 54 is an example of an alternative plot of acoustic data presented in FIG. 53, according to some embodiments.

FIG. 54 is an example of an alternative plot 5400 of acoustic data presented in FIG. 53, according to some embodiments. The data used to form plot 5300 is presented again in this plot 5400, along with audio data 5404 and GEMS data 5406 without noise to make the unvoiced speech apparent. The voiced signal 5402 has three possible values: 0 for noise, 1 for unvoiced, and 2 for voiced. Denoising may be accomplished when V=0. It is clear that the unvoiced speech is captured very well, aside from two single dropouts in the unvoiced detection near the end of each "pop". However, these single-window dropouts are not common and do not significantly affect the denoising algorithm. They can easily be removed using standard smoothing techniques.

What is not clear from this plot 5400 is that the PSAD system functions as an automatic backup to the NAVSAD. This is because the voiced speech (since it has the same spatial relationship to the microphones as the unvoiced speech) may be detected as unvoiced if the sensor or NAVSAD system fail for any reason. The voiced speech may be misclassified as unvoiced, but the denoising may still not take place, preserving the quality of the speech signal.

However, this automatic backup of the NAVSAD system functions best in an environment with low noise (approximately 10+ dB SNR), as high amounts (10 dB of SNR or less) of acoustic noise can quickly overwhelm any acoustic-related unvoiced detector, including the PSAD. This is evident in the difference in the voiced signal data 5002 and 5402 shown in plots 5000 and 5400 of FIGS. 50 and 54, respectively, where the same utterance is spoken, but the data of plot 5000 shows no unvoiced speech because the unvoiced speech is undetectable. This is the desired behavior when performing denoising, since if the unvoiced speech is not detectable then it may not significantly affect the denoising process. Using the Pathfinder system to detect unvoiced speech ensures detection of any unvoiced speech loud enough to distort the denoising.

Regarding hardware considerations, and with reference to FIG. 51, the configuration of the microphones can have an effect on the change in gain associated with speech and the thresholds needed to detect speech. In general, each configuration may use testing to determine the proper thresholds, but tests with two very different microphone configurations showed the same thresholds and other parameters to work well. The first microphone set had the signal microphone near the mouth and the noise microphone several centimeters away at the ear, while the second configuration placed the noise and signal microphones back-to-back within a few centimeters of the mouth. The results presented herein were derived using the first microphone configuration, but the results using the other set are virtually identical, so the detection algorithm is relatively robust with respect to microphone placement.

A number of configurations are possible using the NAVSAD and PSAD systems to detect voiced and unvoiced speech. One configuration uses the NAVSAD system (non-acoustic) to detect voiced speech along with the PSAD system to detect unvoiced speech; the PSAD also functions as a backup to the NAVSAD system for detecting voiced speech. An alternative configuration uses the NAVSAD system (non-acoustic correlated with acoustic) to detect voiced speech along with the PSAD system to detect unvoiced speech; the PSAD also functions as a backup to the NAVSAD system for detecting voiced speech. Another alternative configuration uses the PSAD system to detect both voiced and unvoiced speech.

While the systems described above have been described with reference to separating voiced and unvoiced speech from background acoustic noise, there are no reasons more complex classifications cannot be made. For more in-depth characterization of speech, the system can band pass the information from Mic 1 and Mic 2 so that it is possible to see which bands in the Mic 1 data are more heavily composed of noise and which are more weighted with speech. Using this knowledge, it is possible to group the utterances by their spectral characteristics similar to conventional acoustic methods; this method would work better in noisy environments.

As an example, the "k" in "kick" has significant frequency content form 500 Hz to 4000 Hz, but a "sh" in "she" contains significant energy from 1700-4000 Hz. Voiced speech could be classified in a similar manner. For instance, an /i/ ("ee") has significant energy around 300 Hz and 2500 Hz, and an /a/ ("ah") has energy at around 900 Hz and 1200 Hz. This ability to discriminate unvoiced and voiced speech in the presence of noise is, thus, very useful.

An acoustic vibration sensor, also referred to as a speech sensing device, is described below. The acoustic vibration sensor is similar to a microphone in that it captures speech information from the head area of a human talker or talker in noisy environments. Previous solutions to this problem have either been vulnerable to noise, physically too large for certain applications, or cost prohibitive. In contrast, the acoustic vibration sensor described herein accurately detects and captures speech vibrations in the presence of substantial airborne acoustic noise, yet within a smaller and cheaper physical package. The noise-immune speech information provided by the acoustic vibration sensor can subsequently be used in downstream speech processing applications (speech enhancement and noise suppression, speech encoding, speech recognition, talker verification, etc.) to improve the performance of those applications.

Figure 55:
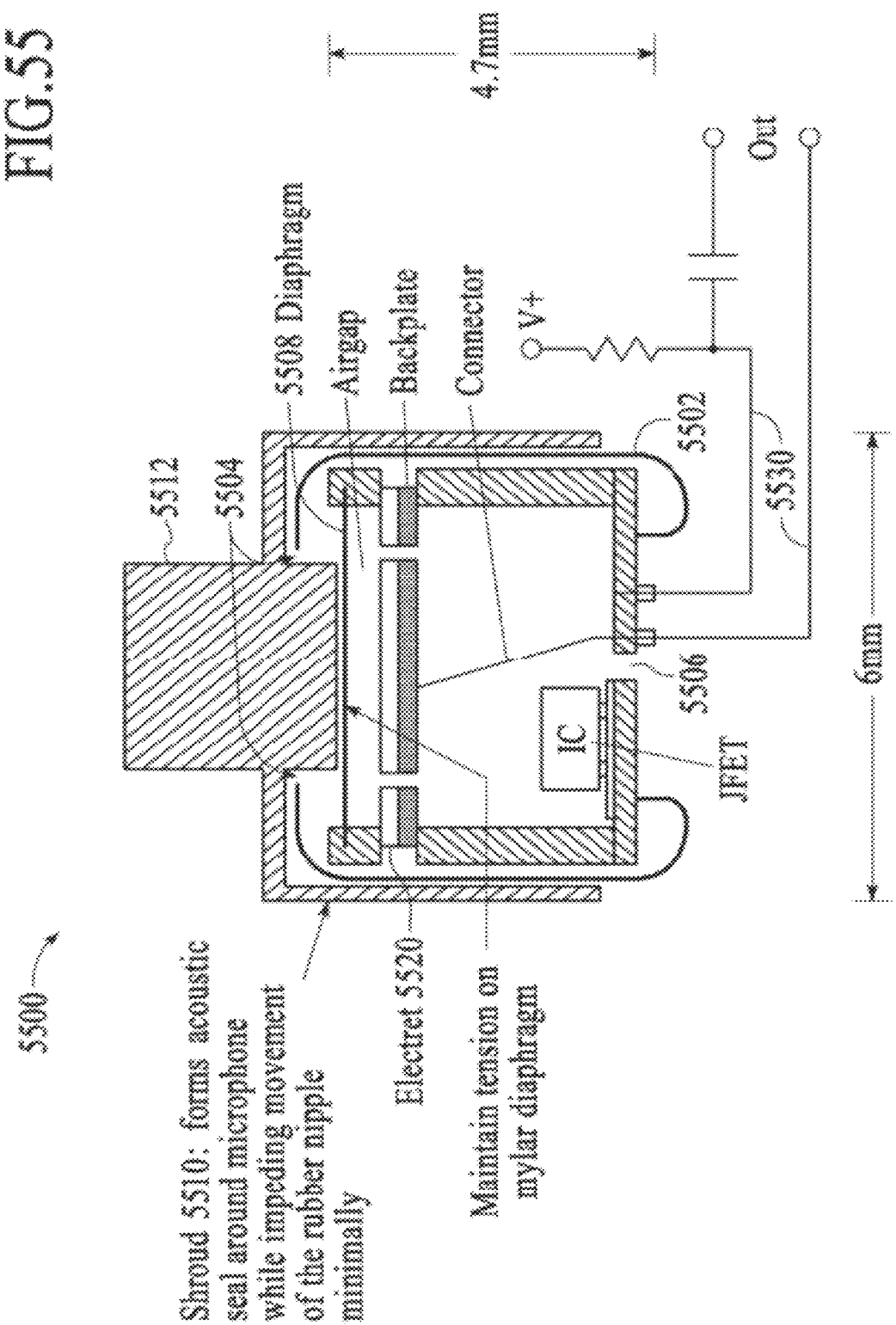
FIG. 55 is a cross section view of an example of an acoustic vibration sensor, according to some embodiments.
Figure 56A:
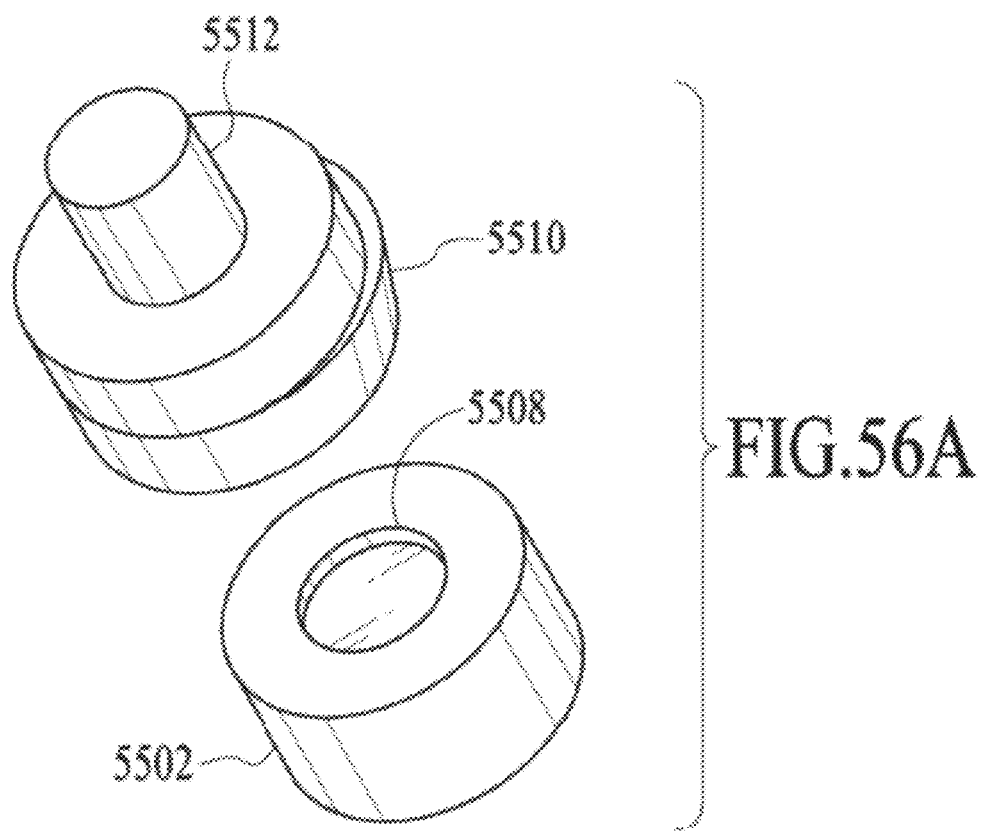
FIG. 56A is an exploded view of an acoustic vibration sensor, according to the example shown in FIG. 55.
Figure 56B:
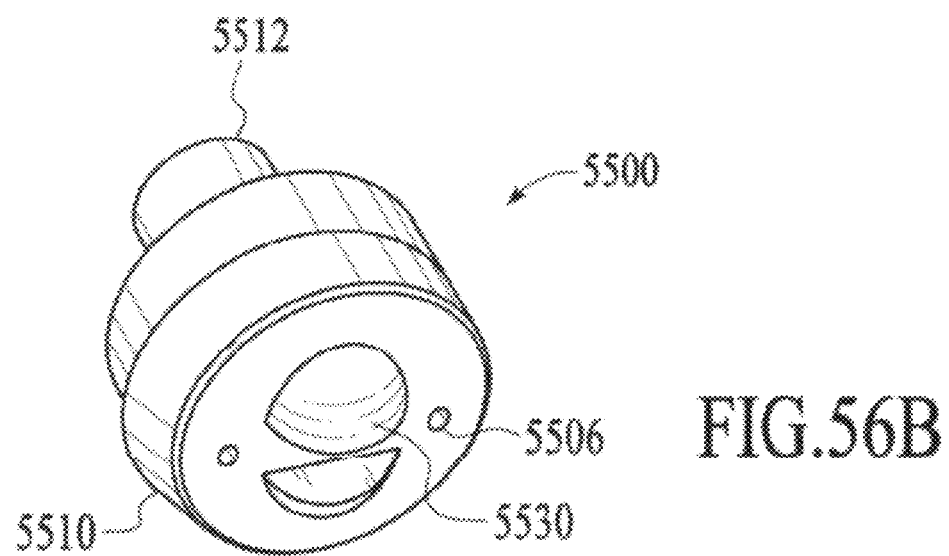
FIG. 56B is perspective view of an acoustic vibration sensor, according to the example shown in FIG. 55.

FIG. 55 is a cross section view of an example of an acoustic vibration sensor 5500, also referred to herein as the sensor 5500, according to some embodiments. FIG. 56A is an exploded view of an acoustic vibration sensor 5500, according to the example shown in FIG. 55. FIG. 56B is perspective view of an acoustic vibration sensor 5500, according to the example shown in FIG. 55. The sensor 5500 includes an enclosure 5502 having a first port 5504 on a first side and at least one second port 5506 on a second side of the enclosure 5502. A diaphragm 5508, also referred to as a sensing diaphragm 5508, is positioned between the first and second ports. A coupler 5510, also referred to as the shroud 5510 or cap 5510, forms an acoustic seal around the enclosure 5502 so that the first port 5504 and the side of the diaphragm facing the first port 5504 are isolated from the airborne acoustic environment of the human talker. The coupler 5510 of an embodiment is contiguous, but is not so limited. The second port 5506 couples a second side of the diaphragm to the external environment.

The sensor also includes electric material 5520 and the associated components and electronics coupled to receive acoustic signals from the talker via the coupler 5510 and the diaphragm 5508 and convert the acoustic signals to electrical signals representative of human speech. Electrical contacts 5530 provide the electrical signals as an output. Alternative embodiments can use any type/combination of materials and/or electronics to convert the acoustic signals to electrical signals representative of human speech and output the electrical signals.

The coupler 5510 of an embodiment is formed using materials having acoustic impedances matched to the impedance of human skin (characteristic acoustic impedance of skin is approximately $1.5 \times 10^6$ Pa×s/m). The coupler 5510 therefore, is formed using a material that includes at least one of silicone gel, dielectric gel, thermoplastic elastomers (TPE), and rubber compounds, but is not so limited. As an example, the coupler 5510 of an embodiment is formed using Kraiburg TPE products. As another example, the coupler 5510 of an embodiment is formed using Sylgard® Silicone products.

The coupler 5510 of an embodiment includes a contact device 5512 that includes, for example, a nipple or protrusion that protrudes from either or both sides of the coupler 5510. In operation, a contact device 5512 that protrudes from both sides of the coupler 5510 includes one side of the contact device 5512 that is in contact with the skin surface of the talker and another side of the contact device 5512 that is in contact with the diaphragm, but the embodiment is not so limited. The coupler 5510 and the contact device 5512 can be formed from the same or different materials.

The coupler 5510 transfers acoustic energy efficiently from skin/flesh of a talker to the diaphragm, and seals the diaphragm from ambient airborne acoustic signals. Consequently, the coupler 5510 with the contact device 5512 efficiently transfers acoustic signals directly from the talker's body (speech vibrations) to the diaphragm while isolating the diaphragm from acoustic signals in the airborne environment of the talker (characteristic acoustic impedance of air is approximately 415 Pa×s/m). The diaphragm is isolated from acoustic signals in the airborne environment of the talker by the coupler 5510 because the coupler 5510 prevents the signals from reaching the diaphragm, thereby reflecting and/or dissipating much of the energy of the acoustic signals in the airborne environment. Consequently, the sensor 5500 responds primarily to acoustic energy transferred from the skin of the talker, not air. When placed against the head of the talker, the sensor 5500 picks up speech-induced acoustic signals on the surface of the skin while airborne acoustic noise signals are largely rejected, thereby increasing the signal-to-noise ratio and providing a very reliable source of speech information.

Performance of the sensor 5500 is enhanced through the use of the seal provided between the diaphragm and the airborne environment of the talker. The seal is provided by the coupler 5510. A modified gradient microphone is used in an embodiment because it has pressure ports on both ends. Thus, when the first port 5504 is sealed by the coupler 5510, the second port 5506 provides a vent for air movement through the sensor 5500.

FIG. 57 is a schematic diagram of a coupler 5510 of an acoustic vibration sensor, according to the example shown in FIG. 55. The dimensions shown are in millimeters and are intended to serve as an example for one embodiment. Alternative embodiments of the coupler can have different configurations and/or dimensions. The dimensions of the coupler 5510 show that the acoustic vibration sensor 5500 is small in that the sensor 5500 of an embodiment is approximately the same size as typical microphone capsules found in mobile communication devices. This small form factor allows for use of the sensor 5510 in highly mobile miniaturized applications, where some example applications include at least one of cellular telephones, satellite telephones, portable telephones, wireline telephones, Internet telephones, wireless transceivers, wireless communication radios, personal digital assistants (PDAs), personal computers (PCs), headset devices, head-worn devices, and earpieces.

The acoustic vibration sensor provides very accurate Voice Activity Detection (VAD) in high noise environments, where high noise environments include airborne acoustic environments in which the noise amplitude is as large if not larger than the speech amplitude as would be measured by conventional omnidirectional microphones. Accurate VAD information provides significant performance and efficiency benefits in a number of speech processing applications including but not limited to: noise suppression algorithms such as the Pathfinder algorithm available from Aliph, Brisbane, Calif. and described in the Related Applications; speech compression algorithms such as the Enhanced Variable Rate Coder (EVRC) deployed in many commercial systems; and speech recognition systems.

In addition to providing signals having an improved signal-to-noise ratio, the acoustic vibration sensor uses minimal power to operate (on the order of 200 micro Amps, for example). In contrast to alternative solutions that require power, filtering, and/or significant amplification, the acoustic vibration sensor uses a standard microphone interface to connect with signal processing devices. The use of the standard microphone interface avoids the additional expense and size of interface circuitry in a host device and supports for use of the sensor in highly mobile applications where power usage is an issue.

Figure 58:
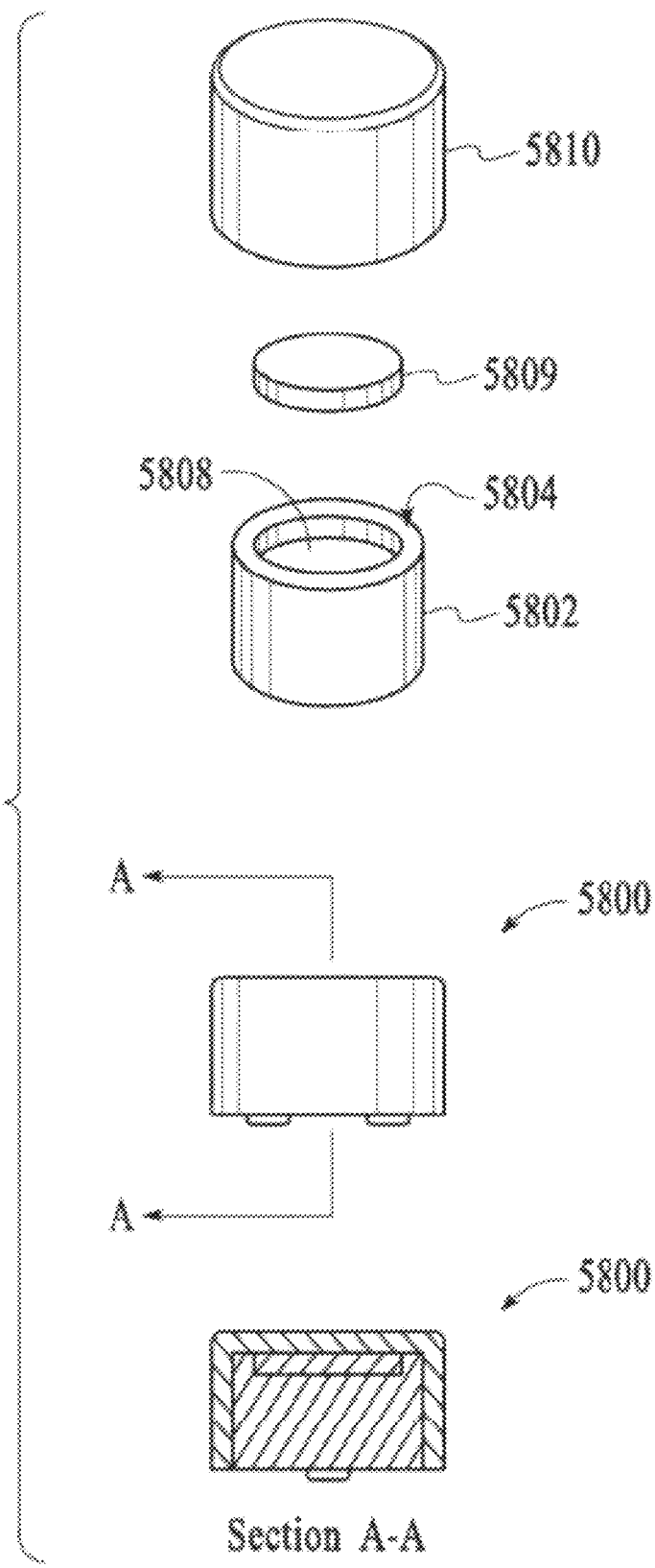
FIG. 58 is an exploded view of an example of an acoustic vibration sensor, under an alternative embodiment.

FIG. 58 is an exploded view of an example of an acoustic vibration sensor 5800, according to at least some embodiments. The sensor 5800 includes an enclosure 5802 having a first port 5804 on a first side and at least one second port (not shown) on a second side of the enclosure 5802. A diaphragm 5808 is positioned between the first and second ports. A layer of silicone gel 5809 or other similar substance is formed in contact with at least a portion of the diaphragm 5808. A coupler 5810 or shroud 5810 is formed around the enclosure 5802 and the silicon gel 5809 where a portion of the coupler 5810 is in contact with the silicon gel 5809. The coupler 5810 and silicon gel 5809 in combination form an acoustic seal around the enclosure 5802 so that the first port 5804 and the side of the diaphragm facing the first port 5804 are isolated from the acoustic environment of the human talker. The second port couples a second side of the diaphragm to the acoustic environment.

As described above, the sensor includes additional electronic materials as appropriate that couple to receive acoustic signals from the talker via the coupler 5810, the silicon gel 5809, and the diaphragm 5808 and convert the acoustic signals to electrical signals representative of human speech. Alternative embodiments can use any type/combination of materials and/or electronics to convert the acoustic signals to electrical signals representative of human speech.

The coupler 5810 and/or gel 5809 of an embodiment are formed using materials having impedances matched to the impedance of human skin. As such, the coupler 5810 is formed using a material that includes at least one of silicone gel, dielectric gel, thermoplastic elastomers (TPE), and rubber compounds, but is not so limited. The coupler 5810 transfers acoustic energy efficiently from skin/flesh of a talker to the diaphragm, and seals the diaphragm from ambient airborne acoustic signals. Consequently, the coupler 5810 efficiently transfers acoustic signals directly from the talker's body (speech vibrations) to the diaphragm while isolating the diaphragm from acoustic signals in the airborne environment of the talker. The diaphragm is isolated from acoustic signals in the airborne environment of the talker by the silicon gel 5809/coupler 5810 because the silicon gel 5809/coupler 5810 prevents the signals from reaching the diaphragm, thereby reflecting and/or dissipating much of the energy of the acoustic signals in the airborne environment. Consequently, the sensor 5800 responds primarily to acoustic energy transferred from the skin of the talker, not air. When placed again the head of the talker, the sensor 5800 picks up speech-induced acoustic signals on the surface of the skin while airborne acoustic noise signals are largely rejected, thereby increasing the signal-to-noise ratio and providing a very reliable source of speech information.

There are many locations outside the ear from which the acoustic vibration sensor can detect skin vibrations associated with the production of speech. The sensor can be mounted in a device, handset, or earpiece in any manner, the restriction being that reliable skin contact is used to detect the skin-borne vibrations associated with the production of speech.

Figure 59:
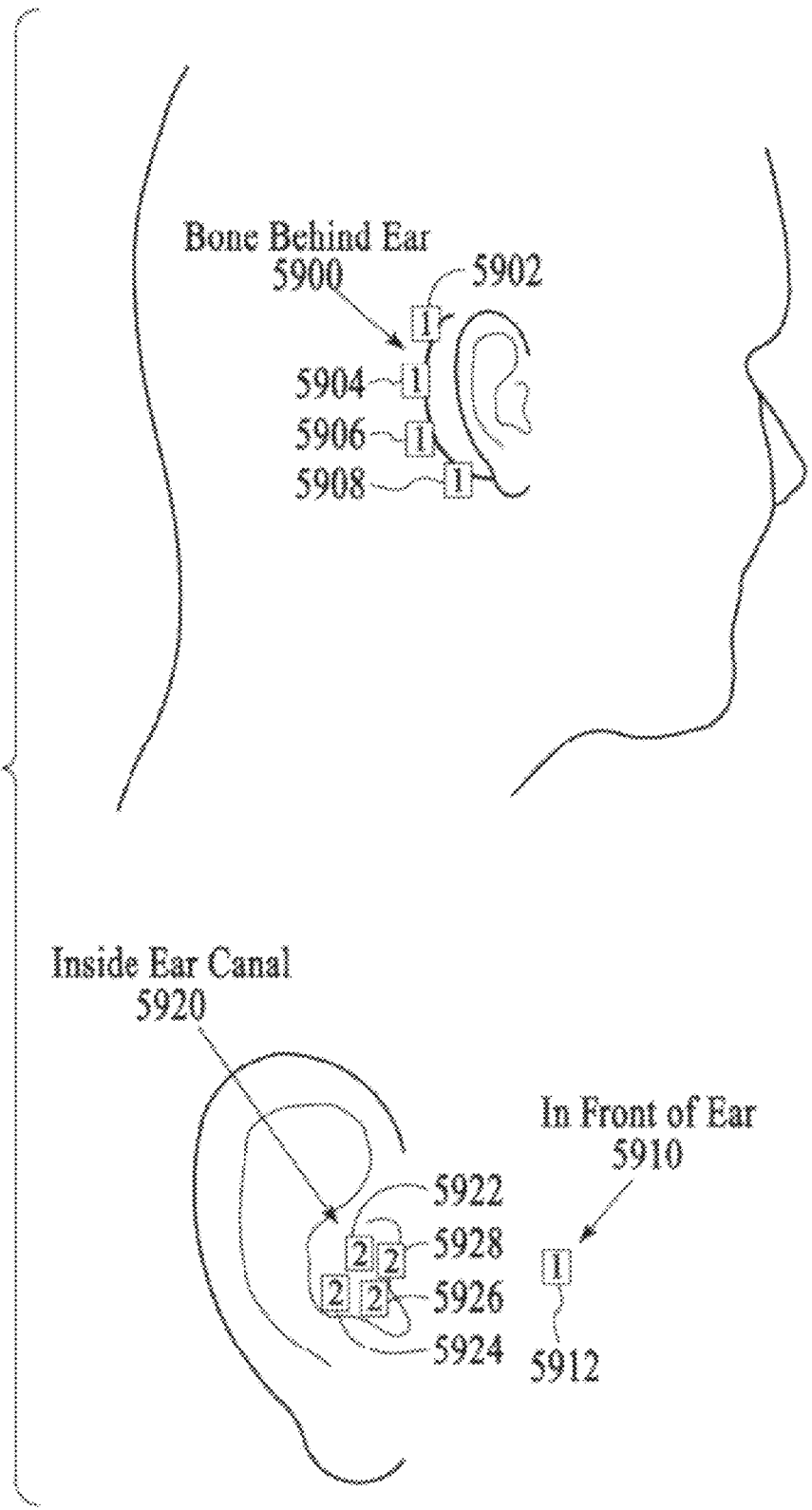
FIG. 59 shows representative areas of sensitivity on the human head appropriate for placement of an example of an acoustic vibration sensor, according to some embodiments.

FIG. 59 shows representative areas of sensitivity 5900-5920 on the human head appropriate for placement of an example of an acoustic vibration sensor 5500/5800, according to some embodiments. The areas of sensitivity 5900-5920 include numerous locations 5902-5908 in an area behind the ear 5900, at least one location 5912 in an area in front of the ear 5910, and in numerous locations 5922-5928 in the ear canal area 5920. The areas of sensitivity 5900-5920 are the same for both sides of the human head. These representative areas of sensitivity 5900-5920 are provided as examples and do not limit the embodiments described herein to use in these areas.

Figure 60:
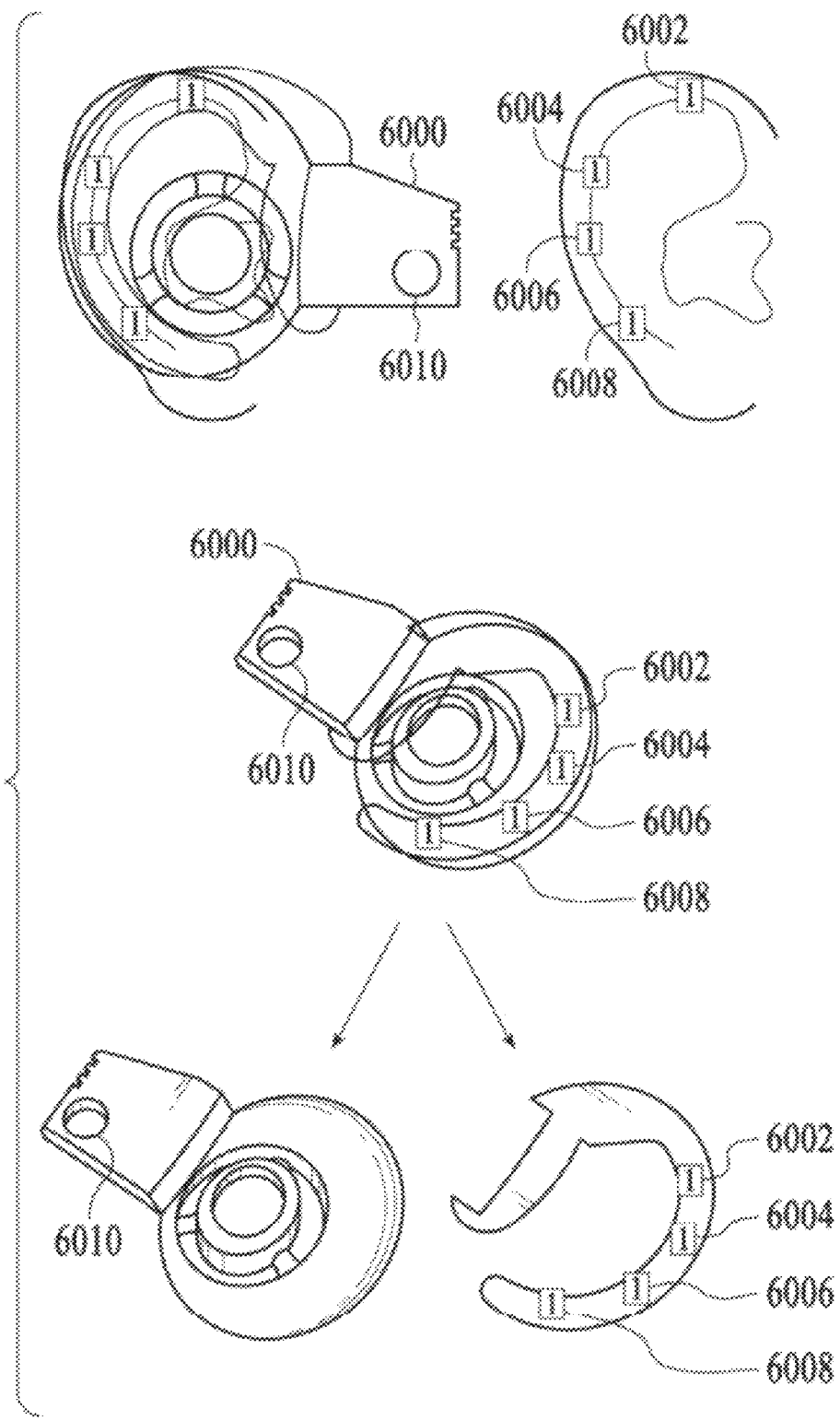
FIG. 60 is a headset device that includes an exemplary acoustic vibration sensor placed at any of a number of locations, according to some embodiments.

FIG. 60 is a headset device 6000 that includes an exemplary acoustic vibration sensor 5500/5800 placed at any of a number of locations 6002-6010, according to some embodiments. Generally, placement of the acoustic vibration sensor 5500/5800 can be on any part of the device 6000 that corresponds to the areas of sensitivity 5900-5920 (FIG. 59) on the human head. While a headset device is shown as an example, any number of communication devices known in the art can carry and/or couple to an acoustic vibration sensor 5500/5800.

Figure 61:
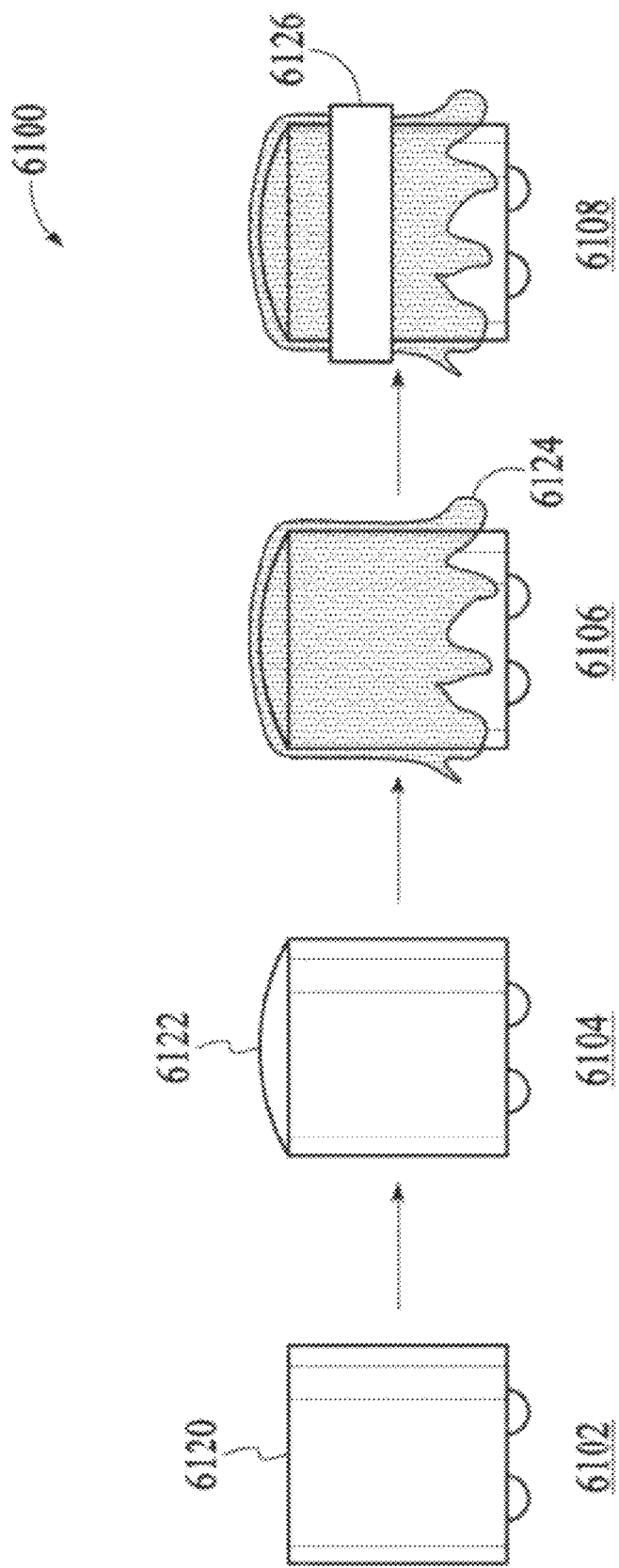
FIG. 61 is a diagram of a manufacturing method for an exemplary acoustic vibration sensor, according to some embodiments.

FIG. 61 is a diagram of a manufacturing method 6100 for an exemplary acoustic vibration sensor, according to some embodiments. Operation begins with, for example, a unidirectional microphone 6120, at block 6102. Silicon gel 6122 is formed over/on the diaphragm (not shown) and the associated port, at block 6104. A material 6124, for example polyurethane film, is formed or placed over the microphone 6120/silicone gel 6122 combination, at block 6106, to form a coupler or shroud. A snug fit collar or other device is placed on the microphone to secure the material of the coupler during curing, at block 6108.

Note that the silicon gel (block 6102) is an optional component that depends on the embodiment of the sensor being manufactured, as described above. Consequently, the manufacture of an acoustic vibration sensor 5500 that includes a contact device 5512 (referring to FIG. 55) may not include the formation of silicon gel 6122 over/on the diaphragm. Further, the coupler formed over the microphone for this sensor 5500 may include the contact device 5512 or formation of the contact device 5512.

The systems and methods described herein include and/or run under and/or in association with a processing system. The processing system includes any collection of processor-based devices or computing devices operating together, or components of processing systems or devices, as is known in the art. For example, the processing system can include one or more of a portable computer, portable communication device operating in a communication network, and/or a network server. The portable computer can be any of a number and/or combination of devices selected from among personal computers, cellular telephones, personal digital assistants, portable computing devices, and portable communication devices, but is not so limited. The processing system can include components within a larger computer system.

The processing system of an embodiment includes at least one processor and at least one memory device or subsystem. The processing system can also include or be coupled to at least one database. The term "processor" as generally used herein refers to any logic processing unit, such as one or more central processing units (CPUs), digital signal processors (DSPs), application-specific integrated circuits (ASIC), etc. The processor and memory can be monolithically integrated onto a single chip, distributed among a number of chips or components of a host system, and/or provided by some combination of algorithms. The methods described herein can be implemented in one or more of software algorithm(s), programs, firmware, hardware, components, circuitry, in any combination.

System components embodying the systems and methods described herein can be located together or in separate locations. Consequently, system components embodying the systems and methods described herein can be components of a single system, multiple systems, and/or geographically separate systems These components can also be subcomponents or subsystem's of a single system, multiple systems, and/or geographically separate systems. These components can be coupled to one or more other components of a host system or a system coupled to the host system.

Communication paths couple the system components and include any medium for communicating or transferring files among the components. The communication paths include wireless connections; wired connections, and hybrid wireless/wired connections. The communication paths also include couplings or connections to networks including local area networks (LANs), metropolitan area networks (MANs), wide area networks (WANs), proprietary networks, interoffice or backend networks, and the Internet. Furthermore, the communication paths include removable fixed mediums like floppy disks, hard disk drives, and CD-ROM disks, as well as flash RAM, Universal Serial Bus (USB) connections, RS-232 connections, telephone lines, buses, and electronic mail messages.

Unless the context clearly indicates otherwise, throughout the description, the words "comprise," "comprising," and the like are to be construed in an inclusive sense as opposed to an exclusive or exhaustive sense; that is to say, in a sense of "including, but not limited to." Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of embodiments is not intended to be exhaustive or to limit the systems and methods described to the precise form disclosed. While specific embodiments and examples are described herein for illustrative purposes, various equivalent modifications are possible within the scope of other systems and methods, as those skilled in the relevant art may recognize. The teachings provided herein can be applied to other processing systems and methods, not for the systems and methods described above.

The elements and acts of the various embodiments described above can be combined to provide further embodiments. These and other changes can be made to the embodiments in light of the above detailed description.

What is claimed:

1. A method, comprising:
   receiving a plurality of signals associated with a plurality of subbands, each of the plurality of signals being associated with one of the plurality of subbands;
   detecting, at an acoustic voice activity detector, a signal from an omnidirectional microphone;
   performing an operation using the plurality of signals to determine a plurality of values, each of the plurality of values being a binary value associated with one of the plurality of signals;
   comparing each of the plurality of values using autocorrelation and cross-correlation to determine whether speech is detected in the signal, and, if speech is detected in the signal and scratch noise is not detected in the signal, generating a first signal;
   receiving, at a vibration voice activity detector, the signal and, a second signal generated by a skin surface microphone, and generating, by a contact detector that receives the first signal and the second signal, a third signal indicating that speech is detected if the second signal exceeds a threshold, the contact detector configured to determine a state of contact with a skin surface; and
   generating a final voice activity detected signal indicating that speech is detected if either the first signal is generated, or the second signal is generated, or both.

2. The method of claim 1, wherein each of the plurality of signals is associated with at least one of the plurality of subbands, the plurality of subbands being configured for a format frequency that corresponds to the speech.

3. The method of claim 1, wherein the omnidirectional microphone comprises a dual omnidirectional microphone array.

4. The method of claim 1, wherein each of the plurality of signals comprises a subbanded signal, the subbanded signal being used to evaluate a frequency range of substantially 0 to 1500 Hz.

5. The method of claim 1, wherein the operation comprises generating a signal-to-noise ratio.

6. The method of claim 1, wherein performing the operation further comprises:
   determining a ratio;
   referencing a threshold; and
   comparing the ratio to the threshold to generate a result, the result being configured to indicate whether the speech is detected on one of the plurality of subbands.

7. The method of claim 1, wherein at least two of the plurality of signals indicates detection of the speech.

8. A method, comprising:
   receiving a plurality of signals, each of the plurality of signals being associated with one of a plurality of subbands;
   detecting, at an acoustic voice activity detector, a signal from a microphone associated with an omnidirectional microphone array;
   performing an operation using the plurality of signals to determine a binary value associated with each of the plurality of subbands;
   performing another operation using the signal from the microphone associated with the omnidirectional microphone array after performing the operation;
   evaluating, using autocorrelation and a cross-correlation, a result associated with the operation to determine if speech is detected, and, if speech is detected in the signal and scratch noise is not detected in the signal, generating a first signal;
   comparing another result of the another operation to generate a ratio, the ratio being compared to a threshold to determine whether the signal is devoiced;
   receiving, at a vibration voice activity detector, the first signal and a second signal generated by a skin surface microphone, and generating, by a contact detector that receives the first signal and the second signal, a third signal indicating that speech is detected if the second signal exceeds a threshold, the contact detector configured to determine a state of contact with a skin surface; and
   generating a final voice activity detected signal indicating that speech is detected if either the first signal is generated, or the second signal is generated, or both.

9. The method of claim 8, further comprising evaluating the binary value associated with each of the plurality of values to determine a final acoustic voice activity detector.

10. The method of claim 8, wherein the microphone is an omnidirectional microphone.

11. The method of claim 8, wherein the omnidirectional microphone array comprises a dual omnidirectional microphone array.

12. The method of claim 8, wherein the microphone comprises a skin surface microphone.

13. A method, comprising:
    detecting, at an acoustic voice activity detector, a signal associated with a subband from a microphone;
    performing an operation on data associated with the signal, the operation generating a value associated with the subband;
    determining whether the value distinguishes the signal from noise by using the value to determine a signal-to-noise ratio and comparing the value to a threshold;
    comparing, using autocorrelation and cross-correlation, the value to a threshold to determine whether speech is detected, and, if speech is detected in the signal and scratch noise is not detected in the signal, generating a first signal;
    receiving, at a vibration voice activity detector, the signal and a second signal generated by a skin surface microphone, and generating, by a contact detector that receives the first signal and the second signal, a third signal indicating that speech is detected if the second signal exceeds a threshold, the contact detector configured to determine a state of contact with a skin surface; and generating a final voice activity detected signal indicating that speech is detected if either the first signal is generated, or the second signal is generated, or both.

14. The method of claim 13, wherein the microphone comprises one or more omnidirectional microphones.

15. The method of claim 13, further comprising determining a final acoustic voice activity detection value by comparing a plurality of values generated from a plurality of signals detected by the microphone.

16. The method of claim 15, wherein speech is detected if two or more of the plurality of values are equal to or exceed a threshold configured to distinguish the signal from the noise.

17. The method of claim 13, wherein speech is detected in the subband if the value is equal to or greater than a threshold configured to identify the signal.

18. The method of claim 13, wherein the subband is configured to correspond to a format frequency used to distinguish the signal from noise.

19. The method of claim 13, wherein the microphone comprises a dual omnidirectional microphone array.

20. The method of claim 13, wherein the microphone comprises an omnidirectional microphone array.

* * * * *